(12) United States Patent
Muir et al.

(10) Patent No.: US 11,741,913 B2
(45) Date of Patent: Aug. 29, 2023

(54) METHODS AND CIRCUITS FOR DIODE-BASED DISPLAY BACKPLANES AND ELECTRONIC DISPLAYS

(71) Applicant: Amorphyx, Incorporated, Corvallis, OR (US)

(72) Inventors: Sean William Muir, Corvallis, OR (US); Christopher Harold Koch, Corvallis, OR (US)

(73) Assignee: Amorphyx, Incorporated, Corvallis, OR (US)

( * ) Notice: Subject to any disclaimer, the term of this patent is extended or adjusted under 35 U.S.C. 154(b) by 0 days.

(21) Appl. No.: 17/311,303

(22) PCT Filed: Dec. 6, 2019

(86) PCT No.: PCT/US2019/065089
§ 371 (c)(1),
(2) Date: Jun. 4, 2021

(87) PCT Pub. No.: WO2020/118268
PCT Pub. Date: Jun. 11, 2020

(65) Prior Publication Data
US 2022/0028345 A1 Jan. 27, 2022

Related U.S. Application Data

(60) Provisional application No. 62/776,931, filed on Dec. 7, 2018.

(51) Int. Cl.
*G09G 3/34* (2006.01)
*G09G 3/36* (2006.01)

(52) U.S. Cl.
CPC ............. *G09G 3/344* (2013.01); *G09G 3/367* (2013.01); *G09G 3/3648* (2013.01);
(Continued)

(58) Field of Classification Search
CPC ................. G09G 3/367; G09G 3/3648; G09G 2300/0417; G09G 2300/0895; G09G 2310/0262
See application file for complete search history.

(56) References Cited

U.S. PATENT DOCUMENTS 3,654,606 A * 4/1972 Marlowe .................. H04N 3/14
348/E3.015
5,151,691 A * 9/1992 Kuijk ...................... G09G 3/367
345/91
(Continued)

FOREIGN PATENT DOCUMENTS

KR 20180025988 A 3/2018
WO WO 2014074360 A1 5/2014
(Continued)

OTHER PUBLICATIONS

Mizukami et al., "36.1: 6-Bit Digital VGA OLED," *SID Symposium Digest of Technical Papers*, 31(1):912-915, Jul. 5, 2012.
(Continued)

*Primary Examiner* — Kevin M Nguyen
(74) *Attorney, Agent, or Firm* — SEED INTELLECTUAL PROPERTY LAW GROUP LLP

(57) ABSTRACT

An electronic display includes a plurality of pixels, each pixel including a data line, first and second selection lines and a common electrode. A control circuit element includes first and second diode-like elements coupled between the first and second selection lines and a charging node. A charging capacitive element is coupled between the charging node and the date line. An active pixel element is coupled between the charging node and the common electrode. The common electrode can overly the entire electronic display and is a suitable transparent conductive material. Each of the first and second diode-like elements includes an amorphous metal non-linear resistor. The active pixel element may (Continued)

include one of liquid crystal display circuitry, light emitting diode circuitry, and electrophoretic circuitry.

17 Claims, 42 Drawing Sheets

(52) U.S. Cl.
CPC .............. *G09G 2300/0417* (2013.01); *G09G 2300/0895* (2013.01); *G09G 2310/0262* (2013.01)

(56) References Cited

U.S. PATENT DOCUMENTS

| | | | |
|---|---|---|---|
| 5,926,236 A | 7/1999 | den Boer et al. | |
| 6,225,968 B1 | 5/2001 | den Boer et al. | |
| 6,243,062 B1 | 6/2001 | den Boer et al. | |
| 9,099,230 B2 | 8/2015 | Cowell, III | |
| 2010/0123744 A1 | 5/2010 | Iba et al. | |
| 2011/0063229 A1* | 3/2011 | Krah ..................... G06F 3/0445 |
| | | | 345/173 |
| 2014/0293166 A1 | 10/2014 | Shih et al. | |
| 2018/0306744 A1 | 10/2018 | Malecha et al. | |

FOREIGN PATENT DOCUMENTS

| | | |
|---|---|---|
| WO | WO 2017019420 A1 | 2/2017 |
| WO | WO 2017066332 A1 | 4/2017 |
| WO | WO 2017194720 A1 | 11/2017 |

OTHER PUBLICATIONS

"Electronic paper," Wikipedia, archive date Jan. 31, 2023, URL= https://en.wikipedia.org/w/index.php?title=Electronic_paper&oldid= 871367267, download date Aug. 11, 2022, (11 pages.).

* cited by examiner

METHODS AND CIRCUITS FOR DIODE-BASED DISPLAY BACKPLANES AND ELECTRONIC DISPLAYS

BACKGROUND

Technical Field

The present disclosure relates generally to electronic displays, and more specifically to electronic displays that include diode-based control elements for controlling active pixel elements of the electronic display.

Description of the Related Art

Various types of electronic displays, such as liquid crystal displays (LCDs), organic liquid crystal displays (OLED), macro light emitting diode (LED) displays, micro light emitting diode (MLED) displays and electrophoretic displays (EPD) usually use a control circuit element which is part of each pixel in the display. The control circuit element in each pixel is coupled to a pixel element of the pixel. The pixel element is the portion of the pixel that functions to provide the desired visual display for viewing. The control circuit element provides the electrical signal to control the pixel element and usually utilizes Thin Film Transistors (TFT) of various sizes depending on the type of display. Backplanes of such electronic displays include the control circuit elements of the pixels. The appropriate components of the active pixel element are then formed or mounted on the backplane to create the desired type of electronic display. For example, where the electronic display is an LCD, the backplane includes the appropriate control circuit element for each pixel upon which the LCD pixel element is formed. In another example, where the electronic display is an EPD, the backplane includes the appropriate control circuit element, usually different from the control circuit element of the LCD, upon which the EPD pixel element if formed.

Similarly, various types of electronic sensors arrays such as X-Ray sensor arrays, infra-red thermal sensor arrays, and radio frequency (RF) detector arrays, usually use a control circuit element which is part of each sensor, or pixel, in the display. The control circuit element in each pixel is coupled to a sensor element, or pixel element, of the pixel. The pixel element is the portion of the pixel that functions absorb energy and converts it to a current or voltage. The control circuit element utilizes the current or voltage to generate an electronic signal and usually utilizes TFT of various sizes depending on the type of sensor array. Backplanes of such sensor arrays include the control circuit elements of the pixels. The appropriate components of the sensor elements are then formed or mounted on the backplane to create the desired type of sensor array.

Different entities may manufacture different components of the electronic display, which may present difficulties in overall manufacturer of the display. For example, a first entity may manufacture a backplane including the control circuit elements for the pixels of the display and then purchase from another entity electrophoretic components or LCD components for the active pixel elements of the pixels of the display. As a result, the first entity may be limited by the structure of the active pixel elements both in relation to construction of the electronic display as well as electrical characteristics of the electronic display. There is accordingly a need for improved structures and fabrication processes for electronic displays.

BRIEF SUMMARY

In one embodiment of the present disclosure, an electronic display includes a plurality of pixels, each pixel including a data line, first and second selection lines and a common electrode. A control circuit element includes first and second diode-like elements coupled between the first and second selection lines and a charging node. A charging capacitive element is coupled between the charging node and the data line. An active pixel element is coupled between the charging node and the common electrode. The common electrode can overly the entire electronic display and is a suitable transparent conductive material. Each of the first and second diode-like elements includes an amorphous metal non-linear resistor. The active pixel element may include one of liquid crystal display circuitry, light emitting diode circuitry, and electrophoretic circuitry.

BRIEF DESCRIPTION OF THE SEVERAL VIEWS OF THE DRAWINGS

The foregoing and other features and advantages will become apparent from the following detailed description of embodiments, given by way of illustration and not limitation with reference to the accompanying drawings, in which:

FIGS. 16A and 16B-1-16B-5 are circuits and timing diagrams that includes operation of pixels according to the present disclosure.

FIG. 17A-17C-8 are circuits and timing diagrams that includes operation of pixels according to the present disclosure.

FIG. 18A-18C-8 are circuits and timing diagrams that includes operation of pixels according to the present disclosure.

DETAILED DESCRIPTION

It will be appreciated that, although specific embodiments of the present disclosure are described for purposes of illustration, various modifications may be made without departing from the spirit and scope of the present disclosure.

In this description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

The present disclosure is directed to various implementations of a pixel that includes resistors, and other features that incorporate amorphous metal thin films. Amorphous metal thin films, used in conjunction with a tunneling insulating layer perform the switching function of a thin-film electronics based control circuit without the complexity of standard, semiconductor based thin-films transistors. Such amorphous metal non-linear resistors (AMNR) can be formed on any number of support substrates. These amorphous metal non-linear resistors can be formed on flexible substrate as they can bend and change shapes without damage to the circuitry. These flexible substrates may be polymers, glass or other materials.

Figure 1A:
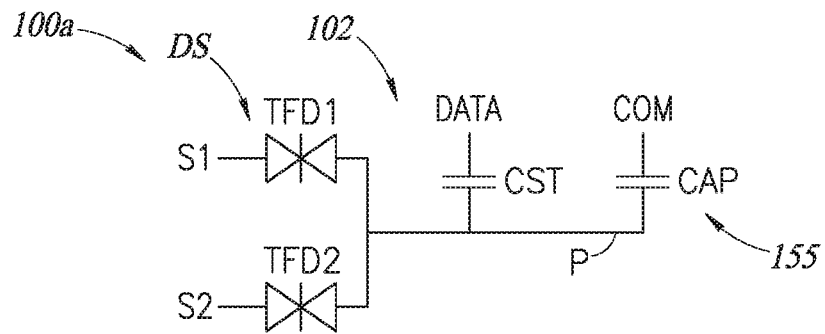
FIGS. 1A-1C illustrate pixels for several different types of electronic displays according to embodiments of the present disclosure.
Figure 1B:
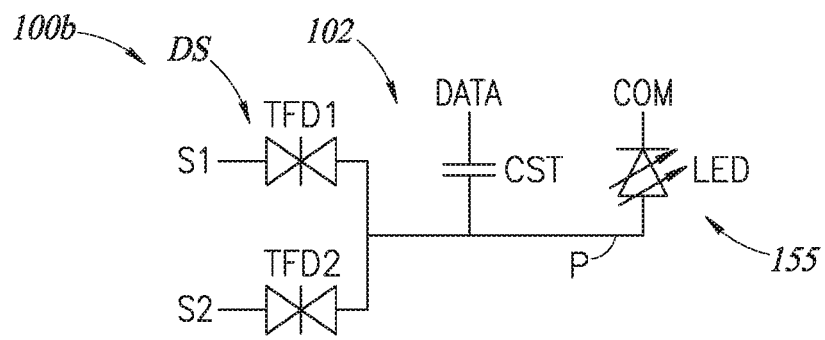
Figure 1C:
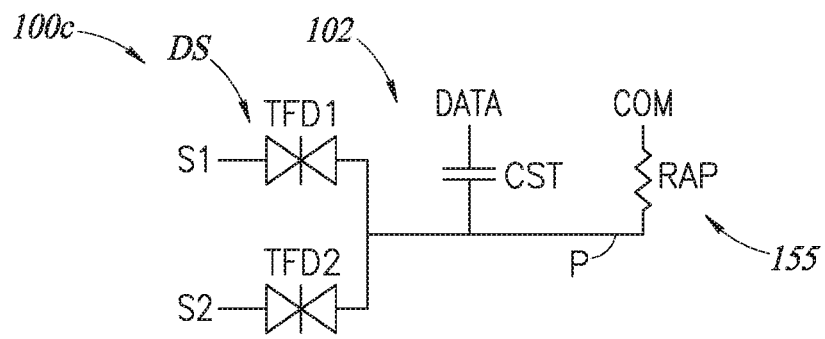

FIGS. 1A-1C illustrate three different dual-select circuit arrangement for pixels 100A-100C using a control circuit element 102, for three types of displays. FIG. 1A represents a pixel for an electrophoretic display. FIG. 1A illustrates pixel 100A including control circuit element 102 and capacitive pixel element CAP, such as an electrophoretic (EP) pixel element. The pixel 100A includes a data line DATA, a first selection line S1, a second selection line S2, a common electrode COM, the control circuit 102, and the capacitive pixel element CAP. A capacitance of the pixel element CAP has a value that dominates the electrical characteristics of the pixel element CAP. Other types of capacitive optical or capacitive non-optical pixels may be represented by CAP.

The control circuit element 102 includes a first thin film diode TFD1, a second thin film diode TFD2, and a charge storage capacitor CST. The first and second thin film diodes TFD1 and TFD2 may have uni-directional or bi-directional polarity switching capability and may include amorphous metal non-linear resistors (AMNR) and multi-active area amorphous metal non-linear resistors (AMNR-X). The first thin film diode TFD1 is coupled between the first selection line S1 and a charging node P, independent node or floating node. The second thin film diode TFD2 is coupled between the second selection line S2 and the charging node P. The charge storage capacitor CST is coupled between the DATA line and the charging node P. The pixel element, in this case the capacitive pixel element CAP is coupled between the charging node P and the common electrode COM, or global common electrode. The combination of the first and second selection lines S1 and S2 and the first and second thin film diodes TFD1 and TFD2 form the dual-select (DS) circuit for controlling pixels.

FIG. 1B illustrates pixel 100B including control circuit element 102 and a light emitting diode pixel element LED, such as a micro LED or an organic LED (OLED) for an LED type display. Other types of LEDs may be used. FIG. 1B includes the first and second select lines S1 and S2, like in FIG. 1A. The first and second select lines are coupled to first and second thin file diodes, TFD1 and TFD2. The LED is coupled between a shared node of TFD1 and TFD2 and a common electrode input or voltage. This circuit also includes a storage capacitor, CST coupled between the shared node and a data line or data voltage. The light emitting diode pixel element LED is coupled between the charging node P and the common electrode COM.

The arrangement of FIG. 1B can be utilized in a sensor array, such as a diode sensor array to be exposed to electromagnetic radiation or other types of energetic radiation. The exposure to the radiation creates free carriers that can be detected and used for imaging.

FIG. 1C illustrates a pixel 100C including a control circuit element 102 and a resistive pixel element RAP, such as phase change materials, like chalcogenides. Other types of resistive pixel elements may be used. The circuit of FIG. 1C includes similar elements as those in FIG. 1A, sharing the same labels and are coupled in the same manner as FIG. 1A. The resistive pixel element RAP is coupled between the charging node P and the common electrode COM.

Embodiments of pixel control circuit element 102 may vary depending on the type of pixel element used. For example, electrophoretic EP pixel elements may require thin film diodes to have higher threshold voltages than LED pixel elements. LED pixel elements may require more current handling capability than EP pixel elements.

Advantages of embodiments of pixels 100A-100C using control circuit element 102 and the pixel elements CAP, LED and RAP, include consistency in the coupling of the pixel elements CAP, LED and RAP between the charging node P and the common electrode COM. This allows the physical layout of the backplane to be substantially similar across the variety of display pixel element technologies. In addition, fabrication of the backplane for pixels 100A-100C utilizes a simpler process than conventional backplanes utilizing thin film transistors.

Figure 2:
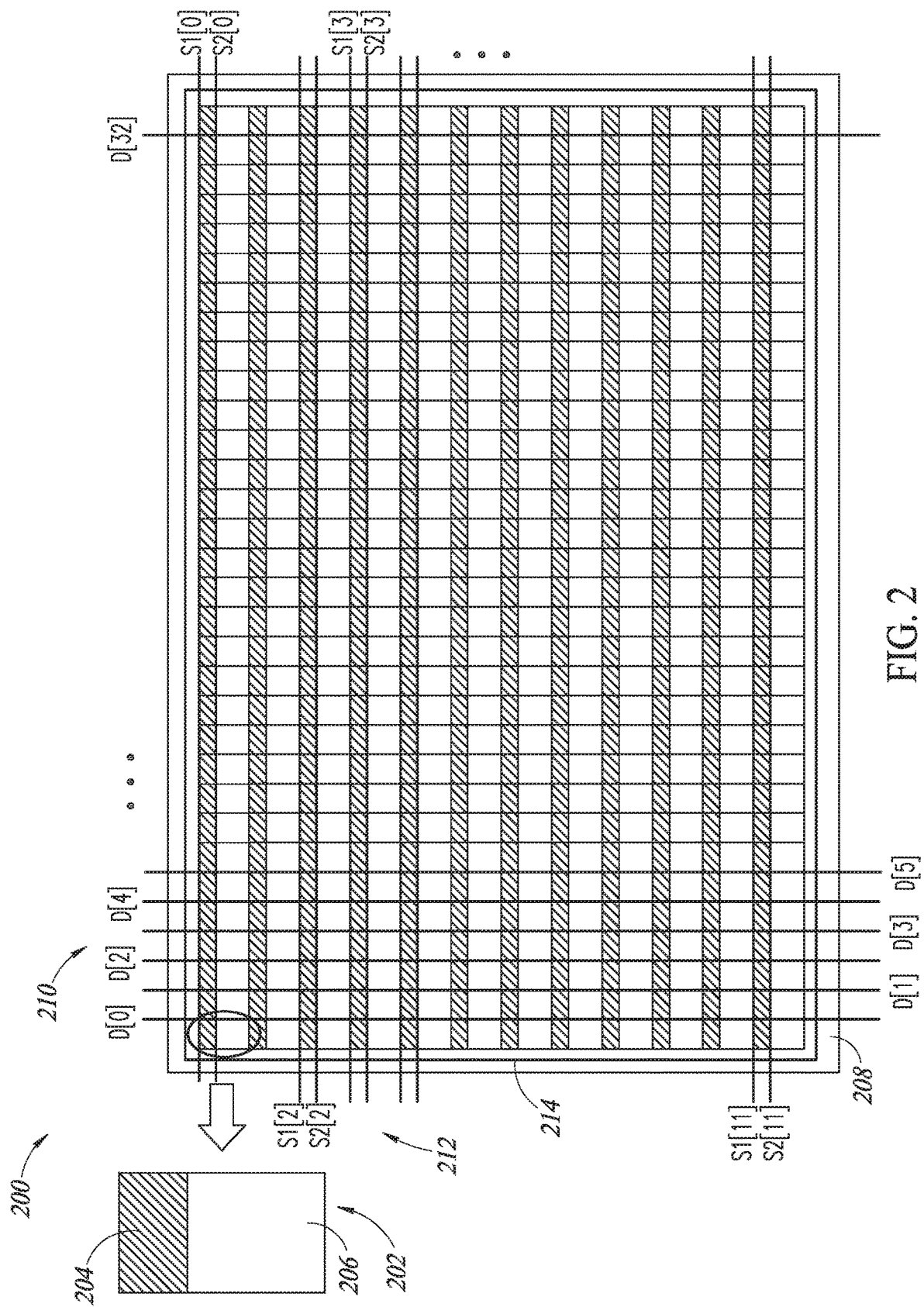
FIG. 2 illustrates an electronic display including an array of pixels arranged in rows and columns and illustrates for one of these pixels a control circuit area and an active element area of the pixel.

In an embodiment, FIG. 2 illustrates an arrangement of pixels into a pixel array 200, as part of a visual display or a sensor array. A pixel 202 has a pixel control circuit area 204 and a pixel active element area 206. The pixel control circuit area may include the control circuit 102 of FIG. 1A-1C. The pixel active element area 206 may include the capacitive pixel element CAP, LED, or resistive pixel element RAP of FIG. 1A-1C or another type of pixel active element. The pixel active element area 206 may overlap the pixel control circuit area 204 with pixel elements formed or mounted on the pixel control circuit area 204. Alternatively, the pixel control circuit area 204 and the pixel active element area 206 may be non-overlapping with the pixel active element area 206 formed or mounted adjacent to the pixel control area 204.

The pixel array 200 may also have a backplane substrate 208 upon which the pixel array 200 is built. The substrate 208 may be any number of suitable substrates to support these pixel circuits. These substrates may be glass, plastic, or other transparent or non-transparent materials. Multiple pixel control areas 204 are formed or mounted on the backplane substrate. In the embodiment of the pixel array 200 in FIG. 2, the array is a 12 row×32 column array of pixels. A plurality of data lines 210 labeled D[0] through D[32] run vertically across the pixel array. There is one data line per column of 12 pixels 202. The data lines 210 can be used to write/read to each pixel 202. Pairs of select lines 212 run horizontally across rows of multiple pixels 202. The intersection of the data lines and the select lines is in the pixel control area 204.

Each pair of the 12 pairs of select lines has a first select line S1 and a second select line S2. Each pair of select lines is labeled S1[0], S2[0] through S1[11], S2[11]. Select lines may be used to select a row of pixels for writing/reading using data lines 210. The use of first and second select lines S1 and S2 in the embodiment of pixel control circuit 102 of FIG. 1A-1C may be termed dual-select diode control. A common electrode 214, or COM, is a global common node coupled to each pixel 202. Usually operation of the pixel array 200 includes sequentially selecting single rows of pixels 202 and writing/reading data to the pixels 202 in the selected row. The sequence of row selection may be other than sequential. Organization and operation of pixel array 200 may be performed in one array or multiple groups of arrays. The routing of common electrode 214 may be to all pixels or groups of pixels.

Figure 4:
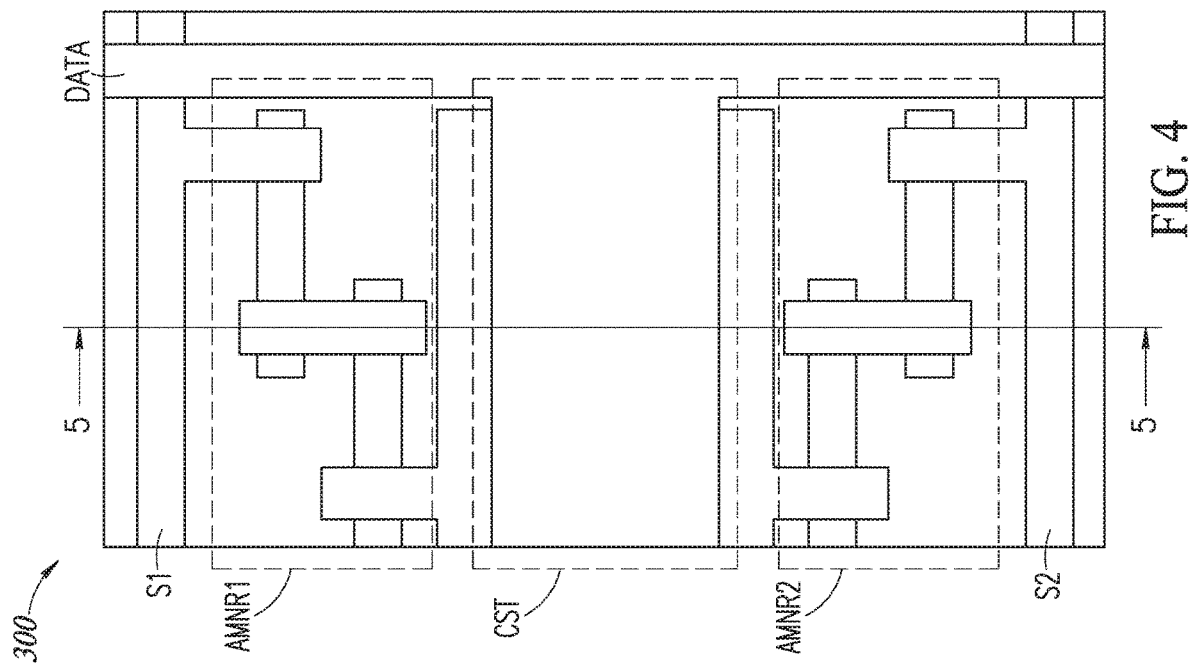
FIGS. 3 and 4 are a physical layout of one of the pixels of the electronic display of FIG. 2 according to one embodiment of the present disclosure.
Figure 3:
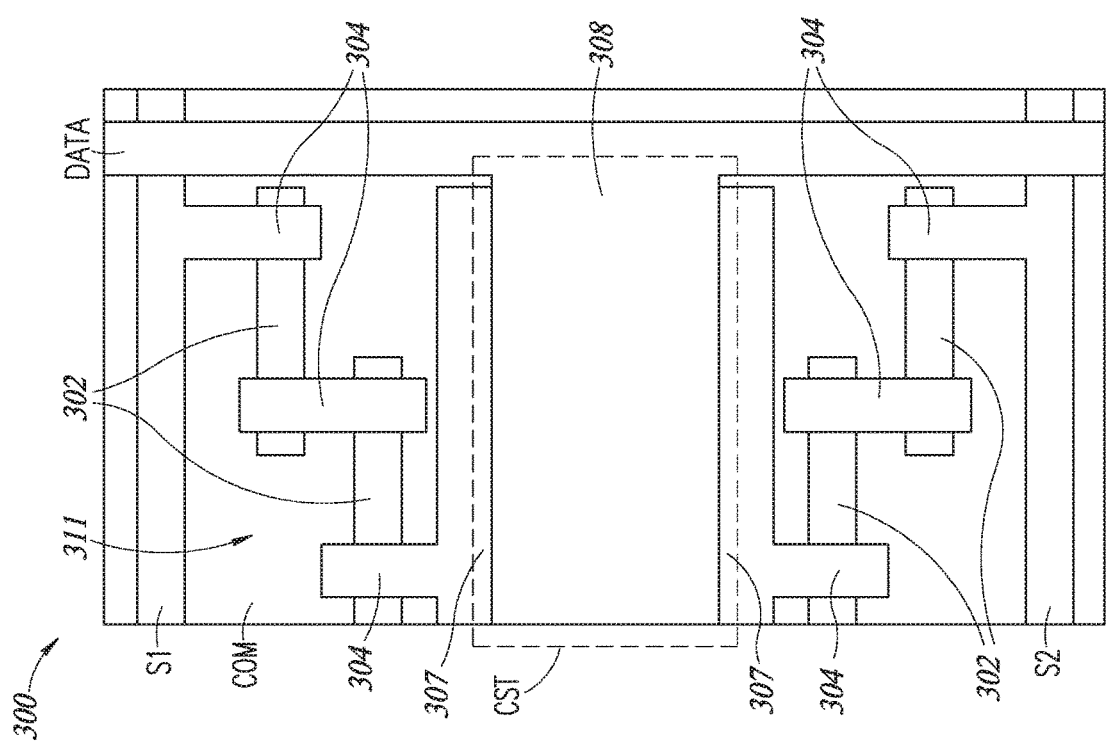
Figure 5:
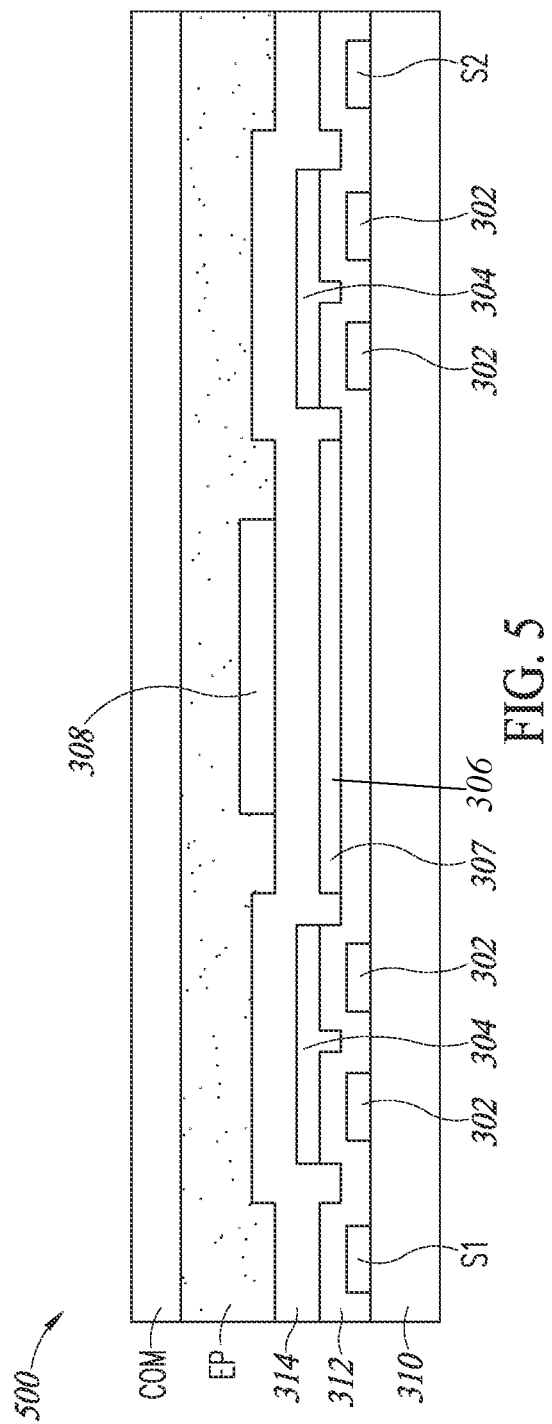
FIG. 5 is a cross-sectional view of the pixel of FIG. 4 where the active pixel element includes an electrophoretic material.
Figure 16A:
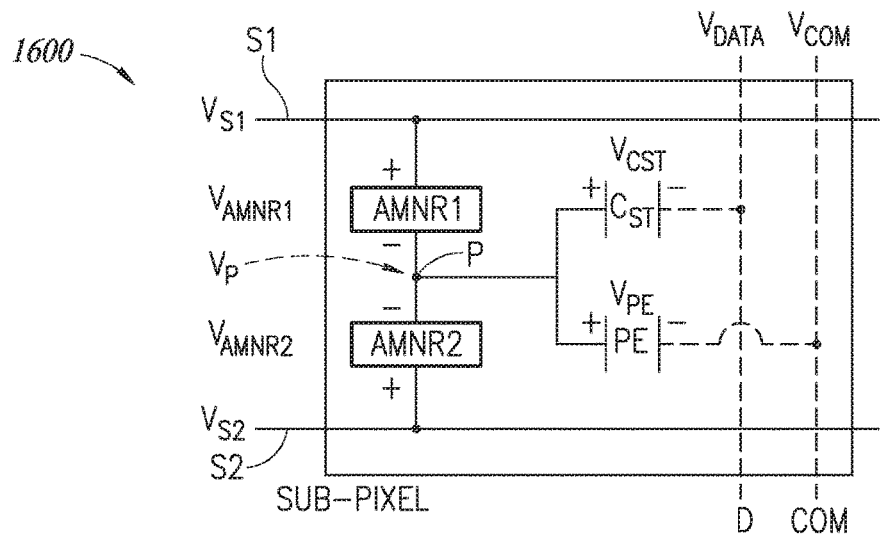
Figures 1, 16B:
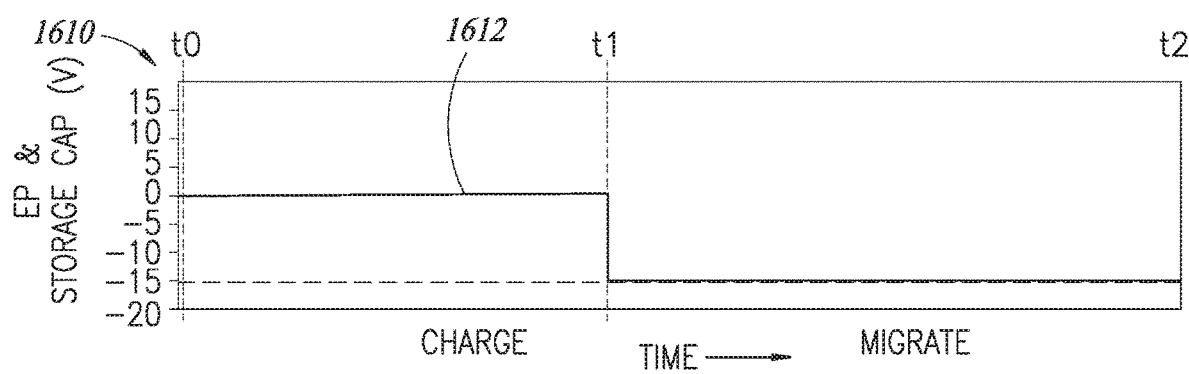
Figures 2, 16B:
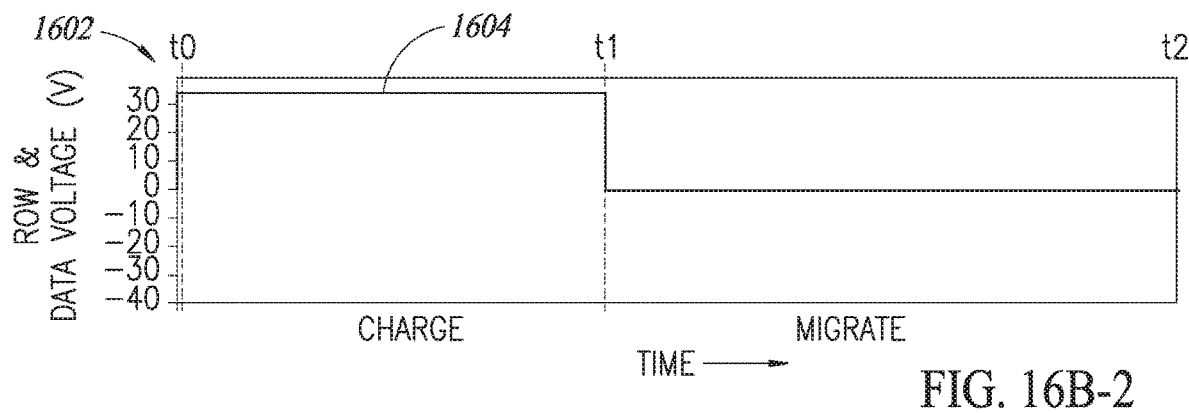
Figures 3, 16B:
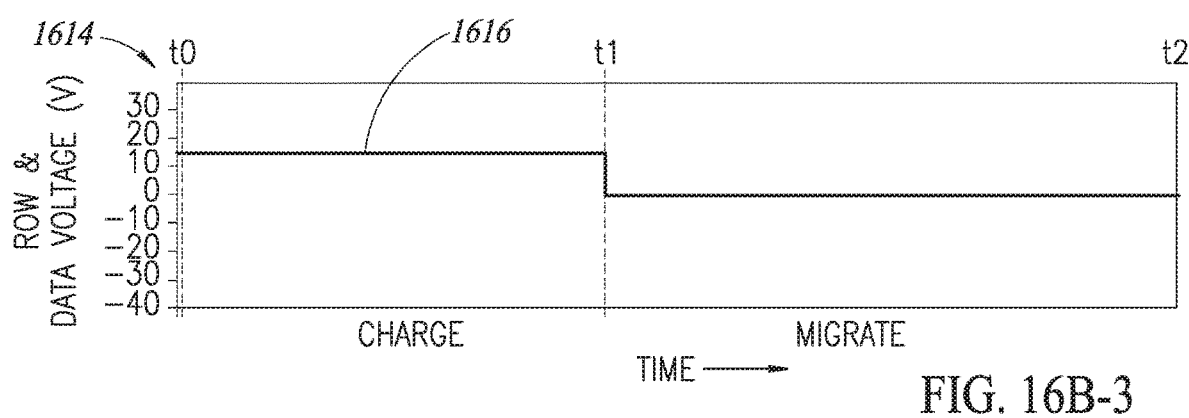
Figures 4, 16B:
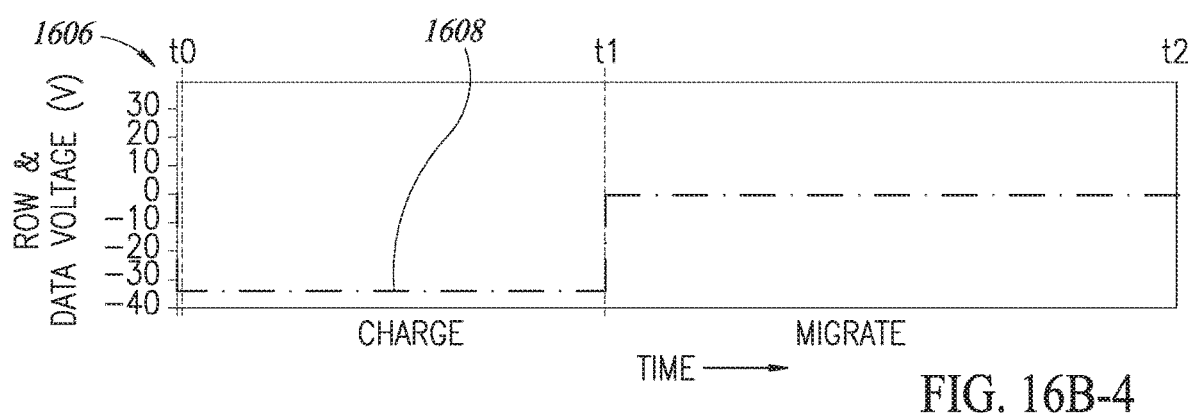
Figures 5, 16B:
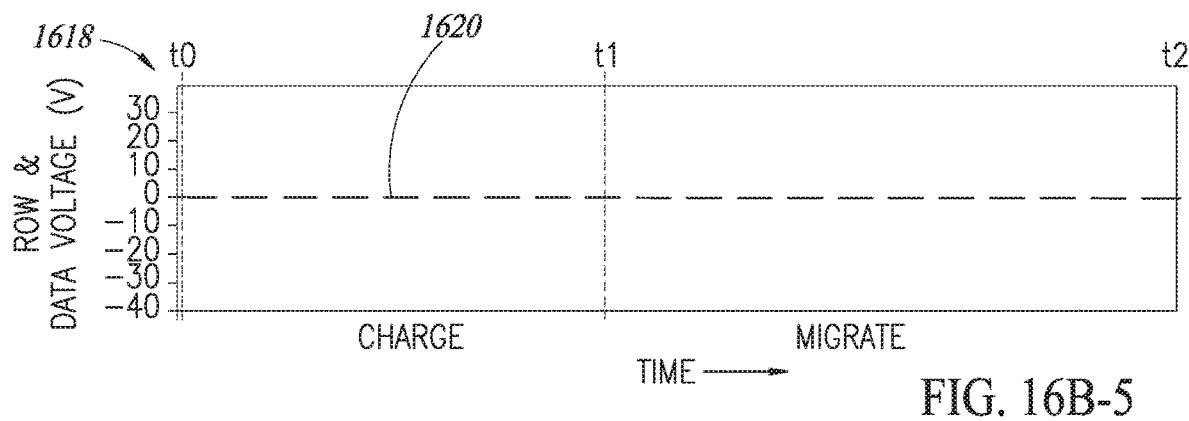

FIGS. 3 and 4 are a top view of an embodiment of pixel a control circuit 300, similar to the pixel control circuit 102 of FIG. 1 using only 4 lithography steps. FIG. 5 is a cross-sectional view along line 5-5 through FIG. 4. The pixel control circuit 300 is built on a non-conductive surface substrate 310, see FIG. 5. A plurality of amorphous metal interconnects 302 are formed by depositing a first amorphous metal and patterning (first lithography step). Amorphous metals are rigid solid materials whose atomic structure lacks long-range periodicity that characterizes crystalline materials. In an amorphous metal, formation of crystalline planes is suppressed, for example, by incorporating two or more components. An example of an amorphous metal having four components—zirconium, copper, aluminum, and nickel—is $Zr_{55}Cu_{30}Al_{10}Ni_5$. Amorphous metals can be identified by their resistivity measurements, which have shown that an amorphous metal material, while still conductive, has about ten times greater resistivity than its crystalline counterpart. Amorphous metals also have smoother surfaces than crystalline metals, as indicated by root mean square (RMS) surface roughness measurements.

Amorphous multi-component metallic films (AMMFs), in the range of about 10-200 nm, can be used to improve performance of electronic components such as resistors, diodes, and thin film transistors. These AMMFs can be formed using standard deposition processes. The exemplary amorphous metal noted above, $Zr_{55}Cu_{30}Al_{10}Ni_5$, is an AMMF that can be formed on a substrate by conventional sputter deposition using four different metal targets. As a result, electric fields at an interface of an AMMF and an oxide film are more uniform.

Such uniformity has produced superior current-voltage (I-V) characteristic curves for metal-insulator-metal (MIM) diodes and transistors that exhibit Fowler-Nordheim tunneling. The tunneling MIM diodes incorporate an AMMF as a lower electrode and a crystalline metal film as an upper electrode. The two electrodes are separated by a single dielectric barrier that provides a tunneling pathway for charge carriers to move between the electrodes. The single dielectric barrier results in a current response that depends on the polarity of an applied voltage. At a specific voltage the charge carriers in the device are only tunneling in one direction, i.e., one-way tunneling. That is, tunneling occurs either from the lower electrode to the upper electrode, or from the upper electrode to the lower electrode, according to the polarity of the applied voltage.

Amorphous metal thin film non-linear resistors (AMNRs), having superior performance to existing thin film non-linear resistors have been developed. The current response of these AMNRs is independent of the polarity of the applied voltage, which is not true for other thin film resistors. This polarity independence is due to the presence of two dielectric barriers, where the charge carriers at each barrier are forced to tunnel in substantially opposite directions. AMNRs exhibit two-way tunneling because, in response to an applied voltage, the charge carriers in the device tunnel in both directions across the barriers. That is, tunneling occurs from the upper electrode to the lower electrode and from the lower electrode to the upper electrode, regardless of the polarity of the applied voltage. Such polarity-symmetric AMNRs may provide improved signal control in liquid crystal display (LCD) or organic light emitting diode (OLED) display technologies and electromagnetic sensor arrays.

A tunneling insulator 312 is deposited on the amorphous metal interconnects. In one embodiment, the tunneling insulator is a conformal layer that is much thinner than the amorphous metal interconnects. The deposition techniques can include an etching or polishing step to create a planar surface (not shown) on the tunneling insulator. After the tunneling insulator, a second metal layer 306 deposition and patterning (second lithography step) is performed to form an electrode 307 and a data line DATA. The electrode is one side of a charge storage capacitor CST, see dashed line. The second metal layer may be amorphous or any other suitable metal.

Interconnects 304 are formed from the second metal layer along with the electrode 307. The interconnects 304 overlap with the amorphous metal interconnects 302 and are separated by the tunneling insulator. Select lines S1 and S2 are formed on the substrate with the amorphous metal layer, however, these may be formed on a different layer of the stack.

The storage capacitor CST dielectric (314 is deposited on the lower electrode 307 and is followed by a third metal deposition and patterning (third lithography step) to form the data line DATA and a storage capacitor upper electrode 308. Several AMNR diodes 311 are formed by the overlapping interconnects 302 and 304.

The storage capacitor is formed at the intersection of the storage capacitor lower electrode and upper electrode 307 and 308. A common electrode COM is formed above the EP or OLED material that is deposited on top of the storage capacitor upper electrode 308 and data line DATA. While material deposition followed by photolithographic patterning is the usual method for forming electronic structures other means may be used such as shadow masking during deposition, using a damascene process or inkjet printing. First and second amorphous metal non-linear resistor AMNR1 and AMNR2 (See FIG. 4) are outlined and correspond to TFD1 an TFD2 of FIGS. 1A-1C.

FIG. 5 illustrates an electrophoretic (EP) pixel control area cross-section 500. The cross-section 500 includes pixel control circuit 300. The non-conductive surface substrate 310 is shown as well as the tunneling insulator 312, storage capacitor CST insulator 314 and the common electrode COM. The EP material layer EP is located between and electrically coupled between the storage capacitor upper electrode 308 and the common electrode COM.

Figure 6:
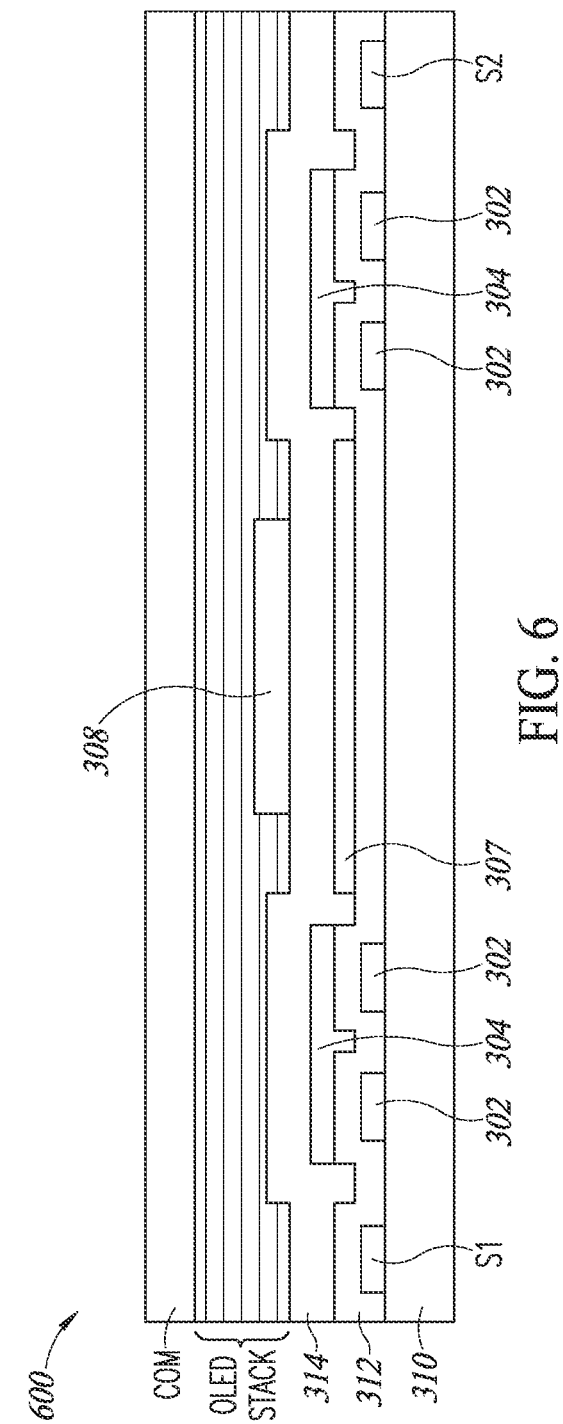
FIG. 6 is a cross-sectional view of the pixel of FIG. 4 where the active pixel element is part of an LED.

FIG. 6 illustrates an OLED pixel control area cross-section 600 including the features described in FIGS. 3 and 4. The cross-section 600 includes pixel control circuit 300. The OLED material stack 316 is located between and electrically coupled between the capacitor upper plate 308 and the common electrode COM. The OLED material stack may be formed as conformal layers as dictated by the end product.

Figure 7:
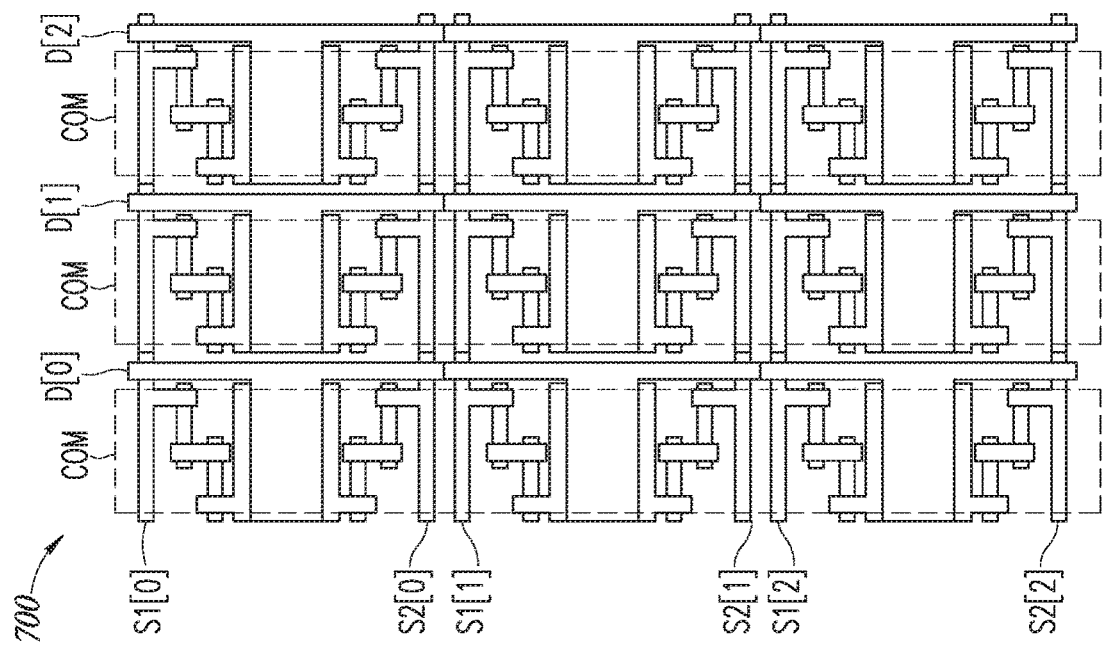

In some embodiments the common electrode COM is coupled to the pixels in a single global common electrode. In other embodiments it may be beneficial to form the common electrode COM into columns or rows. FIG. 7 illustrates a 3 row×3 column pixel array 700 having the common electrode COM running along columns. Each pixel of the array 700 is one of the pixels from FIG. 3 or 4. Each pixel's S1 and S2 select lines are coupled to their adjacent pixels. Each pixel's data line is coupled to an adjacent pixel. The common electrode COM overlaps the capacitor CST of each pixel. In some embodiments, the common electrode COM is completely between the data lines of adjacent columns.

Figure 8:
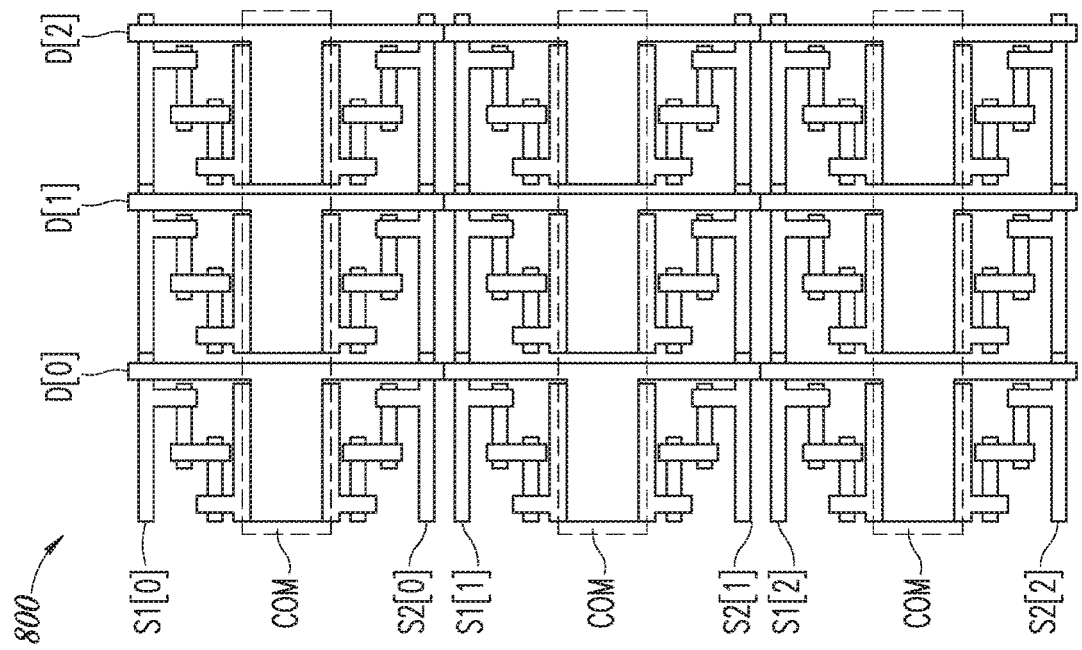
FIGS. 7 and 8 are a portion of an electronic display where the common electrode layer overlying the display has been patterned to form a plurality of common electrode elements according to another embodiment of the present disclosure.

FIG. 8 illustrates an alternative embodiment of a 3 row×3 column pixel array 800 having the common electrode COM running along rows. The pixels of FIG. 8 are the pixels from FIGS. 3 and 4. The row oriented common electrodes COM are overlapping with the capacitors CST. In some embodiments, the common electrodes are between the AMNR diodes of each pixel in a row.

Figure 9:
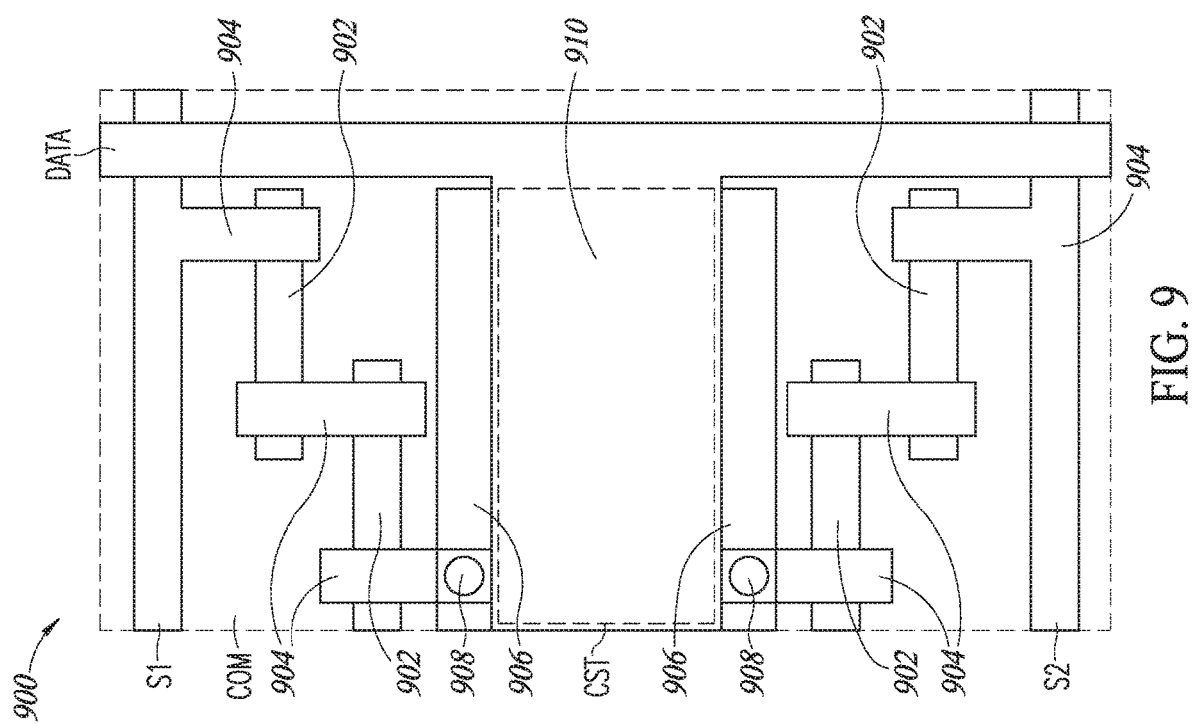
FIG. 9 is a pixel of the electronic display of FIG. 2 where the pixel includes an intermetal dielectric layer according to a further embodiment of the present disclosure.

In another embodiment, FIG. 9 is a top view of a pixel 900 in which an additional inter-metal dielectric layer isolates the select lines S1 and S2 from the data line DATA. A series of process steps for forming pixel 900 includes first, depositing an amorphous metal layer and patterning the amorphous metal layer to form a plurality of amorphous interconnects 902 on a substrate. Next a tunneling insulator is deposited on the amorphous interconnects, which are lower electrodes of an AMNR device. A second metal layer is deposited and patterned to form AMNR upper electrodes 904 and select lines S1, S2. The second metal layer may be amorphous metal or any other suitable metal. These AMNR upper electrodes are perpendicular or otherwise transvers to the AMNR lower electrodes. An end of each electrode overlaps an associated electrode to form an active region where electrons can flow during operation.

An inter-metal dielectric is then deposited and patterned on the second metal layer. A third metal layer is then deposited and patterned to form storage capacitor CST lower electrode 906 and a via 908. The via 908 couples the second metal interconnect 904 and storage capacitor CST lower electrode 906. Next, a storage capacitor dielectric (not shown) is deposited followed by a fourth metal deposition and patterning to form the storage capacitor CST upper electrode 910 and data line DATA. The inter-metal dielectric and the capacitor dielectric increases the distance between select lines S1 and S2 and data line DATA, reducing capacitive coupling between data line DATA and the select lines S1 and S2. Electropheretic material (or other display material) may then be formed on the data line and the upper electrode 906. Then a common electrode COM is formed on top of this stack of layers.

Figure 10:
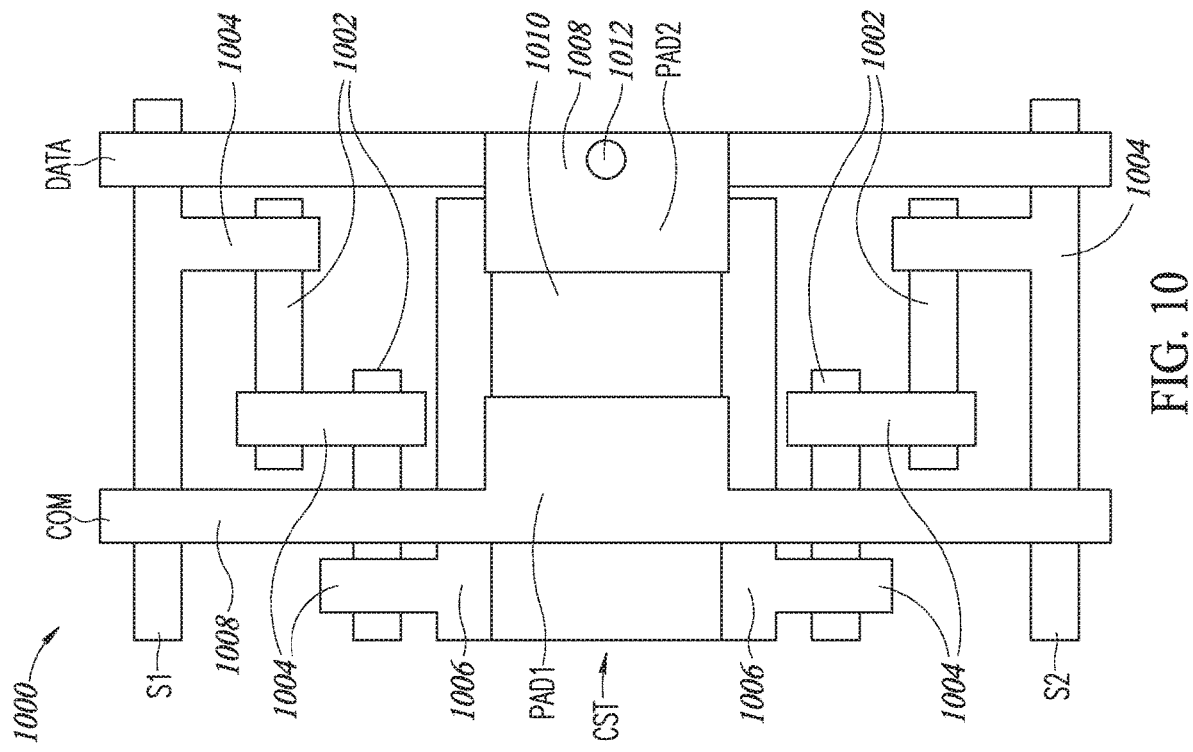
FIG. 10 is a pixel of the electronic display of FIG. 2 where the pixel includes the common electrode layer formed on top of an intermetal dielectric layer according to a still further embodiment of the present disclosure.

In another embodiment FIG. 10 is a top view of pixel 1000 in which a common electrode COM is formed on top of an inter-metal dielectric (not shown) placed over the storage capacitor CST. A series of process steps to form pixel 1000 include first depositing and patterning an amorphous metal interconnect 1002 (first metal layer) on an insulated or non-conductive substrate (not shown). Next a tunneling insulator (not shown) is deposited on the amorphous metal interconnect. Next a deposition of a second metal layer and patterning of the second metal layer forms upper electrodes 1004, select lines S1 and S2, and a storage capacitor CST lower electrode 1006. A storage capacitor dielectric (not shown) is then deposited on the second metal layer and is followed by deposition of a third metal layer and patterning to form a storage capacitor CST upper electrode 1010 and data line DATA. A dielectric is next deposited forming an inter-metal dielectric layer (not shown) having a via opening 1012. A fourth metal layer is deposited and patterned forming a metal layer 1008 including the common electrode COM, a first contact pad PAD1, a second contact pad PAD2, and is in the via 1012. The via is through the inter-metal dielectric layer and couples the storage capacitor CST upper electrode 1010 to the second contact pad PAD2. A micro-led or sensor of some type may be formed or mounted between PAD1 and PAD2. The first and second contact pads PAD1 and PAD2 may be formed for an external pixel element such as a micro-LED (not shown) to be formed or placed on the upper most surface. The microLED or sensor will having first and second contacts that will be electrically coupled to the first and second contact pads PAD1 and PAD2.

While the arrangement of the amorphous layers to the other layers in each of these pixels can vary, what is achieved is a dual input driving sequence that includes a storage capacitor. The dual steps are a writing period and a lighting period that can be distinct in time. The writing period may be an addressing period, which is followed by a pixel element lighting period. A possible operation of the two step driving sequence is shown in FIGS. 11A and 11B.

Figure 11A:
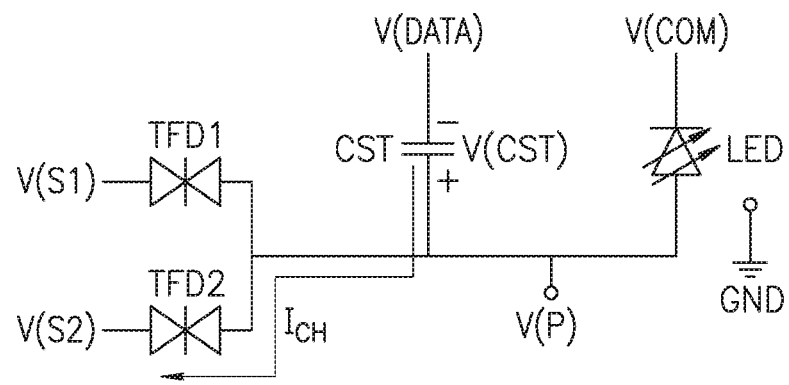
FIGS. 11A and 11B are pixel circuitry in operation.

FIG. 11A illustrates the first step or storage capacitor addressing period. During the first step a voltage $V_{CST}$ is set across the terminals of storage capacitor CST. Voltages VS1 and VS2 may be set to voltages such that the difference voltage between the select lines are greater than a threshold voltage of the first and second thin film diodes TFD1 and TFD2. This causes the thin film diodes TFD1 and TFD2 to conduct, forming a voltage divider such that a voltage VP at a charging node P is approximately halfway between $V_{S1}$ and $V_{S2}$. A common electrode COM may be left floating or set to a bias voltage such that the pixel element LED conducts little or no current. A voltage $V_{DATA}$ is applied to the data line and the voltage $V_{CST}$ is charged to a voltage that is the difference between $V_{DATA}$ and VP with charge current flowing from data line through the storage capacitor CST and through the thin film diodes TFD1 and TFD2. As an example, for VS1=+10V and VS2=−10V, enough to forward bias the thin film diodes TFD1 and TFD2, the voltage VP would be approximately 0V. Setting the voltage VD to 5V charges the charging capacitor CST to $V_{CST}$=5V. When TFD1 and TFD2 are conducting current, VP is a low impedance point, which charges the capacitor CST. Then a voltage is applied to $V_{DATA}$, such that a current ICH flows to charge the capacitor CST.

Figure 11B:
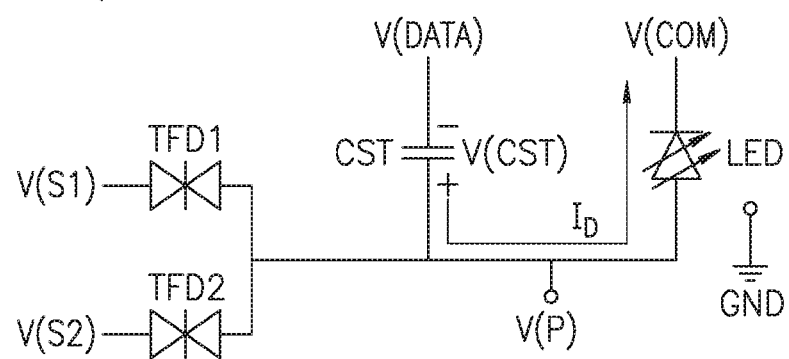

FIG. 11B illustrates the second step or pixel element lighting period. During the pixel element lighting period, a charge in charging capacitor CST is allowed to discharge into the pixel element LED, see current ID. During the pixel element lighting period, the first and second select lines S1 and S2 are driven to voltages such that the difference voltage VS1-VS2 is less than the threshold voltages of the series connected TFD1 and TFD2. Data line is set to ground, or $V_{DATA}$=0v and the common electrode COM is set to ground VCOM=0V or a bias voltage that allows the pixel element LED to conduct giving a visual display of the pixel. The charge in charging capacitor CST causes current to flow through the pixel element LED emitting light.

Similarly, in a sensor array where the LED is replaced by a sensing element, the two steps driving sequence may be contemplated in which a charge accumulation step and a readout step are used. During the charge accumulation step Vcom and $V_{DATA}$ are set to ground. The select line voltages, VS1 and VS2 are set to voltages that render the thin film diodes THD1 and THD2 to be non-conductive. The sensor charges the charging capacitor in response to radiation received from the environment. In the readout step, Vcom is opened and data line is connected to a high impedance voltage amplifier or a low impedance current amplifier. The difference voltage VS1-VS2 is set to a value larger than the threshold voltage of the series connected thin film diodes THD1 and THD2. The voltage divider provided by the conducting thin film diodes provides a voltage from which the voltage VCST may be sensed by the high impedance voltage amplifier. Alternatively, the conducting thin film diodes THD1 and THD2 provide a current path allowing the charge on CST to be sensed through discharge current.

For some embodiments it may be beneficial to have the pixel elements set to different brightness levels, or gray scale. In an embodiment 1200 illustrated in FIG. 12, a method for achieving gray scale uses a time ratio based gray scale. In the example of embodiment 1200, 6 sequential lighting time periods are used, each having half the time duration of the previous lighting time period. Just prior to each lighting period, the pixel is addressed and the charge storage capacitor charged or discharged according to the brightness level. As an example, if the pixel element is lighted in each of the six periods, the pixel element may be perceived at the highest brightness level. If the pixel element is lighted the first of the six lighting periods, but left dark during the rest of the lighting periods, the pixel element may be perceived at a lower brightness level.

In some embodiments previously described, the common electrode COM lies on top of the pixel elements (such as between the pixel elements and a user viewing the display). This dims the light emitted by the pixel element or attenuates the light falling onto the sensor. Other embodiments of pixels have the common electrode COM lying below the pixel element. As described above, amorphous metal non-linear resistors (AMNR) may be used as the thin film diodes of the pixel control circuit. These AMNR's have multiple active regions formed by at least one layer of amorphous metal separated from another metal by a tunneling oxide layer.

Figure 13:
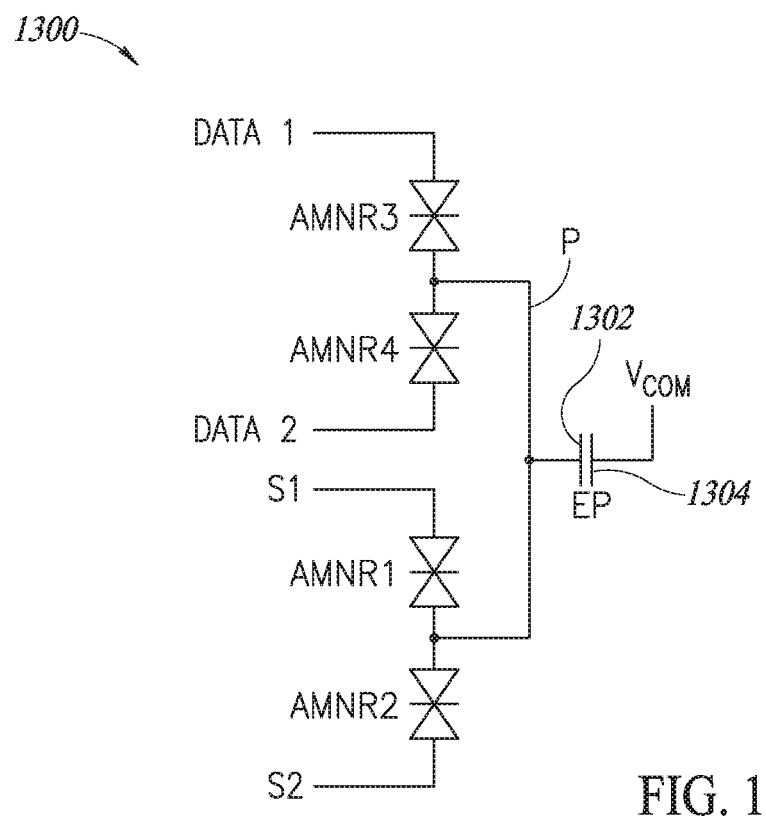
FIG. 13 is a pixel circuit that includes a plurality of amorphous metal nonlinear resistors using dual control for data.

FIG. 13 is an alternative embodiment of a pixel 1300 having a capacitive pixel element EP, such as an electrophoretic pixel. The pixel is selected for charging the capacitive pixel element EP using select lines S1 and S2 by applying a low voltage or 0V across a first pair of AMNR devices AMNR1 and AMNR2 so as to not exceed the threshold of series connected AMNR devices AMNR1 and AMNR2. The charging node, floating or independent node P, is coupled to a lower plate 1302, or lower electrode of pixel element EP. Column data lines DATA1 and DATA2 are series coupled to a second pair of AMNR devices AMNR3 and AMNR4. A node between AMNR1 and AMNR2 is coupled to the charging node P and a node between AMNR3 and AMNR4 is coupled to the charging node P as well. A current carrying capacity of AMNR1 and AMNR2 is higher than a current carrying capacity of AMNR3 and AMNR4. This can be accomplished by making an active area of AMNR3 and AMNR4 less than an area of AMNR1 and AMNR2.

Thus both select lines S1 and S2 are electrically coupled to charging node P when AMNR1 and AMNR2 are conducting, forming a voltage divider. This sets a voltage V(P) at charging node P to a voltage about halfway between a voltage V(S1) of the first select line S1 and a voltage V(S2) of the second select line S2. The upper electrode 1304 of the pixel element EP, may be in common with other pixels. In an embodiment, the pixel 1300 operation includes a programming cycle.

During the programming (addressing) cycle of pixel 1300, for the pixel to receive data, the select lines S1 and S2 for that row may be driven such that the voltages V(S1) and V(S2) do not exceed the threshold of the series connected AMNR1 and AMNR2, thus AMNR1 and AMNR2 are not conducting and the charging node P is isolated from select lines S1 and S2. This is different from the embodiments described above, where the AMNRs associated with the select lines are conducting for the addressing period.

The voltages V(DATA1) and V(DATA2) at DATA1 and DATA2 are driven such that a voltage across AMNR3 and AMNR4 exceed the threshold voltage of series connected AMNR3 and AMNR4, causing AMNR3 and AMNR4 to conduct current. A voltage V(P) at charging node P moves to approximately half of the voltage between V(DATA1) and V(DATA2), also known as an average or offset voltage relative to the common upper electrode or relative to V(COM). Charging node P is set to a voltage by data lines DATA1 and DATA2.

In FIGS. 14A-14E, there are a series of operational steps described for an array of pixels having the structure of the circuit of FIG. 13. The arrays of pixels are arranged in rows and columns. After a first pixel is programmed and pixels in another row are to be set, the first pixel may be held at the programmed state. This first pixel must be isolated from the data lines DATA1 and DATA2 to maintain the programmed state, in one embodiment. To affect such isolation the select lines S1 and S2 are driven such that the voltages V(S1) and V(S2) to exceed the threshold of the series connected AMNR1 and AMNR2 causing AMNR1 and AMNR2 to conduct and set the voltage V(P) of charging node P to a voltage halfway between V(S1) and V(S2). This may be an average voltage or offset voltage. By choosing an offset voltage of V(COM), and by designing the select line AMNR1 and AMNR2 to have a significantly higher current carrying capacity than the data line AMNR3 and AMNR4, operation of AMNR3 and AMNR4 is overridden making the state of DATA1 and DATA2 irrelevant.

In an embodiment a current carrying capacity of an AMNR, a TFD, or any diode-like device, may be increased by increasing the area of the device having the effect of lowering the current density of the device. As such, operation of pixel 1300 may be analogous to an open-drain output. A relatively high impedance voltage source (AMNR3 and AMNR4 having a relatively high impedance when conducting) sets the output value while in an "open" state. In a "closed" state the output voltage is driven to a different value through a relatively low impedance voltage source (AMNR3 and AMNR4 having a relatively low impedance when conducting).

The pixel array 1400 constructed includes 3 rows and 2 columns of the pixel 1300 of FIG. 13. This array can be for an AMNR-based EPD backplane with vertically aligned pixel electrodes, without patterning a top glass. Previous vertically aligned pixel AMNR backplane designs have relied on a patterned upper electrode layer, which is not an option in some circumstances. The present disclosure includes an alternative approach to creating an active-matrix AMNR backplane which does not rely on patterned top glass.

To start, a row is selected by applying a voltage to two AMNR devices in series; a "dual select" configuration. The center (floating) node is connected to one side of the lower electrode of the capacitor EP. Column data is not connected to the upper electrode. Instead, the upper electrode is common to the entire display. Column data lines have a dual-select configuration the same as row select lines, totaling four AMNR devices per pixel. The floating node of both row and column dual-select lines are connected to a pixel's lower electrode. During a programming cycle, a differential voltage is applied to data lines, driving the lower electrode to a value equal to the data lines' offset voltage relative to the common upper electrode. The role of row select AMNRs is to prevent the data lines' voltage offset from charging the lower electrodes of pixels in non-selected rows. This is accomplished by applying a differential voltage to row select lines with an offset voltage equal to VCOM. Row select AMNRs will be designed to have a significantly higher current carrying capacity than column AMNRs. This is analogous to how an open-drain digital output pin works: a relatively high-impedance voltage source sets the output value while in an 'open' state; in the 'drain' state, the output value is driven to a different value through a low-impedance voltage source.

Two pairs of column data lines {D1(1), D2(1)} and {D1(2), D2(2)} are shown, as well as three pairs of row select lines {S1(1), S2(1)}, {S1(2), S2(2)}, {S1(3), S2(3)}. Voltages (i.e., VCOM+35V, VCOM−65V, etc.) are shown for strategic nodes of the pixel array 1400 to illustrate operation steps of the pixel array 1400.

Figure 14A:
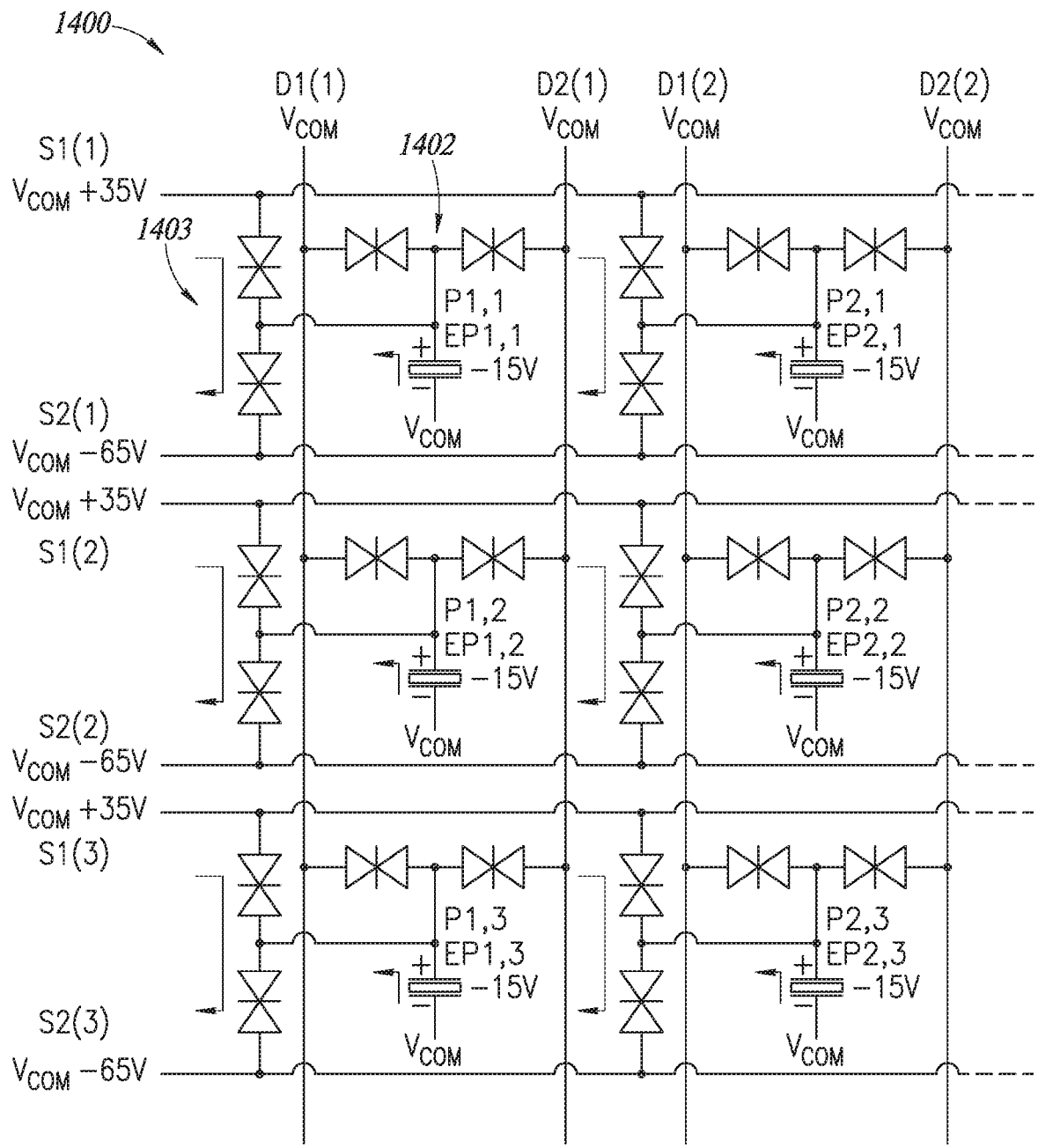
FIGS. 14A-14E are an array of pixels in operation and a voltage plot.

FIG. 14A is the first step in a series (5) of steps to implement a "shakeup phase" for the plurality of pixels in pixel array 1400. It is noted that the array can have significantly more row and columns. In a first step of shakeup, all data lines D1(1), D2(1), D1(2) and D2(2), are set to $V_{COM}$. A first pair of AMNR diodes 1403 is positioned between select line S1 and select line S2 in each pixel. A second pair of AMNR diodes 1401 is positioned between data line D1 and data line D2 in each pixel. Each diode of the first pair 1403 has a threshold for conduction of 5V, as an example. A voltage across the combination of the second pair of diodes is 0V, which is below their conduction threshold. Therefore for all pixels, the second pair of diodes are non-conductive and all charging nodes P are isolated from their respective data lines D1 and D2. The select lines S1(1), S1(2), and S1(3) are driven to $V_{COM}$+35V. The select lines S2(1), S2(2) and S2(3) are driven to $V_{COM}$−65V. The average voltage, or offset voltage, between each pair of select lines can be represented by:

$$[(V_{COM}+35v)+(V_{COM}-65V)]/2 = -(2*V_{COM}+30V)/2 = V_{COM}-15V$$

Thus, each capacitive pixel element EP may have -15v across its terminals. This equation solves for the pixel element voltage V_EP (i.e., V_EP= ...).

In one embodiment, a row is selected when no differential voltage is applied to S1 and S2 ($V_{SEL1}=V_{SEL2}=V_{COM}$). This permits D1 and D2 to set VP. A row is deselected when a differential voltage is applied to S1 and S2, with the offset voltage equal to $V_{COM}$. This forces VP to $V_{COM}$, with sufficiently low impedance that the effect of Data Voffset on VP is negligible. For example, the following equation may apply:

$$V_{SEL1}=(V_{COM}+50V) \text{ and } V_{SEL2}=(V_{COM}-50V)$$

While charging a pixel's lower electrode to x volts relative to $V_{COM}$, the column line Voffset is set to x. For example, the following equations may apply:

$$V_{COM}=0V, V_{Data1}=(x+50V), \text{ and } V_{Data2}=-50V); \text{ and}$$

$$V_{COM}=-x, V_{Data1}=50V, \text{ and } V_{Data2}=-50V.$$

As soon as the lower electrodes are charged, $V_{DATA1}$ and $V_{DATA2}$ are both set to $V_{COM}$. After a pixel has been held at x for the appropriate amount of time, the following equation may apply:

$$V_{Data1}=(V_{COM}+50V) \text{ and } V_{Data2}=(V_{COM}-50V),$$

where "50V" is a stand-in for select voltage.

In an idle state, all row select lines are set to $V_{COM}$, meaning no current can flow between pixel electrodes and column drivers. All data lines are set to $V_{COM}$, meaning no current can flow between pixel electrodes and column drivers. The pixel electrodes maintain charge while consuming no power. This may be a "Quiescent State," where no current is allowed to flow into or out of the lower electrode, so pixel charge remains constant.

In one embodiment, a first shake up phase includes the following steps, charge all lower electrodes to VCOM−15V, hold charge of all lower electrodes at VCOM−15V, charge all lower electrodes to VCOM+15V, hold charge of all lower electrodes at VCOM+15V, and charge all lower electrodes to VCOM.

In a phase to charge all pixel black, which is illustrated in FIG. 14A, the following steps may be executed. First, set row select lines such that current flows from S1 to S2, with an offset voltage setting VP to $V_{COM}$−15V; SEL1=($V_{COM}$+50V−15V); and SEL2=($V_{COM}$−50V−15V). All data lines are set to $V_{COM}$, meaning no current can flow between pixel electrodes and column drivers. The pixel electrodes are charged to −15V relative to $V_{COM}$ through S2. This state is maintained for the duration of electrode charging.

During a particle migration phase, a second shake up phase, all row select lines are set to VCOM, meaning no current can flow between pixel electrodes and column drivers. All data lines are set to VCOM, meaning no current can flow between pixel electrodes and column drivers. The pixel electrodes maintain charge while consuming no power. This state is maintained for the duration of particle migration.

During a third shake up phase, all pixels are set to white. The row select lines are set such that current flows from S1 to S2, with an offset voltage setting VP to VCOM+15V; S1=(VCOM+50V+15V); and S2=(VCOM−50V+15V). All data lines are set to $V_{COM}$, meaning no current can flow between pixel electrodes and column drivers. The pixel electrodes are charged to +15V relative to VCOM through S1. This is maintained for the duration of electrode charging.

During a fourth shake up phase, particle migration is performed. All row select lines are set to VCOM, meaning no current can flow between pixel electrodes and column drivers. All data lines are set to VCOM, meaning no current can flow between pixel electrodes and column drivers. The pixel electrodes maintain charge while consuming no power. This is maintained for the duration of particle migration.

During a fifth shake up phase, all electrode charge is cleared. This is achieved by setting row select lines such that current flows from S1 to S2, with an offset voltage setting VP to VCOM; S1=(VCOM+50V); and S2=(VCOM−50V). All data lines are set to VCOM, meaning no current can flow between pixel electrodes and column drivers. The pixel electrodes are charged to 0V relative to VCOM through S2. This is maintained for the duration of electrode charging.

An idle state may follow in which, all row select lines are set to VCOM, meaning no current can flow between pixel electrodes and column drivers. All data lines are set to VCOM, meaning no current can flow between pixel electrodes and column drivers. The pixel electrodes maintain charge while consuming no power.

Figure 14B:
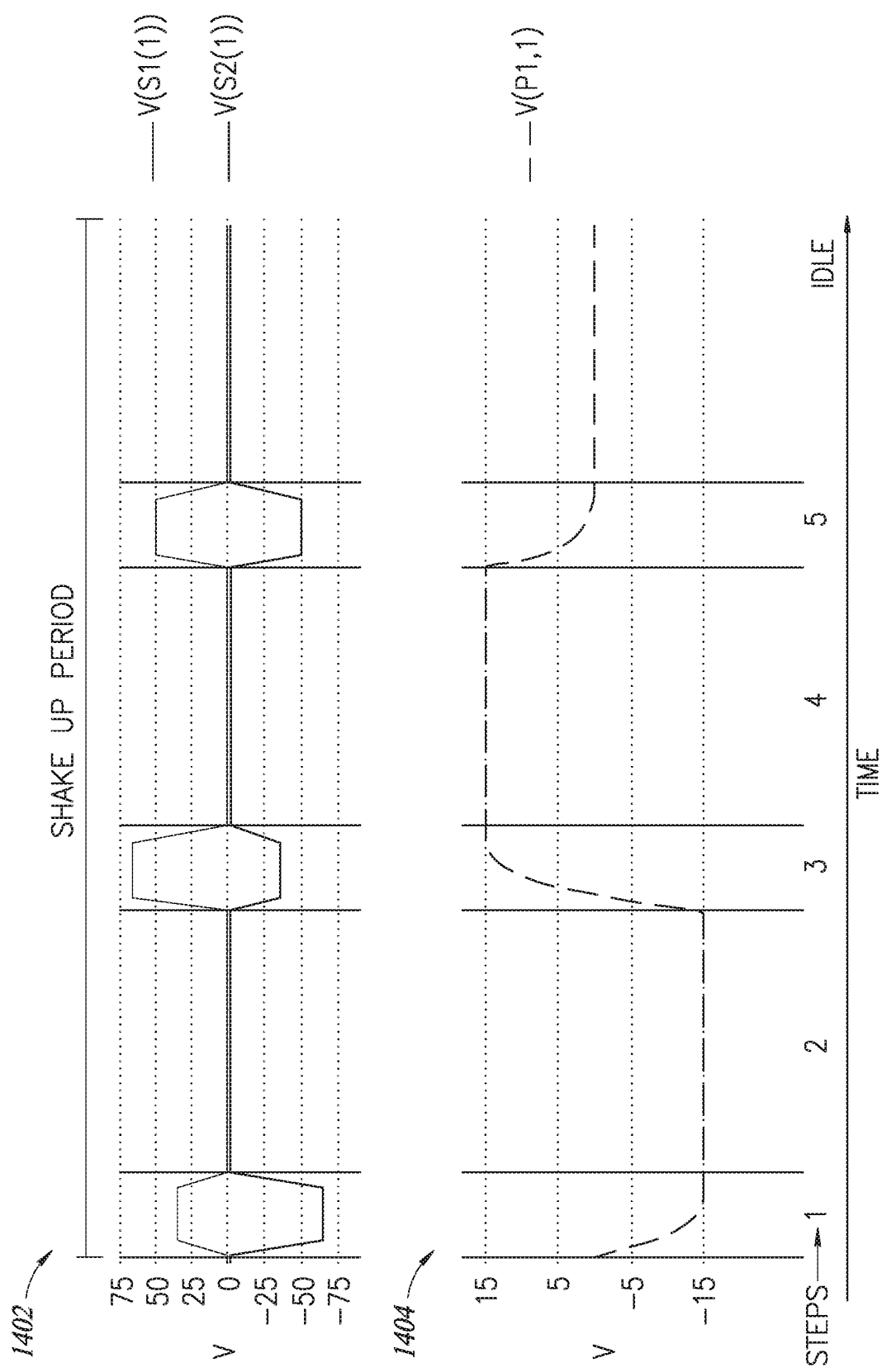

FIG. 14B includes graphs 1402 and 1404. Graph 1402 shows steps 1-5 of the shake up phase for a single pixel 1300 of pixel array 1400. Voltage levels V(S1(1)) and V(S2(1)) for select lines S1(1) and S2(2) are shown during the shakeup period. All voltages shown in graph 1402 are presented with respect to $V_{COM}$. Graph 1404 is the voltage V(P1,1) From FIG. 14A at a charging node P1,1 with respect to $V_{COM}$. During the shakeup period the voltage at data lines D1(1), D2(1), D1(2) and D2(2) are equal to $V_{COM}$, rendering charging node P1,1 electrically decoupled from the data lines D1 and D2.

During step 1 all pixels are charged to black, the voltages of FIG. 14A apply and the charging node P1,1 is charged to −15V through conducting AMNR diodes AMNR1 and AMNR2. During step 2, the voltages of the select lines S1(1) and S2(1) are equal, each at 0V and AMNR1 and AMNR2 become non-conductive. In this condition, the charging node P is isolated from the select lines S1 and S2 and maintains a voltage due to the capacitance provided by the capacitive pixel element EP. During step 3, the first select line S1 has a voltage of +65V and the second select line has a voltage of −35V. AMNR1 and AMNR2 are conducting and the voltage at charging node P1,1 rises to the average voltage, or offset voltage, of the first and second select lines S1 and S2, which is:

$$V(P1,1)=\{V(S1)+V(S2)\}/2=\{+65V+-35V\}/2=+30V/2=+15V$$

During step 4 the first and second select lines S1 and S2 having voltages of 0V and the AMNR1 and AMNR2 are not conducting, isolating the charging node P from the first and second select lines S1 and S2. The voltage V(P) on charging node P is held due to the capacitive pixel element EP. During time period 5, the first select line S1 is driven to voltage V(S1)=+50V and the second select line S2 is driven to voltage V(S2)=−50V. The AMNR devices AMNR1 and AMNR2 are conducting and the average voltage, or offset voltage, of first and second select lines S1 and S2 on charging node P is:

$$V(P(1,1))=\{V(S1)+V(S2)\}/2=+50V+-50V=0V$$

During the IDLE, V(S1)=V(S2)=0V, the AMNR devices AMNR1 and AMNR2 are non-conductive and the charging node P holds the voltage V(P) at 0V.

It is noted that in FIG. 14A and others, a rectangle positioned within the capacitive plates of the pixel element EP may represent a charged element. The following figures include an example of programming two rows of an EPD display with an AMNR-based backplane. This includes how individual pixels are charged and how or when the charge is dissipated to achieve appropriate EPD particle migration.

Figure 14C:
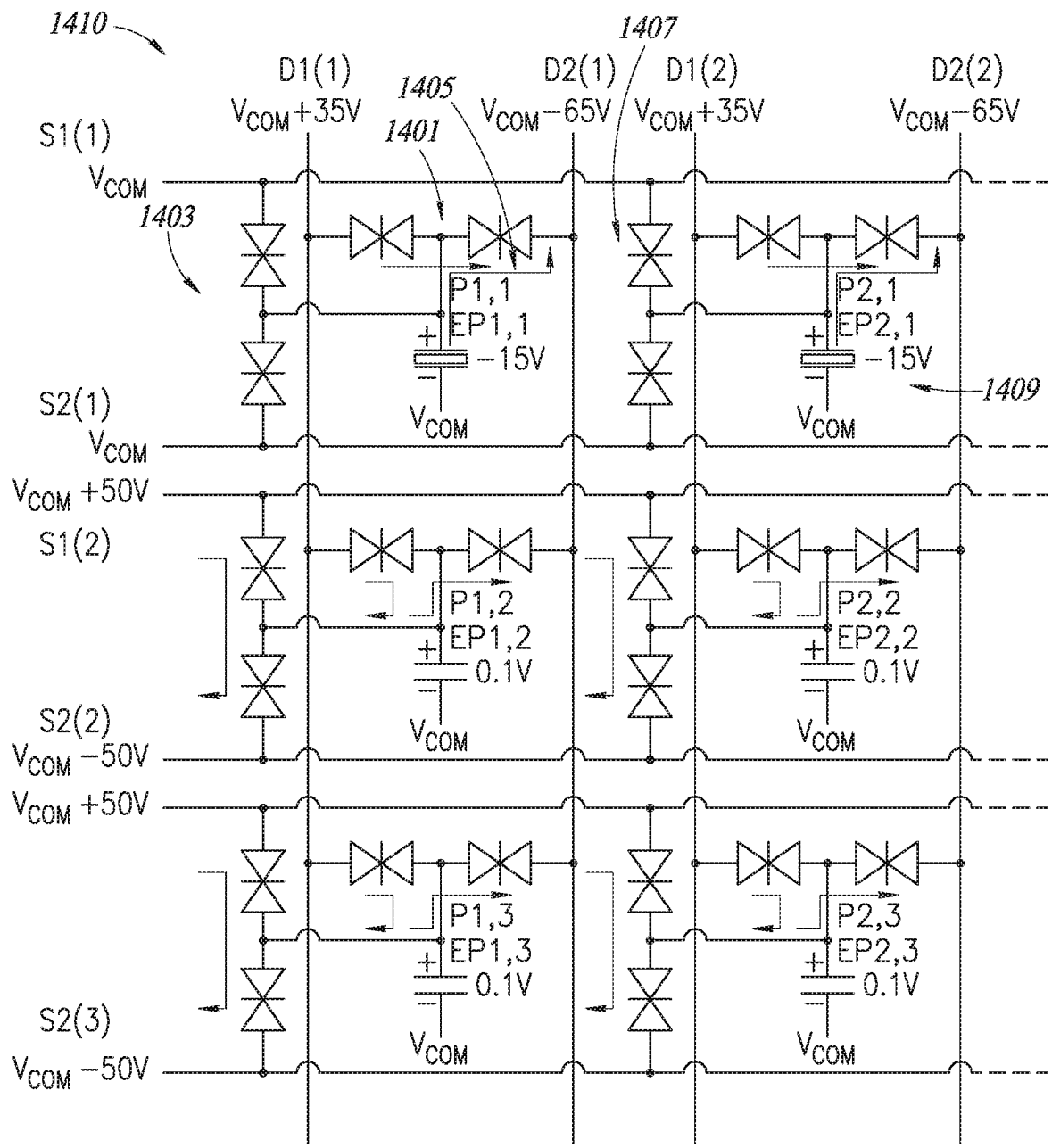

FIG. 14C is the pixel array 1400 during which the first row of pixels is being programmed. The voltages on select lines S1(1) and S2(1) for the first row of pixels are driven to $V_{COM}$ making the first pair of AMNR devices 1403 in a first pixel 1405 and a first pair of AMNR device 1407 of a second pixel 1409 non-conductive. In this condition, the first row of pixels are selected to writing from the data lines D1(1), D2(1), D1(2) and D2(2). The first select lines S1(2) and S1(3) are driven to $V_{COM}$+50V and the second select lines S2(2) and S2(3) are driven to $V_{COM}$−50V. It is noted that the +50V and −50V represent a first and second variable that may be selected based on the end use. The first pairs of AMNR device of the remaining pixels are conducting current. The voltages on first data lines D1(1) and D1(2) are driven to $V_{COM}$+35V and the voltages on second data lines D2(1) and D2(2) are driven to $V_{COM}$−65V. All of the second pairs of AMNR devices in the pixels are connected between data lines are also conducting current from D1(1) to D2(1) and from D1(2) to D2(2). It is noted that the +35V and −65V represent a third and fourth variable that may be selected based on the end use. The third variable may be less than the first variable, while the fourth variable may be more negative than the second variable. This programs row 1 part 1, which may represent a gray set of the first and second pixels in the first row. FIG. 14C is a first state that his held for the duration of the electrode charging, then a second state is entered. The second state is held for a time period, such as 2 ms, and then a third state is established. The third state is held for the duration of the electrode charging.

Figure 14D:
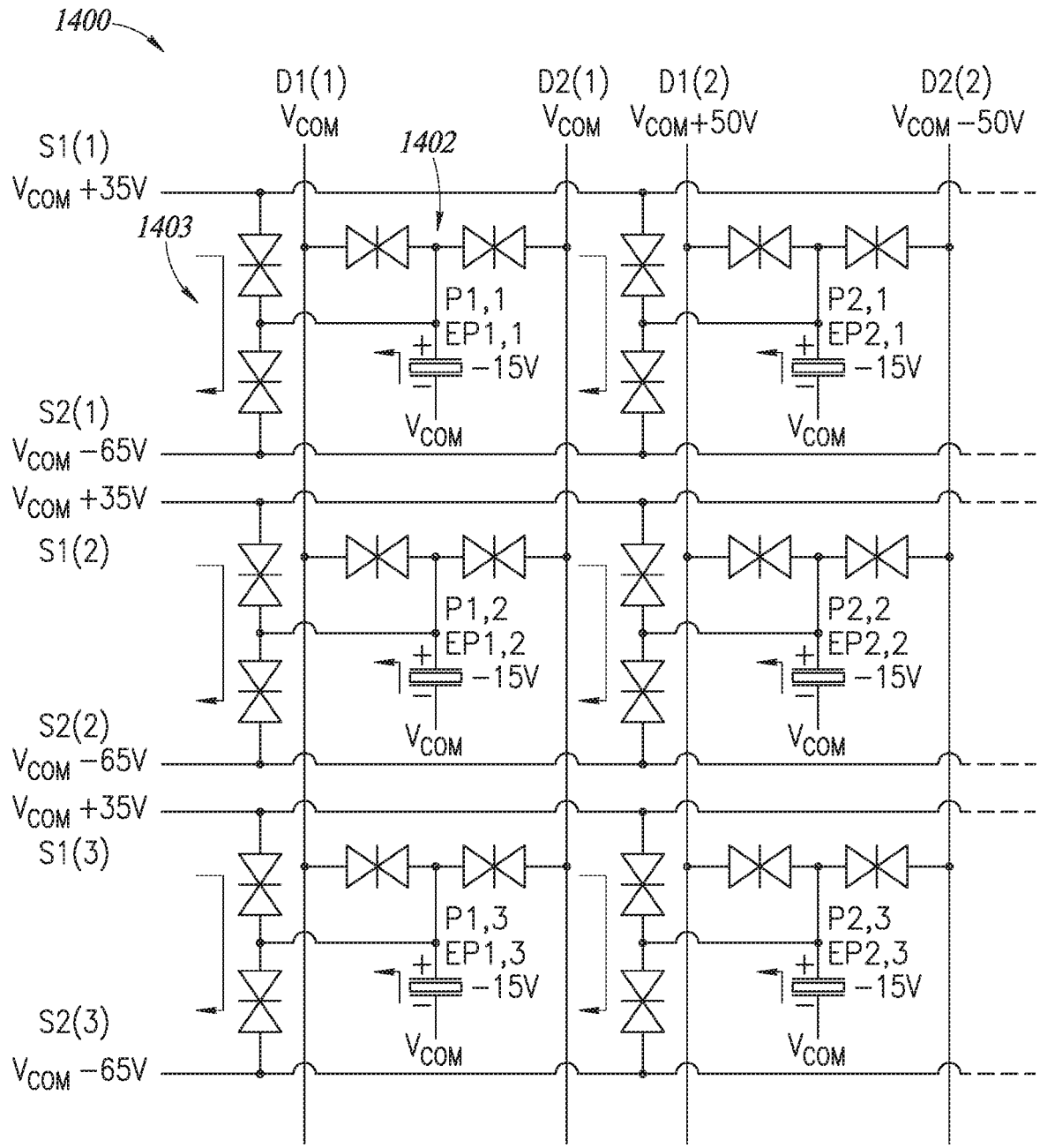
Figure 14E:
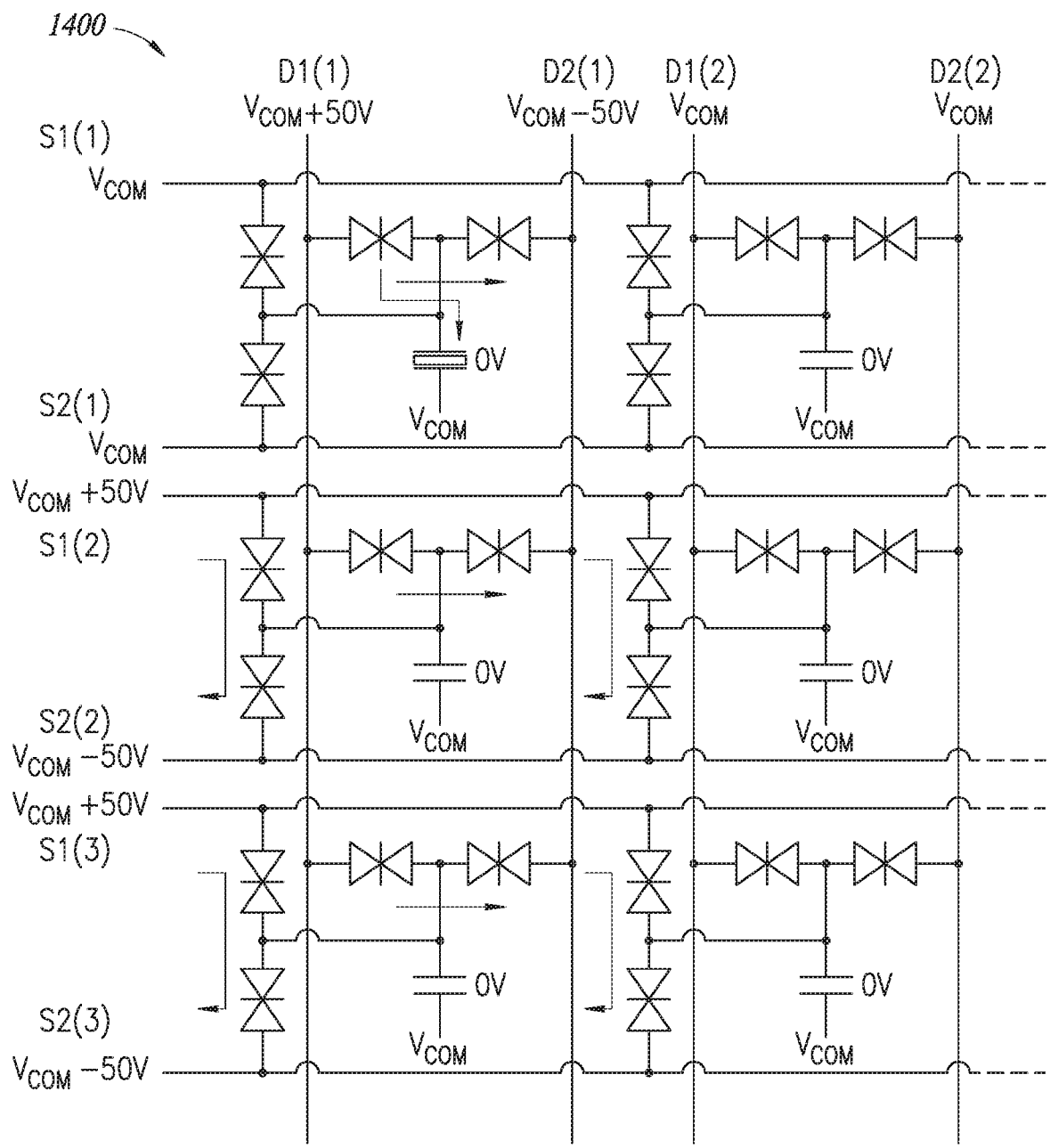

FIG. 14D is a sequence to program row 1 part 2, which may represent the first pixel as black and the second pixel as gray in the first row. FIG. 14D is the third state. The first pixel of the first row is held at a steady state. The second pixel of the first row has zero volts across the pixel element. The first pairs of AMNR device of the second and third rows of pixels receive the same voltage as during the sequence of programs row 1 part 1. Then a fourth state is entered, which is held for a period of time, such as 3 ms, and then a fifth state is initiated. FIG. 14E is the fifth state, which is held for the duration an electrode charging, which sets the pixel array up for programming in the next row.

Figure 15:
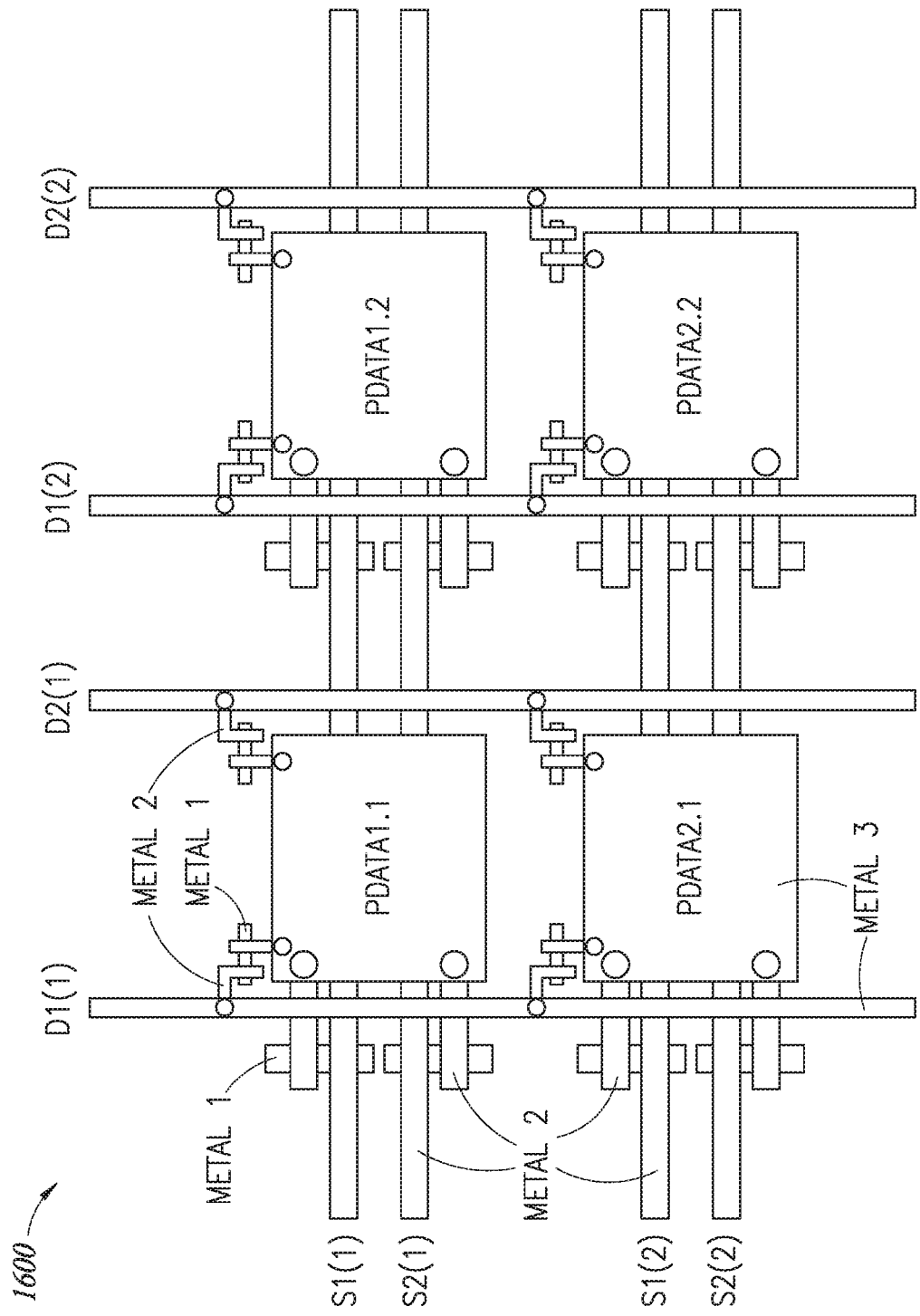
FIG. 15 is an array of pixels according to an embodiment of the present disclosure.

FIG. 15 is directed to an array of pixels, which is illustrated as a 2 by 2 array. The first metal layer formed is metal 1, which can be an amorphous thin film metal. A second metal layer is formed on and overlapping one of the interconnects formed by the first metal layer. A third metal layer is formed on and overlapping one of the select lines formed by the second metal layer. Vias are formed and coupled to the third metal layer. The third metal layer forms the data lines. It is beneficial to form the data lines on a different metal layer because the data lines intermittently carry a significant amount of charge during programming. In such electrophoretic displays, both row drivers and column drivers could possibly utilize the same circuit design.

The present disclosure is also directed to pulsed dual-select drive circuits for backplane displays. These drive circuits include non-linear resistors. These non-linear resistors, shown as AMNR1 and AMNR2 in some figures as examples, are incorporated in to drive circuits. The non-linear resistors are coupled between select line S1 and select line S2. See FIG. 16A. A shared node is between the non-linear resistors, such that AMNR1 is between the shared or independent node and the select line S1. A first and second capacitor are coupled to the shared node. The first capacitor CST is a storage capacitor and the second capacitor LC is a pixel capacitor. A first electrode of both the first capacitor and the second capacitor are coupled to the shared note. A second electrode of both the first capacitor and the second capacitor is coupled to a common line or common voltage, COM.

In a similar example, instead of the second capacitor LC, an electrophoretic capacitive structure EP may be included in the circuit. In this embodiment, the storage capacitor is coupled to a first signal line and the electrophoretic capacitive structure EP is coupled to a common line or common voltage, COM. See FIG. 16A. Electrophoretic displays may be black and white displays or may incorporate color. Sometimes these displays are referred to as e-paper, electronic ink, or e-ink. These panels are typically not backlit. Such displays are being improved to enhance reading the display in direct sunlight. These displays can hold the text static without any electricity. These displays can be formed on flexible substrates so that users can roll or fold up these displays and carry them easily without a significant amount of weight.

By integrating these non-linear resistor structures into these drive circuits time ratio grey scale is enabled. See FIG. 12. The pixel area, associated with the second capacitor of the circuits above, may include a plurality of capsules. A first subset of the plurality of capsules is charged negatively and a second subset of the plurality of capsules is positively charged. Depending on the voltage applied to the first and second electrodes of the pixel capacitor, the negatively or positively charged particles will rise to the user facing surface of the display.

In another embodiment that includes an OLED pixel, the following describes a programming and lighting sequence. The FIGS. 17B-1-17B-9 are voltage to time plots showing the storage capacitor charging and discharging and the associated voltages of the various components. A programming period is marked as 1 and lighting period is marked as 2. The two regions are separated by the black vertical line.

The sequence includes the row being selected and the storage capacitor beginning to charge until the voltage across the capacitor reaches a steady state. Charging time is at least $4*R_{AMNR}C$ seconds (~1E-6). During the programming period, charge flows from select line S1 and branches out to select line S2 and Vp (the shared node). Because data is at a lower potential, the current should flow both from Vp (the shared node) and common line to data until the storage capacitor is charged. The programming period ends with the select voltages driven back to 0V, then data being driven to 0V.

Nodes for select line S1 and select line S2 are driven to a voltage above the AMNRX turn-ON threshold. The voltage of select line S1 is of equal value and opposite polarity to that of select line S2. The data line is driven to −9V and the common electrode line is driven to 7V in one embodiment.

During the lighting period, the common electrode line is driven to 0V. At this point, the OLED is forward biased with a voltage above the turn-ON threshold. This causes current to flow, discharging the storage capacitor. Emission from the OLED will occur until the forward current drops below the emission threshold.

Figure 17A:
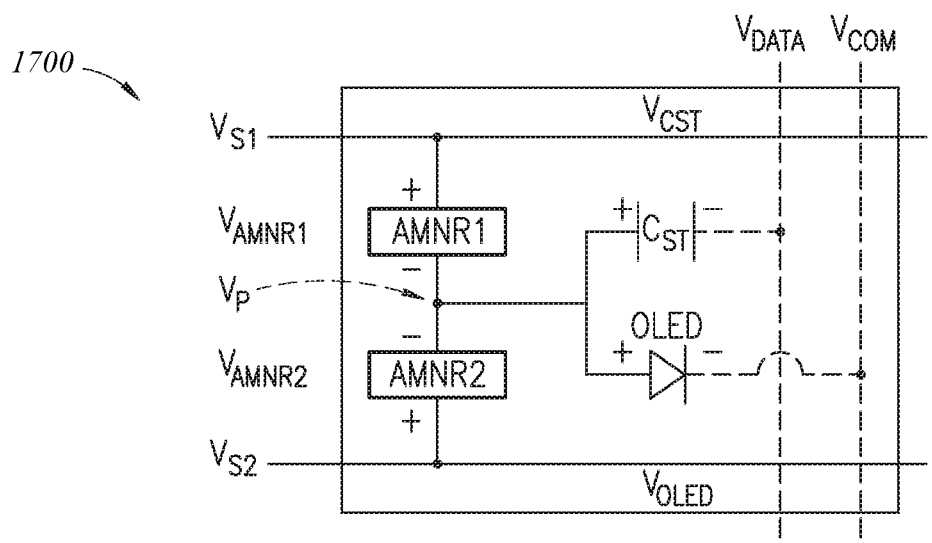
Figures 1, 17B:
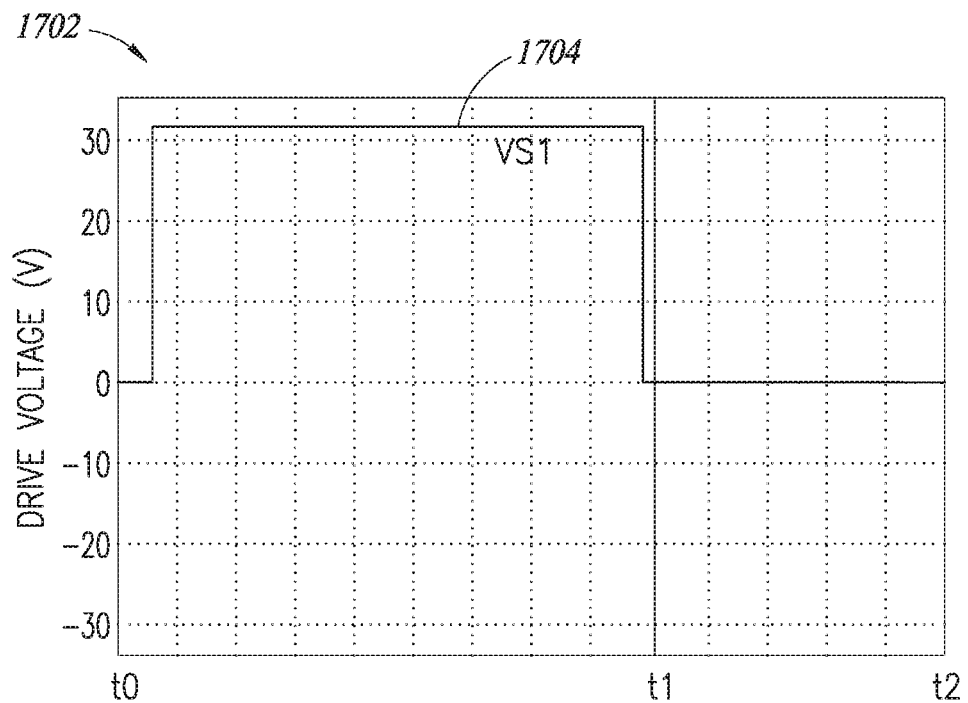
Figures 2, 17B:
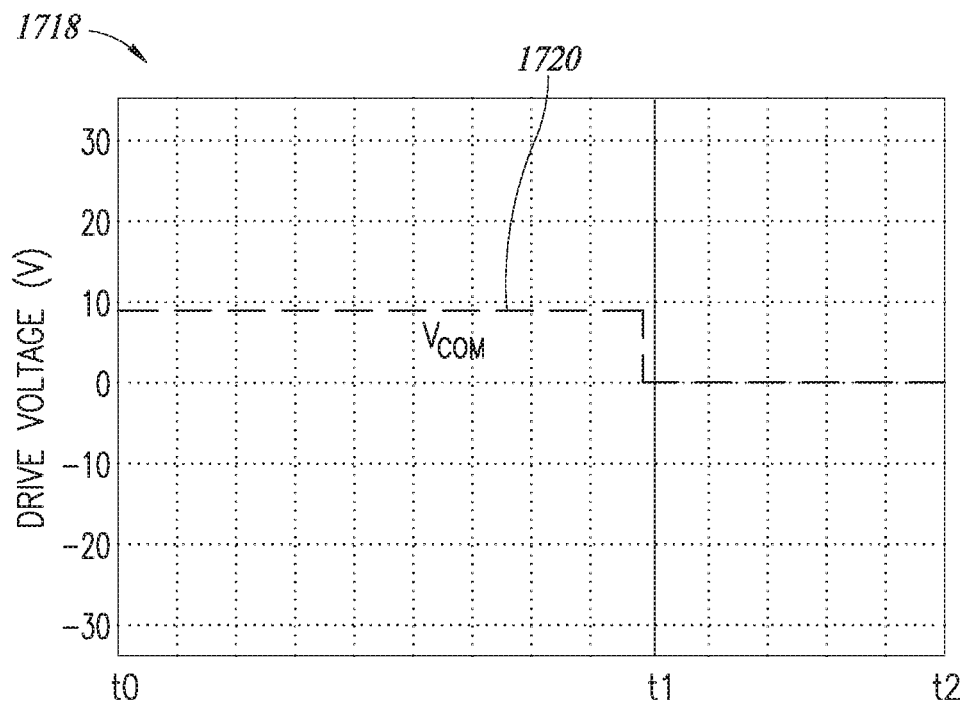
Figures 3, 17B:
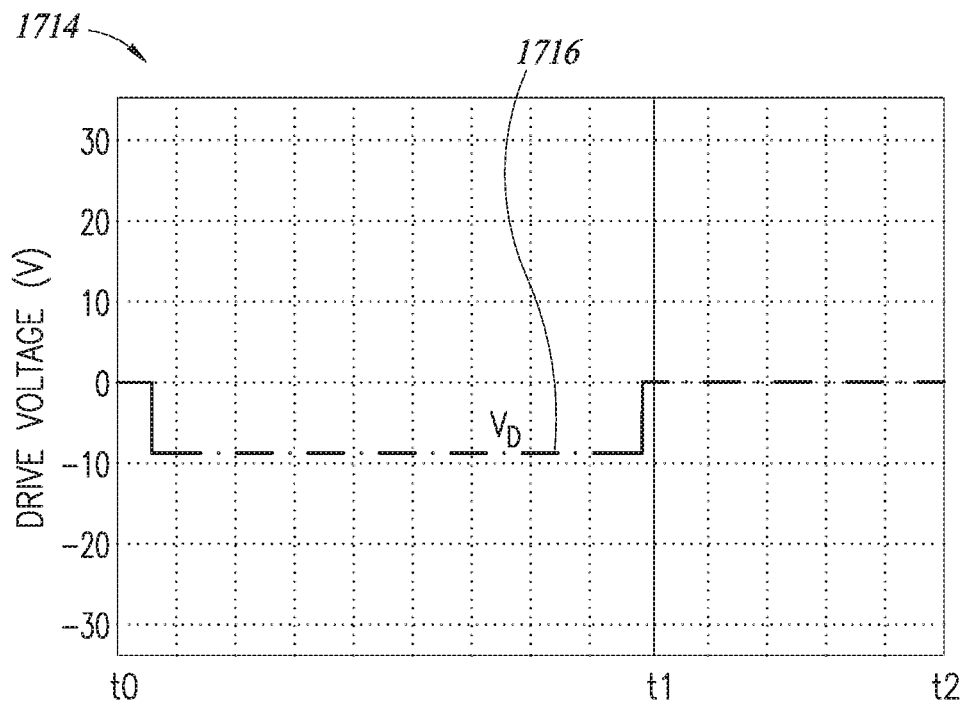
Figures 4, 17B:
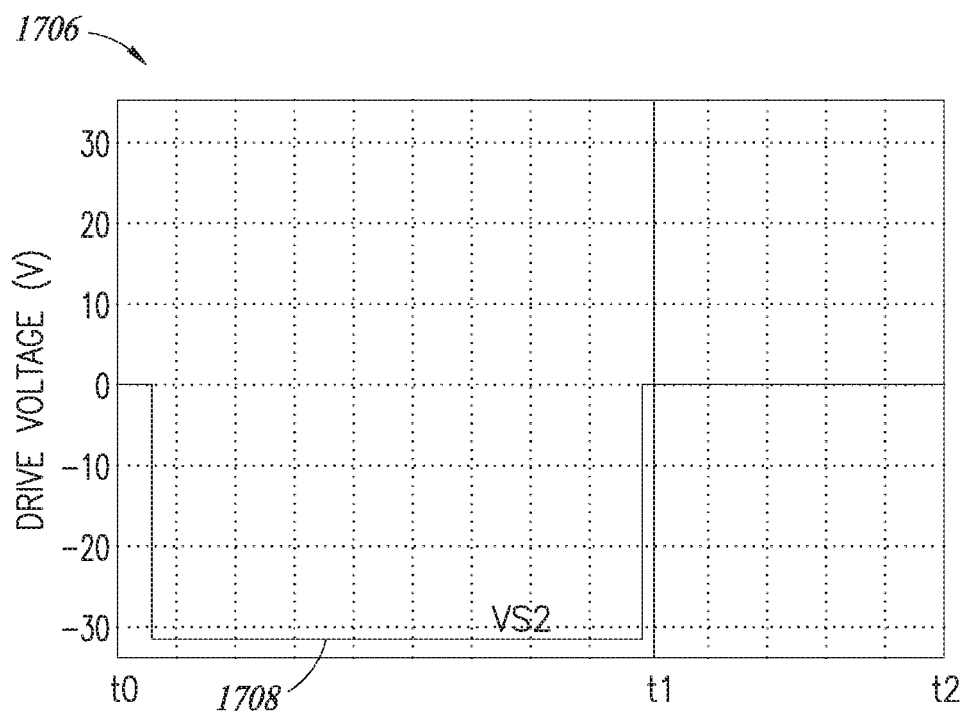
Figures 5, 17B:
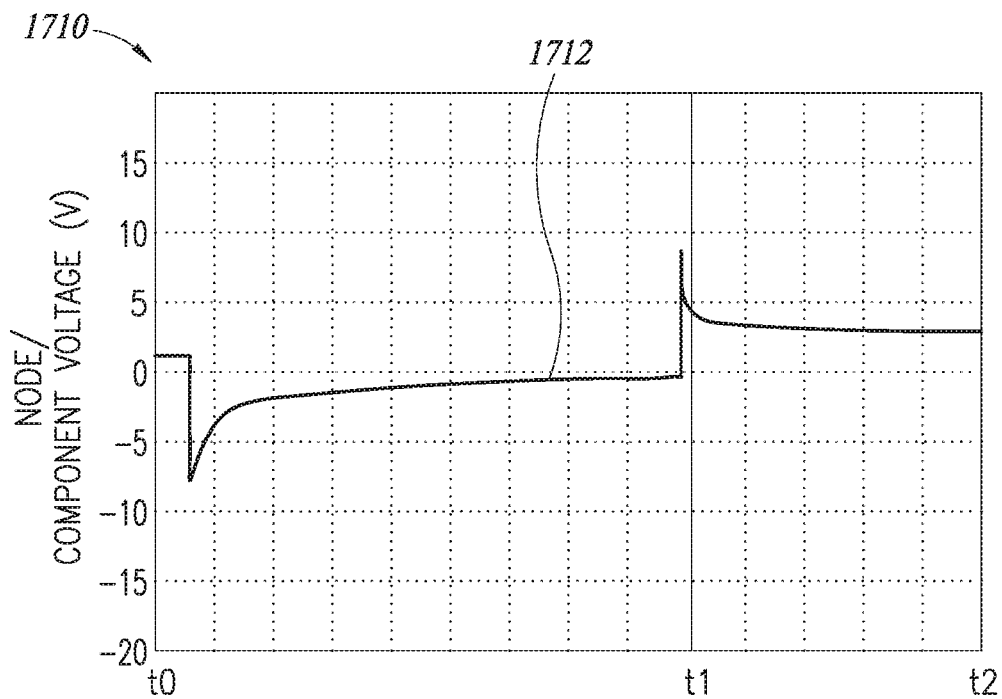
Figures 6, 17B:
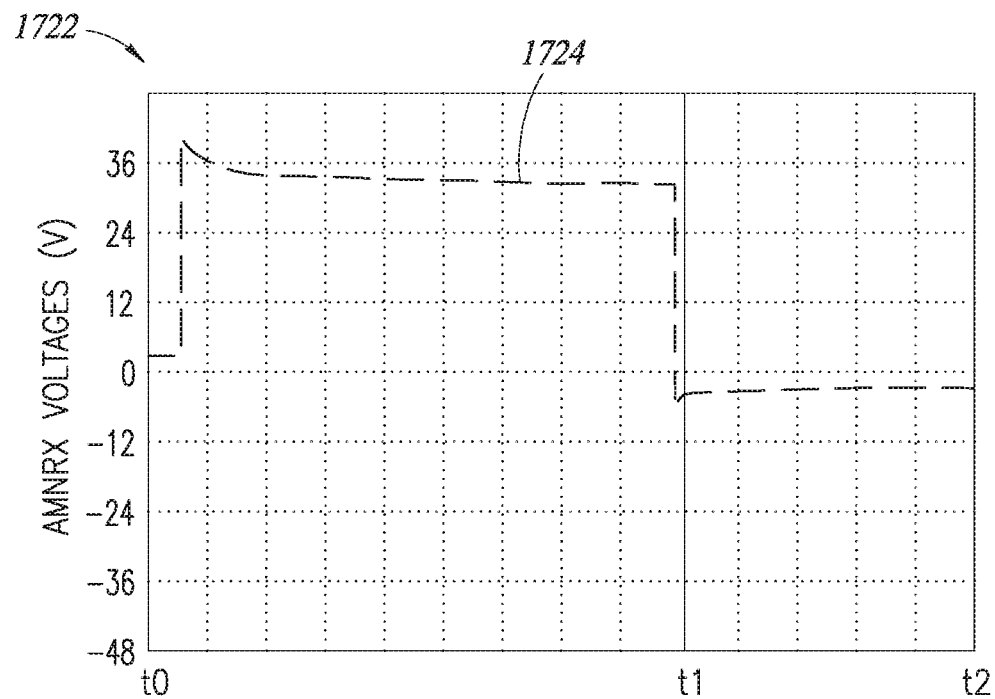
Figures 7, 17B:
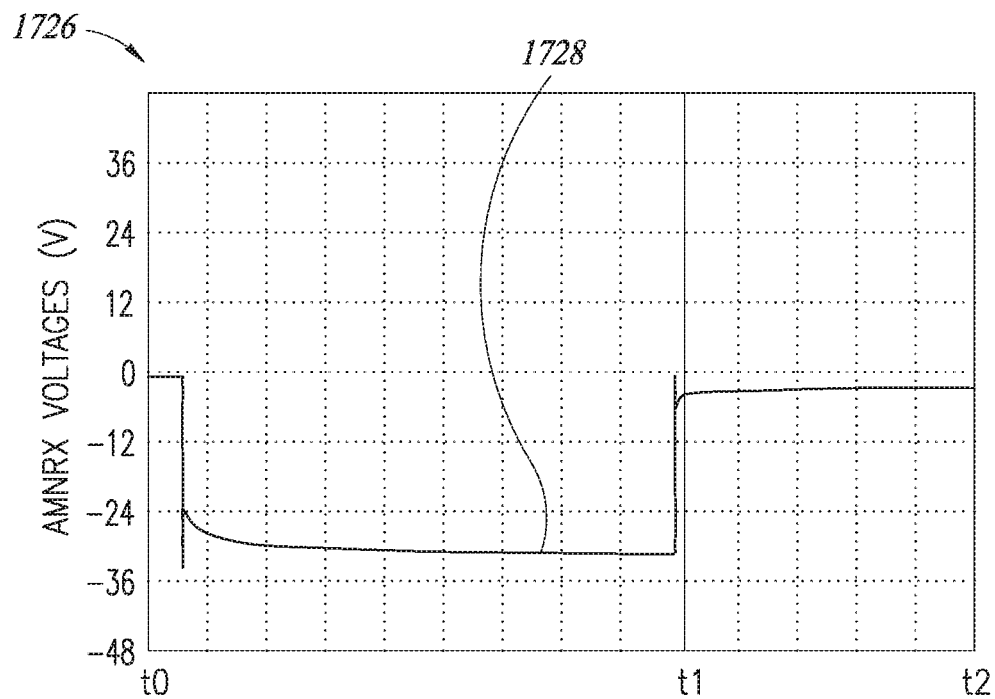
Figures 8, 17B:
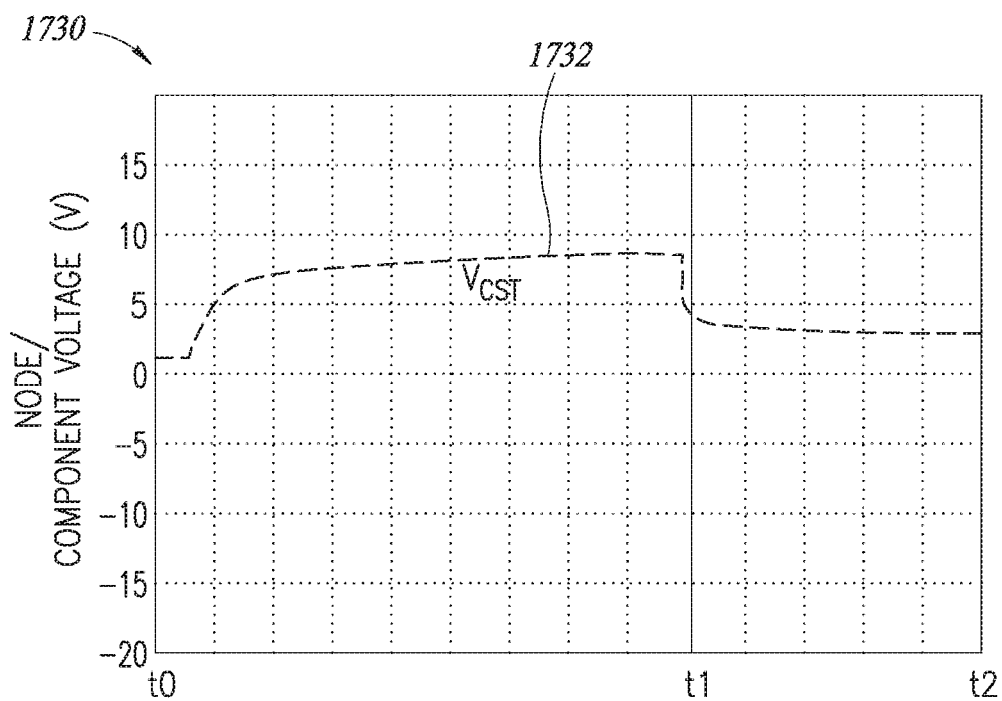
Figures 9, 17B:
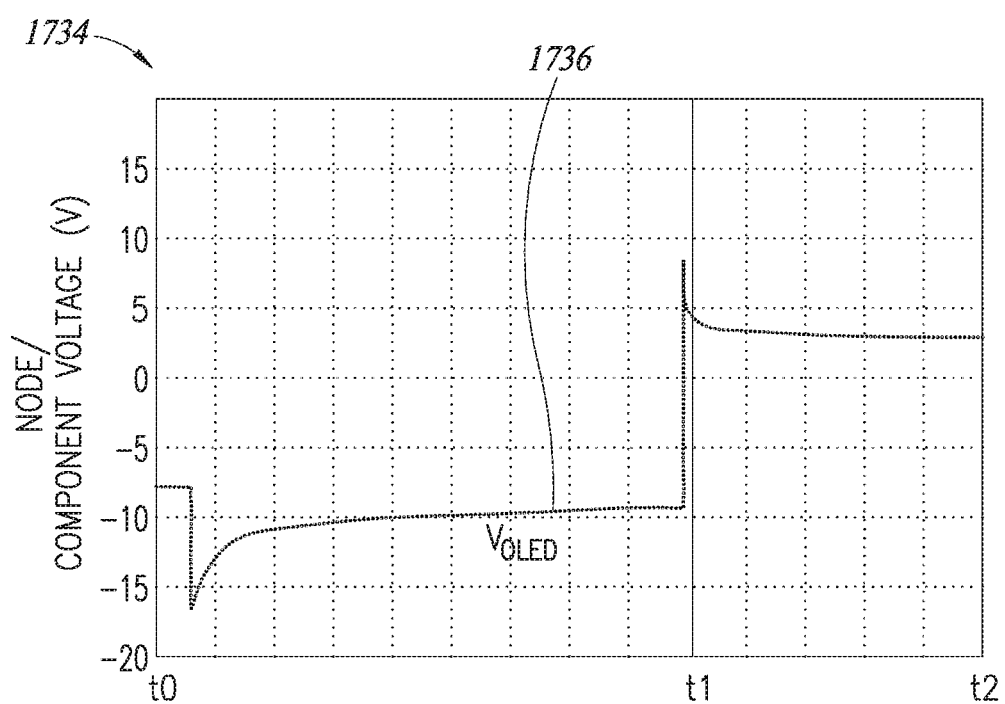
Figures 1, 17C:
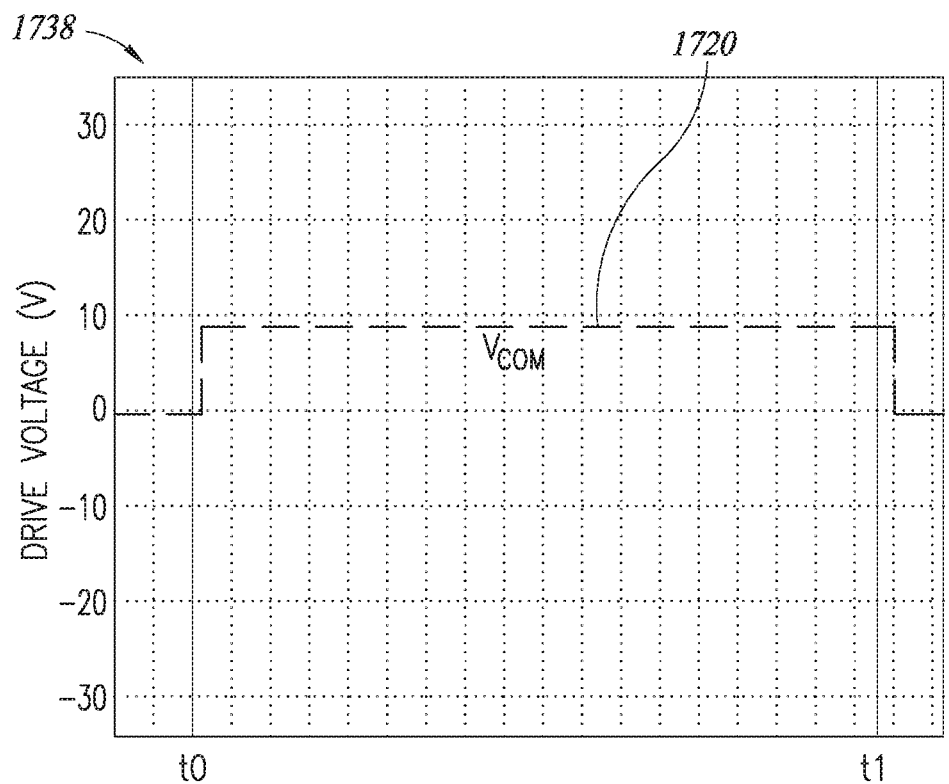
Figures 2, 17C:
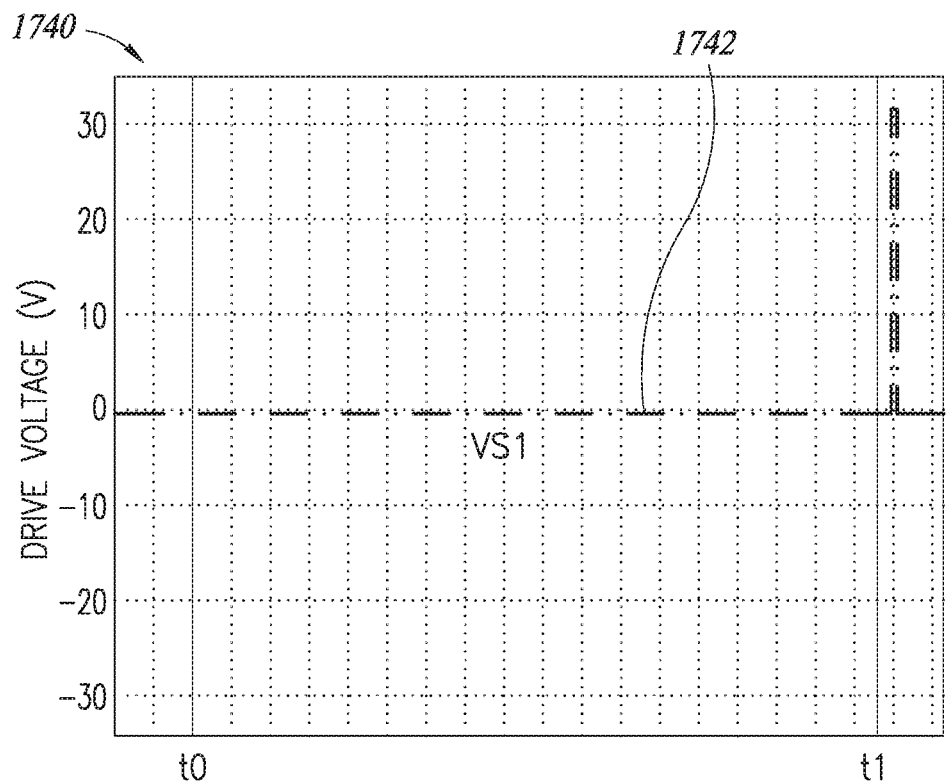
Figures 3, 17C:
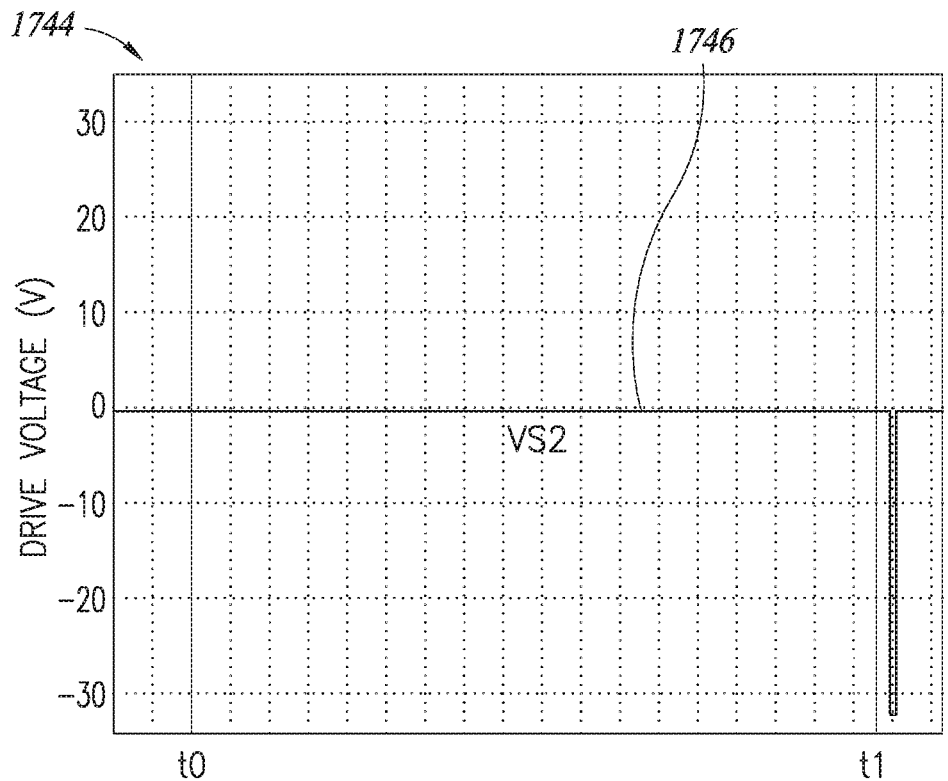
Figures 4, 17C:
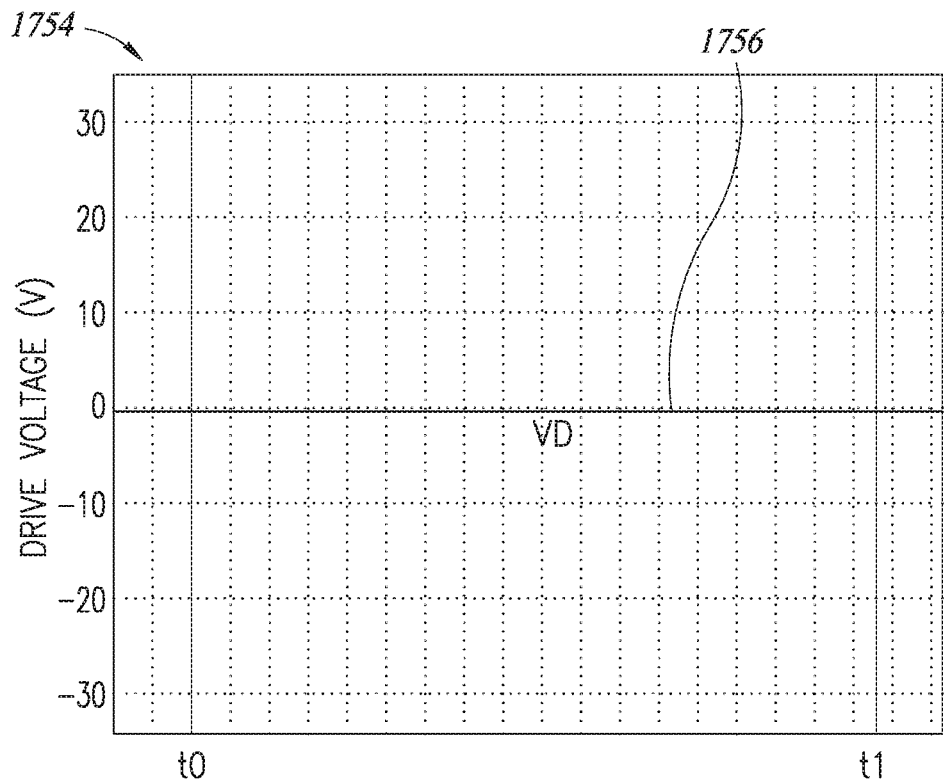
Figures 5, 17C:
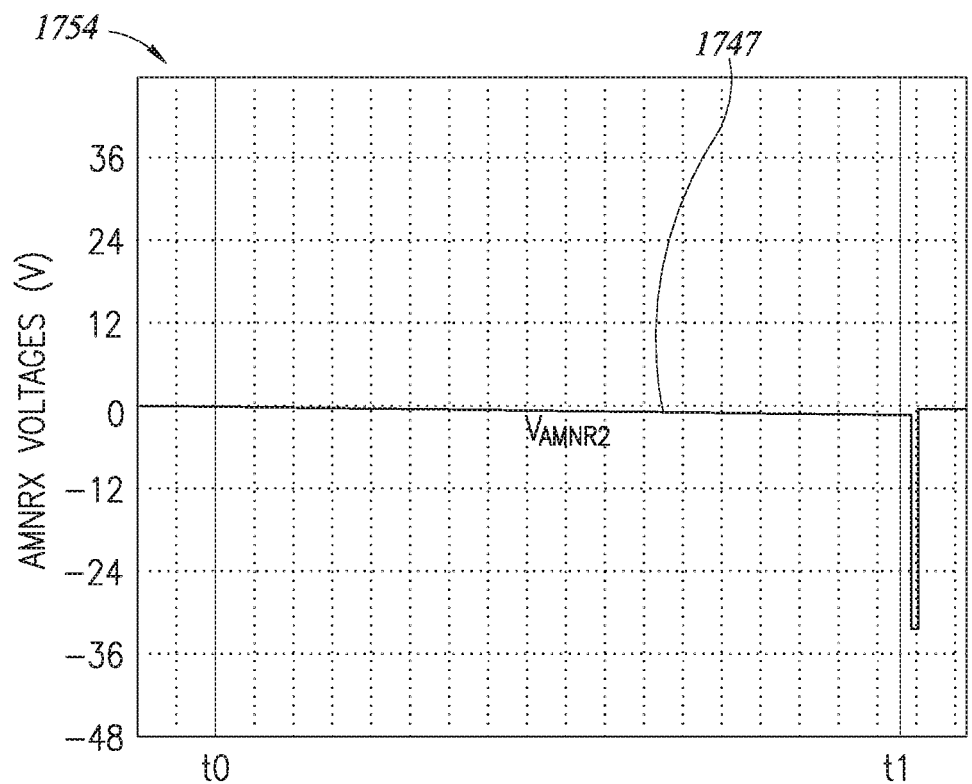
Figures 6, 17C:
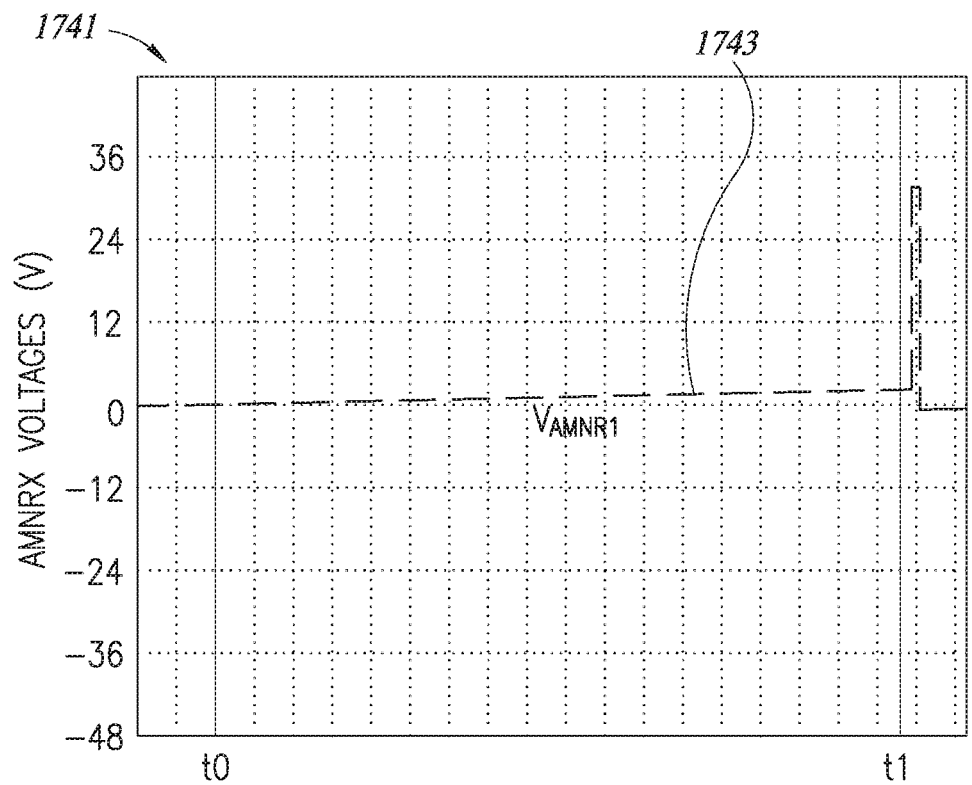
Figures 7, 17C:
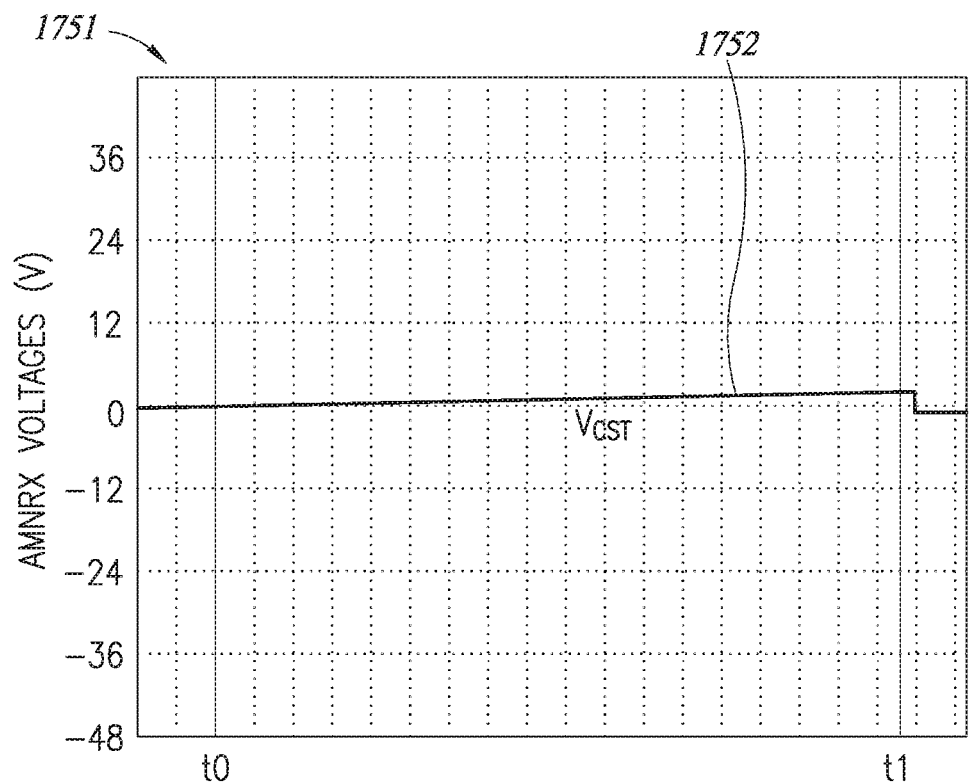
Figures 8, 17C:
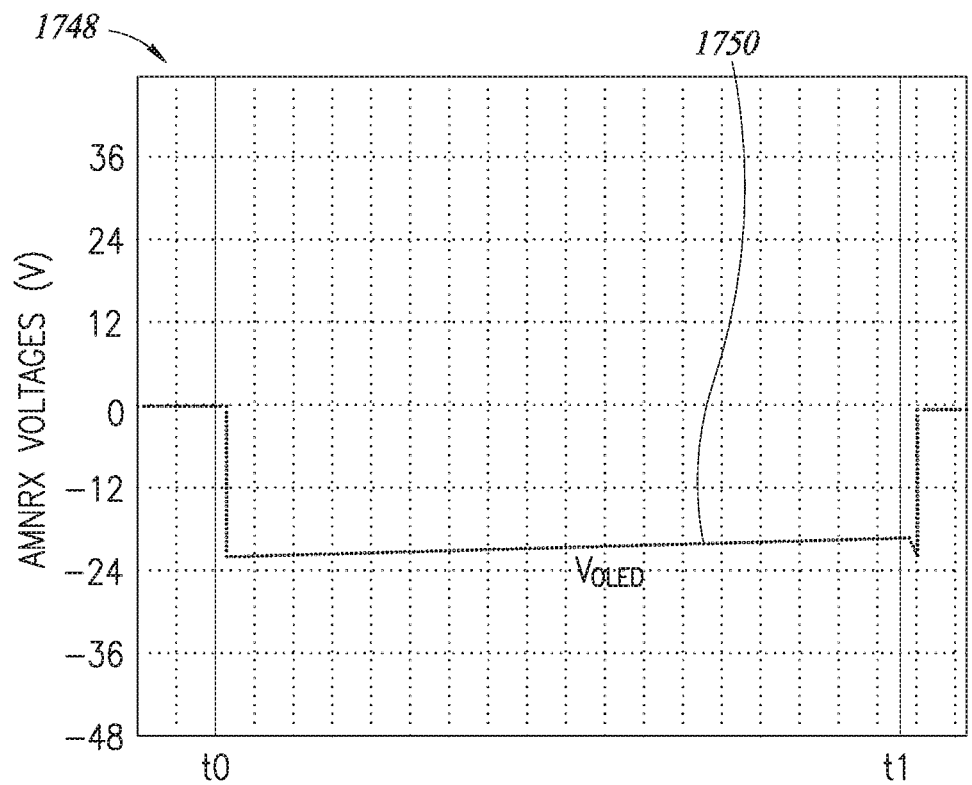

In FIGS. 17C-1-17C-8, there are voltage vs time plots showing the idle time for a programmed pixel. Idle period is marked as 3 and is between the two black vertical lines. The voltage at the common electrode is driven back to 7V during this period to reverse-bias the OLED and inhibit emission. Then the row is deselected while other rows in the same column are programmed to Vdata. It should be noted that Vp (the shared node) is not static at this point due to reverse-bias current from the OLED (ideally the leakage current would be small enough that any drift observed in Vp (the shared node) during the programing time is insignificant).

Figure 18A:
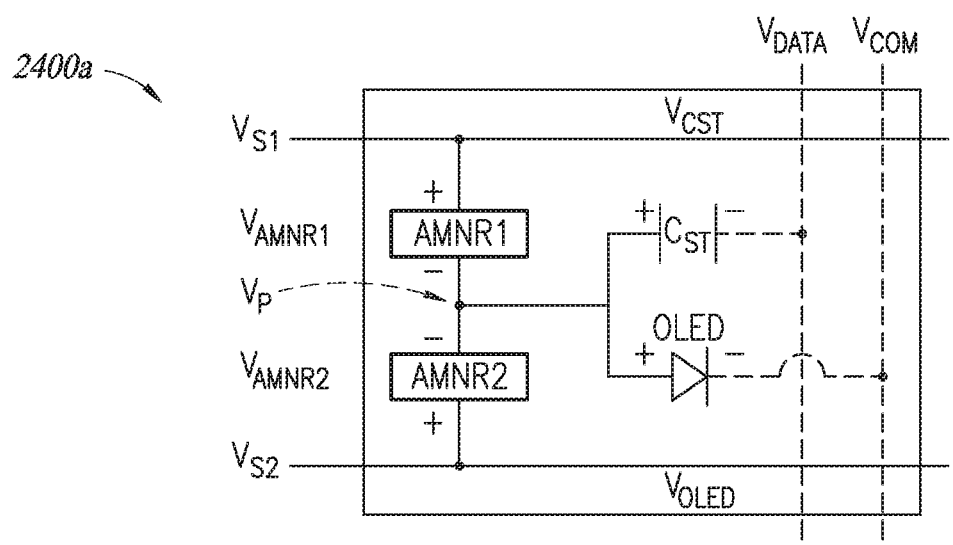
Figures 1, 18B:
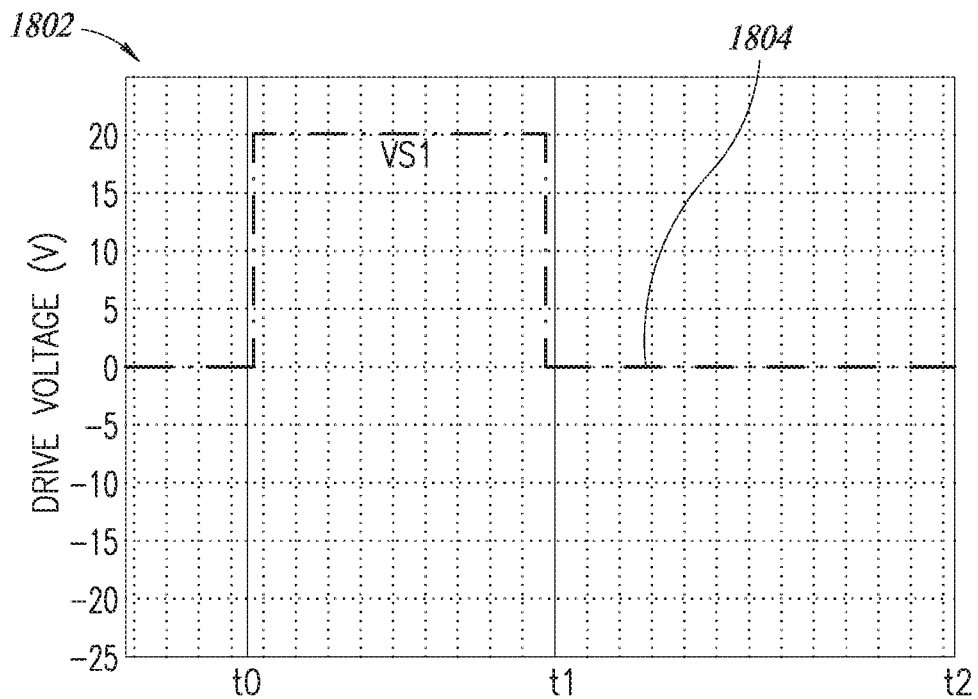
Figures 2, 18B:
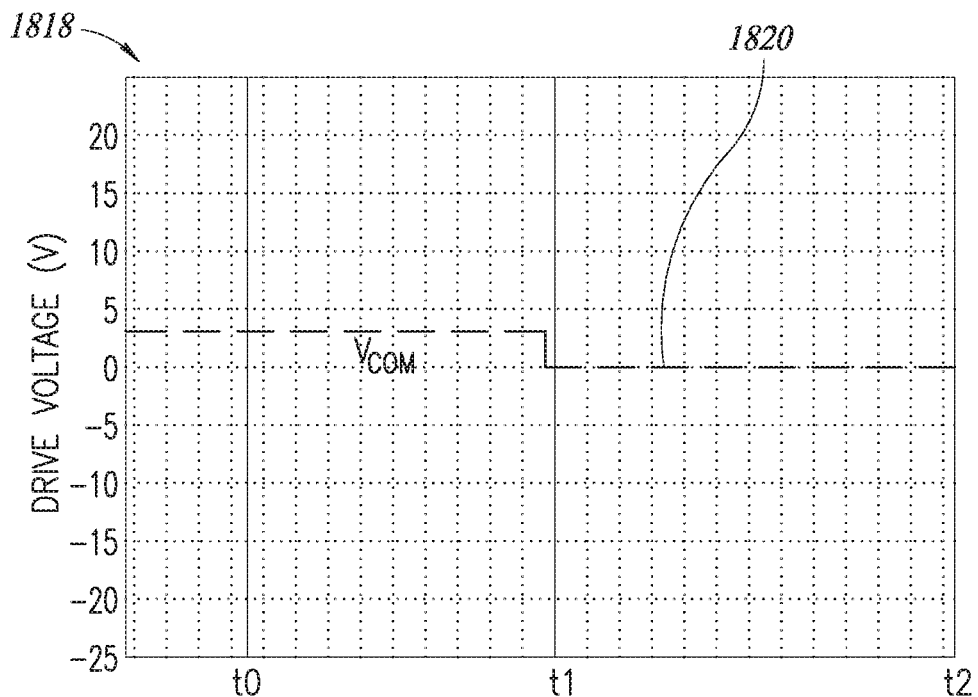
Figures 3, 18B:
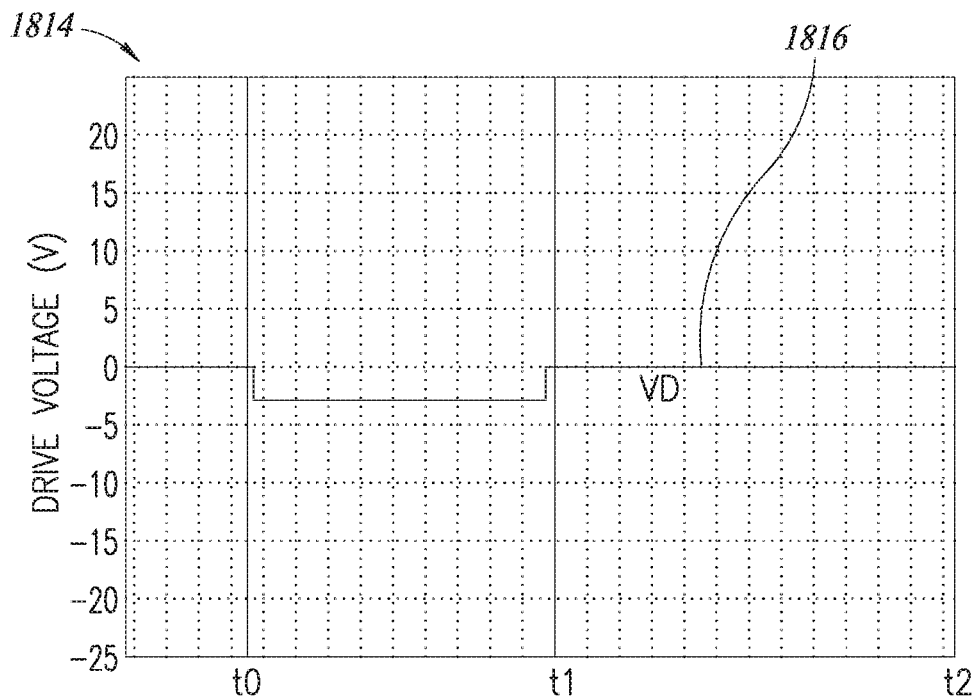
Figures 4, 18B:
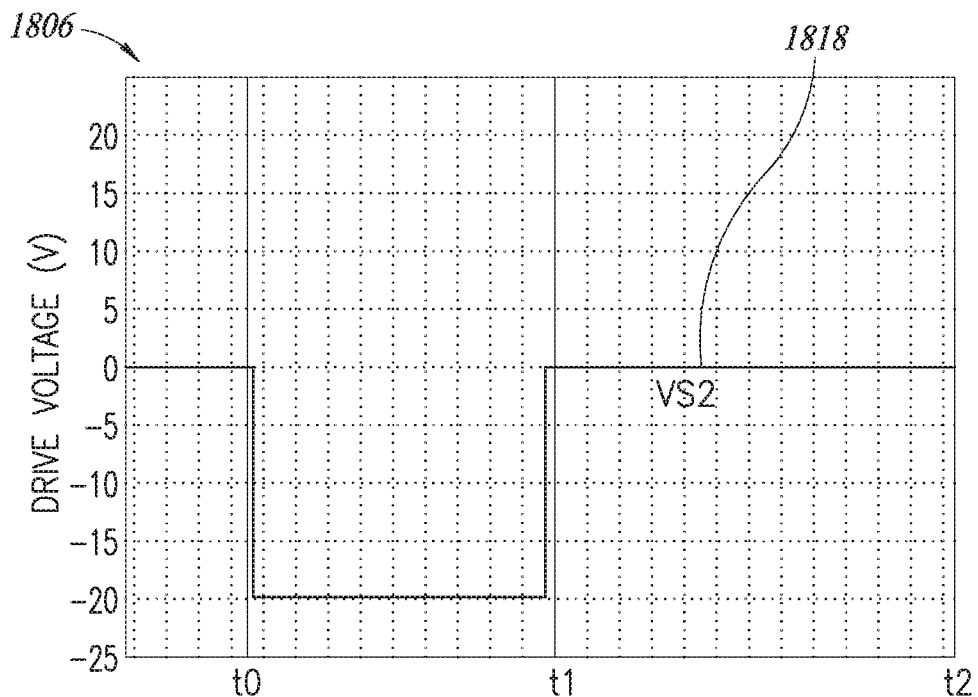
Figures 5, 18B:
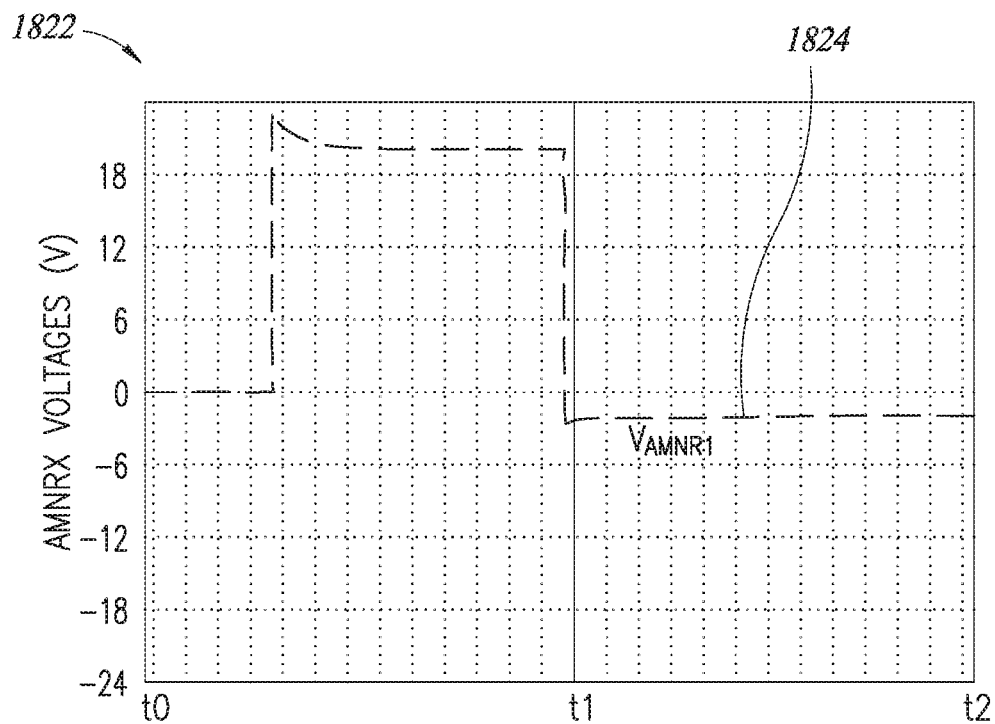
Figures 6, 18B:
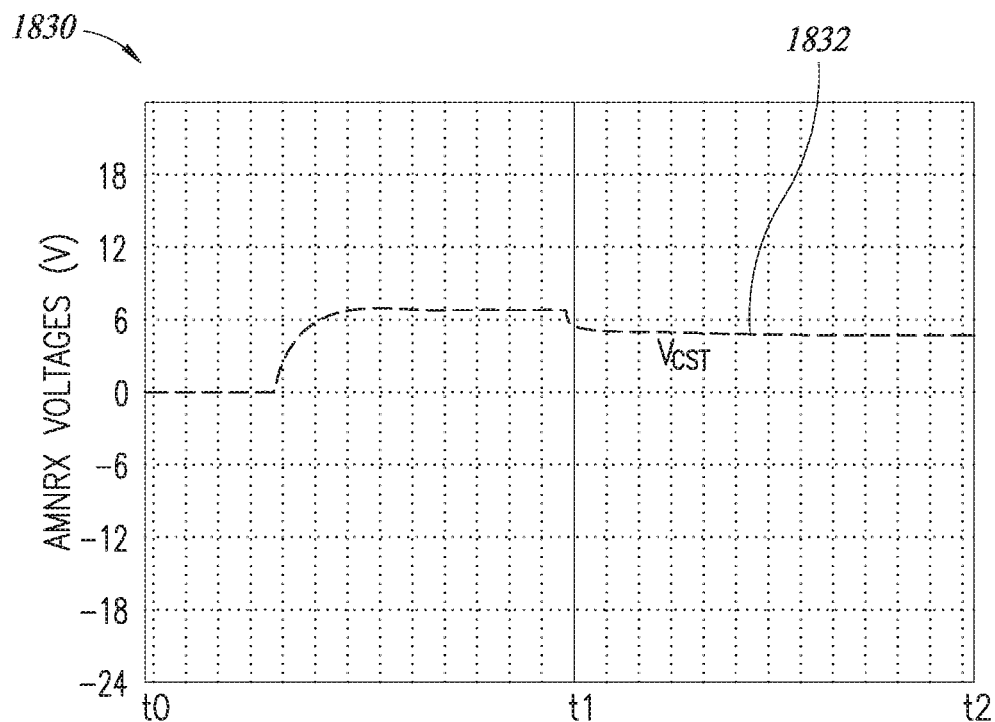
Figures 7, 18B:
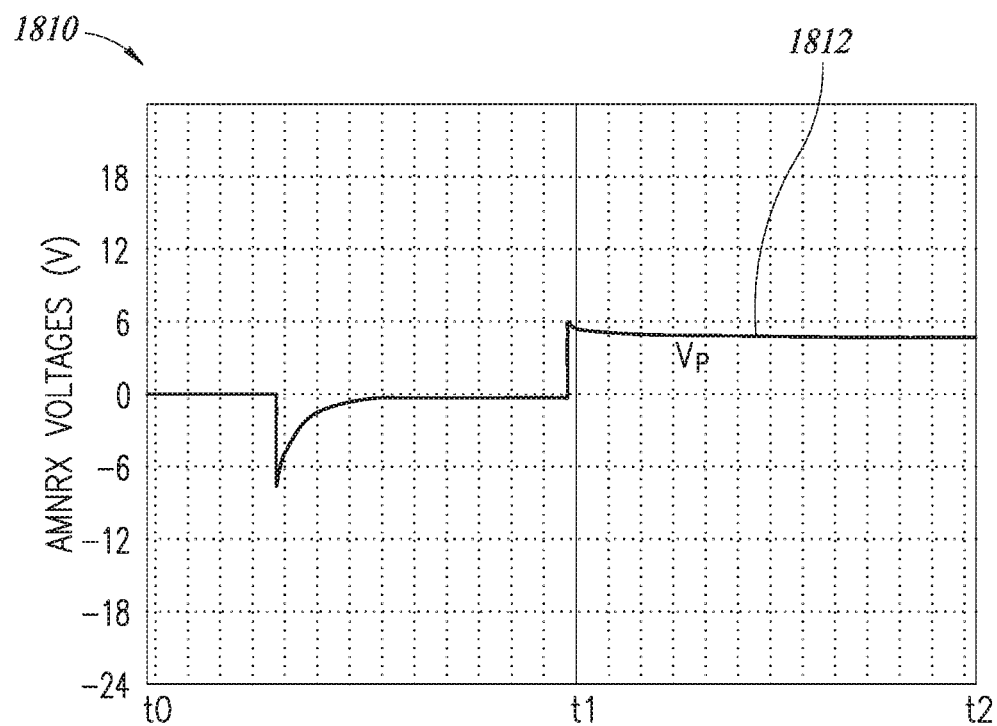
Figures 8, 18B:
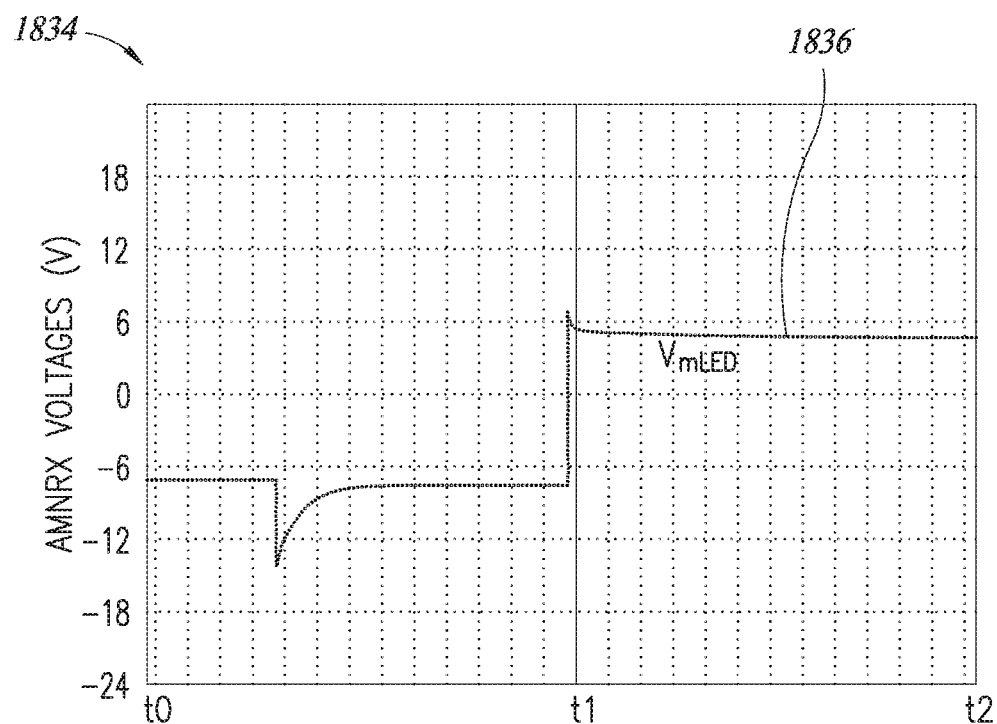
Figures 9, 18B:
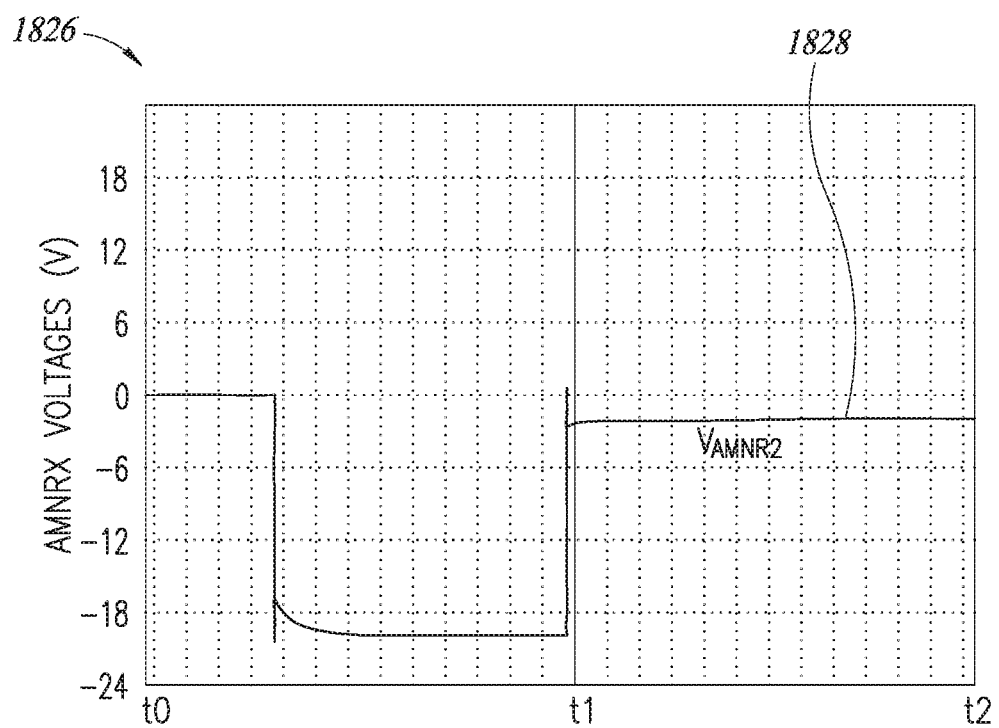

FIGS. 18B-1-18B-9 are directed to a microLED pixel programming and lighting sequence according to another embodiment of the present disclosure. This includes a voltage vs time plot showing the storage capacitor charging and discharging. The programming period is marked as 1 and lighting period is marked as 2. The two regions are separated by the black vertical line. To start, a row is selected and the storage capacitor begins to charge until the voltage across the capacitor reaches a steady state (charging time is at least $4*R_{AMNR}C$ seconds (~1E-6)). During the programming period, charge flows from of select line S1 and branches out to of select line S2 and Vp (the shared node). Because data is at a lower potential, the current should flows both from Vp (the shared node) and the common electrode to data until the storage capacitor is charged. The programming period ends with the select voltages driven back to 0V, then data being driven to 0V. Select line S1 and select line S2 is driven to a voltage above the AMNRX turn-ON threshold voltage. The voltage of select line S1 is of equal value and opposite polarity to that of select line S2. The data line is driven to −3V and the common electrode line is driven to 3V.

During the lighting period, the common electrode is driven to 0V. At this point, the microLED is forward biased with a voltage above the turn-ON threshold voltage. This causes current to flow, discharging the storage capacitor. Emission from the microLED will occur until the forward current drops below the emission threshold. The voltage at the common electrode is driven to reverse-bias the microLED and inhibit emission. Here the row is deselected while all other rows in the same column are programmed to Vdata. It should be noted that Vp (the shared node) is static at this point since the reverse-bias current from the microLED is in the pA range.

FIG. 16A shows a diagram of a circuit 1600 configured for selective illumination of one or more illumination elements according to one or more embodiments. The circuit 1600 includes AMNR devices AMNR 1 and AMNR 2 coupled in series between a first select line or electrode S1 and a second select line or electrode S2. In particular, a first terminal of AMNR 1 is coupled to the first select line S1 and a second terminal of AMNR 2 is coupled to the second select line S2. A second terminal of AMNR 1 and a first terminal of AMNR 2 are commonly coupled to a node P between the AMNR devices. The circuit 1600 also includes a storage capacitor CST and an illumination element CAP coupled in series between a data line or electrode D and a common line or electrode COM. A first terminal of the storage capacitor CST is coupled to the data line D and a second terminal of the illumination element CAP is coupled to the common line COM. A second terminal of the storage capacitor CST and a first terminal of the illumination element CAP are commonly coupled to the node P.

The illumination element CAP is a capacitive pixel element having a defined capacitance value that dominates the electrical characteristics of the illumination element CAP. The illumination element CAP may be, for example, a liquid crystal display (LCD) pixel that emits light as a result of a voltage being applied across terminals thereof. In some embodiments, the capacitance value of the storage capacitor CST is greater than the capacitance value of the illumination element CAP. The capacitance value the storage capacitor CST may be one or more orders of magnitude larger than the illumination element CAP.

Illumination of the illumination element CAP in the circuit 1600 is selectively controlled via application of signals to the first select line S1, the second select line S2, the data line D, and the common line COM. Control of the illumination element CAP in the circuit 1600 is different than control of the pixel elements of the pixel array 1300 described with respect to FIGS. 13 and 14 herein. In the pixel array 1300, illumination characteristics of the pixel element EP were controlled by applying signals on the select lines S1 and S2 having a different absolute voltage value. For example, a large positive voltage may be stored on the pixel element EP in the pixel array 1300 by applying a first signal on the select line S1 having a larger absolute value than a second signal applied on the select line S2. By contrast, illumination of the illumination element CAP may be controlled by applying signals having substantially similar absolute voltage values. Illumination characteristics of the illumination element CAP, such as brightness, may be controlled in the circuit 1600 based on voltage differences between a data signal on the data line D and a common line signal on the common line COM.

FIG. 16B shows graphical representations of signals at various nodes in the circuit 1600 during a time period in which the circuit 1600 is controlled to selectively cause the illumination element CAP to emit light. The time period shown includes a first time period between a time t0 and a time t1 in which a controller may control signals applied to an array of pixels to select and charge a subarray of the array of pixels, such as a group of pixels of a display arranged in a row or a column. The time period shown also includes a second time period between the time t1 and a time t2 in which the subarray of pixels is controlled to emit light. The first time period and the second time period respectively correspond to the addressing periods and the lighting/writing periods discussed with respect to FIG. 12 and elsewhere herein.

Referring to FIG. 16B, a first representation 1602 shows a first select signal 1604 applied to the first select line S1, a second representation 1606 shows a second select signal 1608 applied to the second select line S2, a third representation 1610 shows a voltage level 1612 at the node P, a fourth representation 1614 shows a data signal 1616 applied to the data line D, and a fifth representation 1618 shows a common signal 1620 applied to the common line COM. During the first time period, the first select signal 1604 applied to the first select line S1 has a positive voltage level and the second select signal 1608 applied to the second select line S2 has a negative voltage level. The first select signal 1604 and the second select signal 1608 may be direct current signals having substantially constant values. Moreover, the absolute values the first select signal 1604 and the second select signal 1608 are the same or substantially identical during the first period. For example, the first select signal 1604 has a voltage level of +30 VDC during the first time period, and the second select signal 1608 has a voltage level of −30 VDC during the first time period.

The average of the voltage level 1612 at the node P during the first time period is halfway between the voltage levels of the first and second select signal 1604 and 1608—specifically, the voltage level 1612 is maintained to be 0 VDC during the first time period between the time t0 and the time t1. As shown in the fifth representation 1618, the common signal 1620 also has a voltage level of 0 VDC during the first time period. As a result, the voltage difference $V_{CAP}$ between terminals of the illumination element CAP during the first time period is 0 V and the illumination element CAP does not emit light during the first time period.

The data signal 1616 has a DC voltage level different than the common signal 1620 during the first time period. The voltage level of the data signal 1616 may be less than the absolute values of the first select signal 1604 and the second select signal 1608. Specifically, the voltage level of the data signal 1616 is less than a voltage sufficient to cause conduction by the AMNR devices AMNR 1 and AMNR 2. For example, the data signal 1616 has a voltage level of +15 VDC in the fourth representation 1614, which is less than a conduction threshold of the AMNR devices. However, the voltage of the data signal 1616 may be selected to achieve a desired illumination characteristic of the illumination element CAP. Larger voltage levels for the data signal 1616 during the first time period may, for instance, cause the illumination element CAP to emit light having higher brightness or emit light for a longer period of time whereas smaller voltage levels for the data signal 1616 may cause the illumination element CAP to emit light having lower brightness or emit light for a shorter period of time. Furthermore, the data signal 1616 may be selected based on the illumination characteristics of the illumination element CAP.

The voltage difference $V_{CST}$ between terminals of the storage capacitor CST during the first time period corresponds to the voltage level of the data signal 1616, causing the storage capacitor CST to accumulate electrical energy. For example, the storage capacitor CST may not have any energy stored at the time t0 and may store energy over the first time period to reach a certain voltage level, such as the voltage level of the data signal 1616.

At the time t1, the circuit 1600 is transitioned to the lighting/writing period. In particular, the voltage level of the first select signal 1604, the voltage level of the second select signal 1608, the and the voltage level of the data signal 1616 transition to 0 VDC. Because the voltage level of the data signal 1616 is lower than a conduction threshold of the AMNR devices, the AMNR devices do not conduct current during the second time period. As a result, the energy stored in the storage capacitor CST discharges through the illumination element CAP and to the common line COM, thereby causing the illumination element CAP to emit light during the second time period.

A plurality of pixel elements each configured as shown in the circuit 1600 may be arranged as a grid or array. During the time period described with respect to FIG. 16B, a subset of pixel elements of the plurality of pixel elements may be controlled to selectively cause illumination elements CAP thereof to emit light while the remaining pixel elements are controlled to prevent emission of light by the illumination elements CAP thereof. For example, a controller (not shown) may cause the first select signal 1604 and the second select signal 1608 to be respectively applied to the first select line(s) S1 and the second select line(s) S2 of the subset of pixel elements selected for illumination. The controller may also cause a signal of 0 VDC to be applied to the first select line(s) S1 and the second select line(s) S2 of the remaining pixel elements. The selected subset of pixel elements operate as described with respect to FIG. 16B to emit light whereas the remaining pixel elements do not emit light even though the remaining pixel elements may receive the same data signal as the selected subset. In the remaining pixel elements, the AMNR devices AMNR 1 and AMNR 2 are not in a conduction mode when the voltage level of the signals applied to the first select line(s) S1 and the second select line(s) S2 is lower than the conduction threshold. Therefore, in the remaining pixel elements, the voltage level of the node P is not controlled during the first time period (between the time t0 and the time t1), the storage capacitor CST does not charge, and the illumination element CAP does not emit light.

FIG. 17A shows a diagram of a circuit 1700 configured for selective illumination of one or more illumination elements according to one or more embodiments. The circuit 1700 is similar to the circuit 1600, but includes an organic light-emitting diode (OLED) instead of the illumination element CAP. The OLED has an anode coupled to the node P and a cathode coupled to the common line COM. The circuit 1700 is otherwise substantially identical to the circuit 1600, so further description thereof is omitted for brevity.

FIG. 17B shows a graphical representations of signals at various nodes in the circuit 1700 during a time period in which the circuit 1700 is controlled to selectively cause the OLED to emit light. As described with respect to FIG. 16B, the time period shown includes a first time period between a time t0 and a time t1 in which a certain set of pixels are selected and charged, and includes a second time period between the time t1 and a time t2 in which the set of pixels are controlled to emit light. A first representation 1702 shows a first select signal 1704 applied to the first select line S1, a second representation 1706 shows a second select signal 1708 applied to the second select line S2, a third representation 1710 shows a voltage level 1712 at the node P, a fourth representation 1714 shows a data signal 1716 applied to the data line D, and a fifth representation 1718 shows a common signal 1720 applied to the common line COM.

FIG. 17B also includes a sixth representation 1722 showing a voltage 1724 between a first terminal of the AMNR 1 coupled to the first select line S1 and a second terminal of the AMNR 1 coupled to the node P. A seventh representation 1726 shows a voltage 1728 between a first terminal of the AMNR 2 coupled to the node P and a second terminal of the AMNR 2 coupled to the second select line S2. An eighth representation 1730 shows a voltage 1732 between a first terminal of the storage capacitor CST coupled to the data line D and a second terminal of the storage capacitor CST coupled to the node P. A ninth representation 1734 shows a voltage 1736 between an anode of the OLED coupled to the node P and a cathode of the OLED coupled to the common line COM. As described with respect to the representations 1602 and 1606 of FIG. 16B, the first select signal 1704 applied to the first select line S1 has a positive voltage level and the second select signal 1708 applied to the second select line S2 has a negative voltage level.

The voltage level 1712 of the node P is ideally close to 0V, as described with respect to the circuit 1600; however, due to operational characteristics of the OLED, the voltage level 1712 and the voltages 1724 and 1728 respectively of the AMNR 1 and the AMNR 2 may fluctuate during the first time period. In response to application of the first select signal 1702 and the second select signal 1706, the AMNR 1 and the AMNR 2 begin operating in a conduction mode in which current flows from the first select line S1 and to the node P, and in which current flows from the node P to the second select line S2. As shown in the third representation 1710, the voltage 1712 at the node P changes rapidly when the AMNR 1 and the AMNR 2 begin conducting, and then gradually reaches a value closer to 0V as the storage capacitor CST charges during the first time period. The voltage level of the storage capacitor CST may reach a steady state value given a sufficient period of time to charge.

In connection with application of the first select signal 1704 and 1708, the data signal 1716 is applied to the data line D and the common signal 1720 is applied to the common line COM. The data signal 1716 and the common signal 1720 are direct current signals having substantially constant values during the first time period. In some embodiments, the data signal 1716 may have an opposite polarity than the common signal 1720. For example, the data signal 1716 has a negative voltage level (e.g., −9 VDC) and the common signal 1720 has a positive voltage level (e.g., +7 VDC).

As a result of the voltage difference between the data signal 1716 and the common signal 1720, the voltage 1736 of the OLED is negative and the OLED is reverse-biased during the first time period as shown in the representation 1734. Thus, during the first time period, the OLED does not forwardly conduct current and does not emit light. The voltage 1712 at the node P exhibits an initial change in magnitude after the select signals 1704 and 1708 are applied, and the voltage 1712 returns to a value closer to 0 VDC over the first time period. The relatively low voltage 1712 at the node P facilitates the storage capacitor CST to store energy during the first time period and accumulate the voltage 1732. Specifically, the voltage 1732 of the storage capacitor CST increases from a low voltage level (e.g., at or near 0 VDC) to a higher voltage level, which may approach a magnitude close to the data signal 1716 given sufficient time. The time that it takes for the storage capacitor CST to reach a desired value depends, at least in part, on a resistance of the AMNR devices and the capacitance of the storage capacitor CST.

At or near the time t1, the first select signal 1704, the second select signal 1708, the data signal 1716, and the common signal 1720 are controlled to transition to 0 VDC. This causes the voltages 1724 and 1728 respectively of AMNR 1 and AMNR 2 to drop below the conduction threshold and discontinue conducting current during the second time period after the time t1. The storage capacitor CST discharges its stored energy through the OLED which becomes forward-biased and emits light during the second time period until the forward current drops below the light emission threshold of the OLED. The current flowing through the OLED may drop to a small percentage of the initial current value over a certain period of time. The discharge time period of the storage capacitor CST may be determined based on the resistance of the OLED and the capacitance of the storage capacitor.

A plurality of pixel elements each configured as shown in the circuit 1700 may be arranged as a grid or array and provided as part of a display device. A controller may control application of signals to a selected subset of pixel elements of the plurality of pixel elements as described with respect to FIG. 17B to emit light. The controller may also control application of signals to remaining pixel elements of the plurality of pixel elements to not emit light. FIG. 17C shows graphical representations of signals applied to one or more pixel elements having the structure of the circuit 1700 during the time period of FIG. 17B, the one or more pixel elements being selected to not emit light during the time period.

A first representation 1738 of FIG. 17C shows the common signal 1720 applied to the remaining pixels that are inhibited or prevented from emitting light during the time period, the common signal 1720 also being applied to the selected subset of pixel elements described with respect to FIG. 17B. The common signal 1720 has a positive voltage level (e.g., +7 VDC) during the first time period. The data signal 1716 applied to the remaining pixels has a lower voltage level than the common signal 1720. For instance, the data signal 1716 applied may be 0 VDC, +5 VDC, or a negative voltage level, by way of non-limiting example. However, the data signal 1718 should be selected to prevent reverse breakdown of the OLED.

A second representation 1740 shows a select signal 1742 applied to the first select line S1 and a third representation 1744 shows a select signal 1746 applied to the second select line S2. As shown, the select signal 1742 and the select signal 1746 have a voltage level during the first time period at or near 0 VDC. A fourth representation 1741 shows a voltage 1743 across terminals of AMNR 1 and a fifth representation 1745 shows a voltage 1747 across terminals of AMNR 2. The voltages 1745 and 1747 are insufficient to cause the AMNR devices 1 and 2 to operate in a conduction mode during the first time period. A sixth representation 1748 shows a voltage 1750 between the anode and the cathode of the OLED, and a seventh representation 1751 shows a voltage 1752 between a first terminal of the storage capacitor CST coupled to the data line D and a second terminal of the storage capacitor CST coupled to the node P. An eighth representation 1754 shows a data signal 1756 applied to the data line D, which has a voltage level of approximately 0 VDC. The voltage 1752 across the storage capacitor CST is similar to the voltage at the node P; however, this relationship may change if a different voltage level for the data signal 1756 is selected. The voltage 1752 during the first time period is at or close to 0 VDC at the time t0 and increases slightly over the first time period due to, e.g., leakage current through the OLED. As a result of the positive voltage level of the common signal 1720 relative to the voltage 1752 at the node P, the OLED of the remaining pixels are reverse-biased during the first time period. During the second time period after the time t1, the energy stored in the storage capacitor CST is insufficient to cause the OLED to be forward-biased and emit light.

FIG. 18A shows a diagram of a circuit 1800 configured for selective illumination of one or more illumination elements according to one or more embodiments. The circuit 1800 is similar to the circuits 1600 and 1700, but includes a microLED instead of the illumination element CAP or the OLED. The microLED has an anode coupled to the node P and a cathode coupled to the common line COM. The circuit 1800 is otherwise substantially identical to the circuits 1600 and 1700, so further description thereof is omitted for brevity.

FIG. 18B shows graphical representations of signals and electrical characteristics at various nodes in the circuit 1800 during a time period in which the circuit 1800 is controlled to selectively cause the microLED to emit light. As described herein, the time period shown in FIG. 18B includes a first time period between a time t0 and a time t1, the first time period in which a certain set of pixels are selected and charged. The time period shown also includes a second time period between the time t1 and a time t2, the second time period in which the set of pixels are controlled to emit light. A first representation 1802 shows a first select signal 1804 applied to the first select line S1, a second representation 1806 shows a second select signal 1808 applied to the second select line S2, a third representation 1810 shows a voltage level 1812 at the node P, a fourth representation 1814 shows a data signal 1816 applied to the data line D, and a fifth representation 1818 shows a common signal 1820 applied to the common line COM.

FIG. 18B also includes a sixth representation 1822 showing a voltage 1824 between a first terminal of the AMNR 1 coupled to the first select line S1 and a second terminal of the AMNR 1 coupled to the node P. A seventh representation 1826 shows a voltage 1828 between a first terminal of the AMNR 2 coupled to the node P and a second terminal of the AMNR 2 coupled to the second select line S2. An eighth representation 1830 shows a voltage 1832 between a first terminal of the storage capacitor CST coupled to the data line D and a second terminal of the storage capacitor CST coupled to the node P. A ninth representation 1834 shows a voltage 1836 between an anode of the microLED coupled to the node P and a cathode of the microLED coupled to the common line COM. As described with respect to the representations of FIGS. 16B and 17B, the first select signal 1804 applied to the first select line S1 has a positive voltage level and the second select signal 1808 applied to the second select line S2 has a negative voltage level.

Control of the circuit 1800 during the time period shown is similar to control of the circuit 1800. During the first time period, the voltage level 1812 of the node P is controlled to be close to 0V, as described with respect to the circuit 1700. Due to operational characteristics of the microLED, the voltage level 1812 and the voltages 1824 and 1828 respectively of the AMNR 1 and the AMNR 2 may fluctuate during the first time period. In response to application of the first select signal 1802 and the second select signal 1806, the AMNR 1 and the AMNR 2 begin operating in a conduction mode in which current flows from the first select line S1 and to the node P, and in which current flows from the node P to the second select line S2. As shown in the third representation 1810, the voltage 1812 at the node P changes when the AMNR 1 and the AMNR 2 begin conducting, and then gradually reaches a value closer to 0V as the storage capacitor CST charges during the first time period. In the circuit 1800, current may flow through the storage capacitor CST to the data line D from the node P. A small amount of current may flow to the data line D from the common line COM and through the storage capacitor CST. The voltage level of the storage capacitor CST may reach a steady state value given a sufficient period of time to charge.

Similar to the control of the circuit 1700, the data signal 1816 is applied to the data line D and the common signal 1820 is applied to the common line COM in connection with application of the first select signal 1804 and 1808. The data signal 1816 and the common signal 1820 are direct current signals having substantially constant values during the first time period. In some embodiments, the data signal 1816 may have an opposite polarity than the common signal 1820. For example, the data signal 1816 has a negative voltage level (e.g., −3 VDC) and the common signal 1820 has a positive voltage level (e.g., +3 VDC). As a result of the voltage difference between the data signal 1816 and the common signal 1820, the voltage 1836 across the microLED is negative during the first time period, as shown in the representation 1834. Thus, during the first time period, the microLED is reverse-biased and does not emit light.

The voltage 1812 at the node P exhibits an initial increase in magnitude after the select signals 1804 and 1808 are applied, and the voltage 1812 returns to a value closer to 0 VDC over the first time period. The level of the voltage 1812 is smaller (closer to 0V) than the level of the voltage 1712 described with respect to FIG. 17B during the first time period. The relatively low level of the voltage 1812 at the node P facilitates the storage capacitor CST to store energy during the first time period and accumulate the voltage 1832. Specifically, the voltage 1832 of the storage capacitor CST increases from a low voltage level (e.g., at or near 0 VDC) to a higher voltage level, which may approach a magnitude close to the common signal 1820 given sufficient time. The time that it takes for the storage capacitor CST to reach a desired value depends, at least in part, on a resistance of the AMNR devices and the capacitance of the storage capacitor CST.

At or near the time t1, the first select signal 1804, the second select signal 1808, the data signal 1816, and the common signal 1820 are controlled to transition to 0 VDC. This causes the voltages 1824 and 1828 respectively of AMNR 1 and AMNR 2 to drop below the conduction threshold and discontinue conducting current during the second time period after the time t1. The storage capacitor CST discharges its stored energy through the microLED which becomes forward-biased and emits light during the second time period until the forward current drops below the light emission threshold of the microLED. The current flowing through the microLED may drop to a small percentage of the initial current value over a certain period of time. The discharge time period of the storage capacitor CST may be determined based on the resistance of the microLED and the capacitance of the storage capacitor.

Figures 1, 18C:
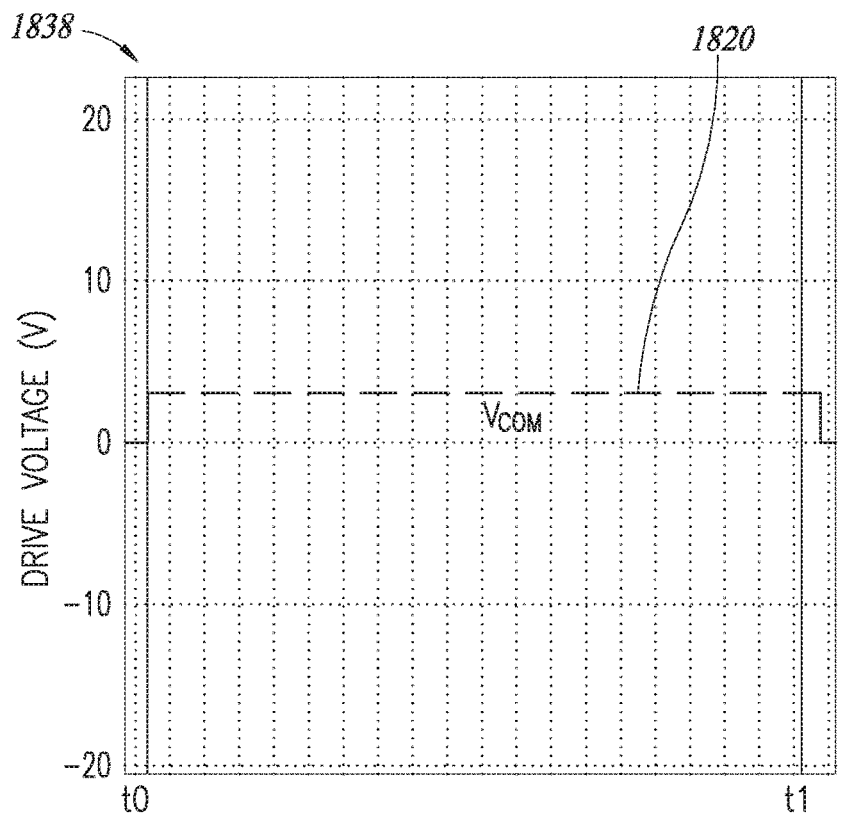
Figures 2, 18C:
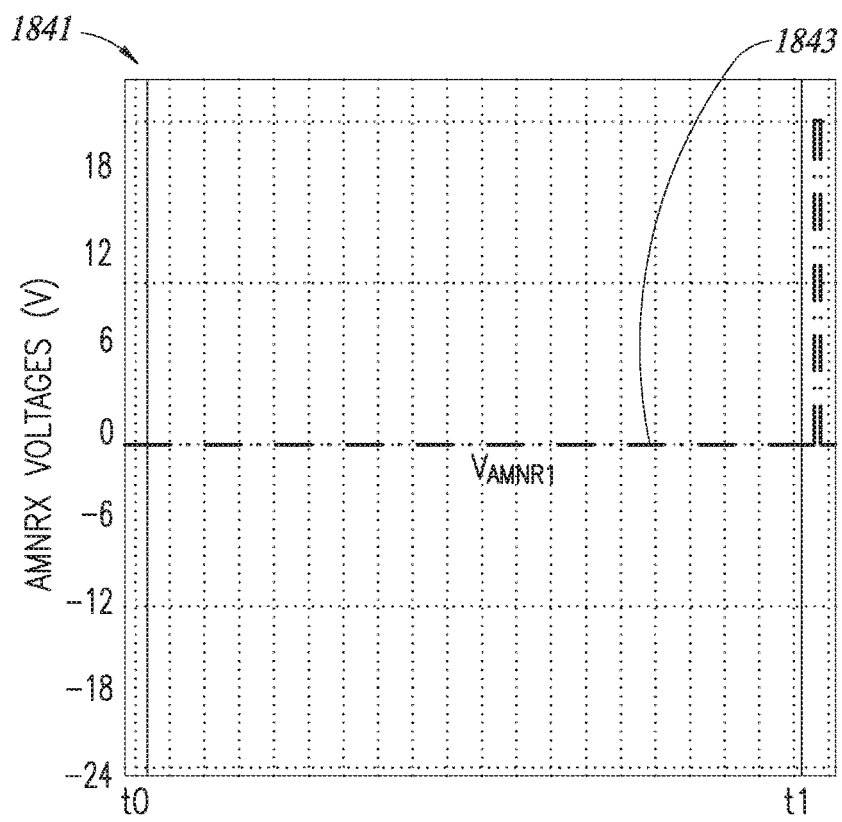
Figures 3, 18C:
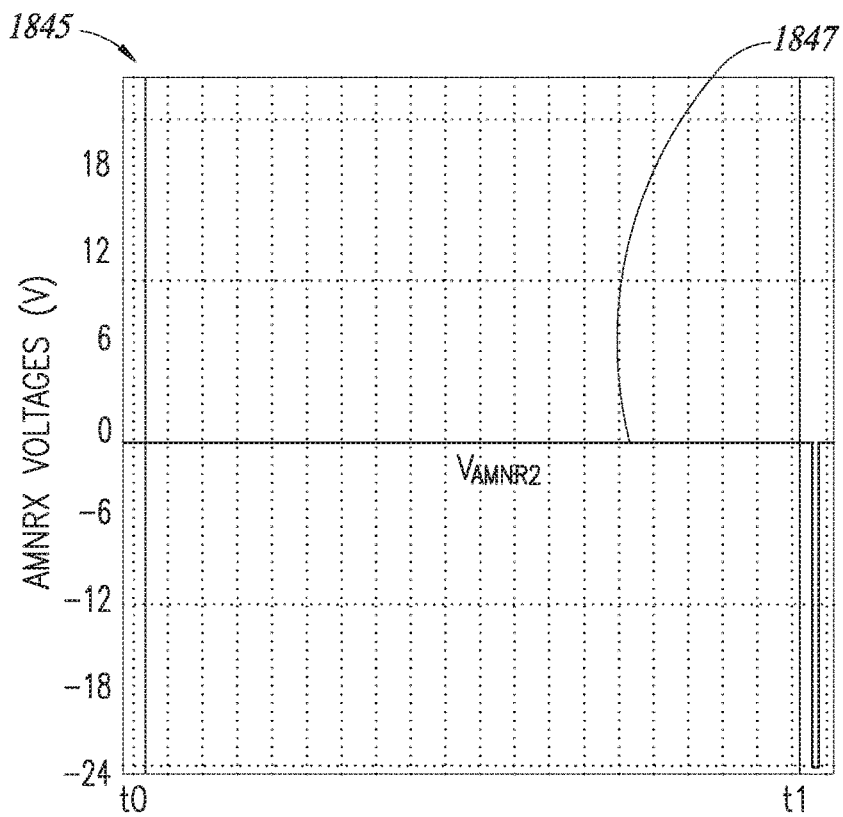
Figures 4, 18C:
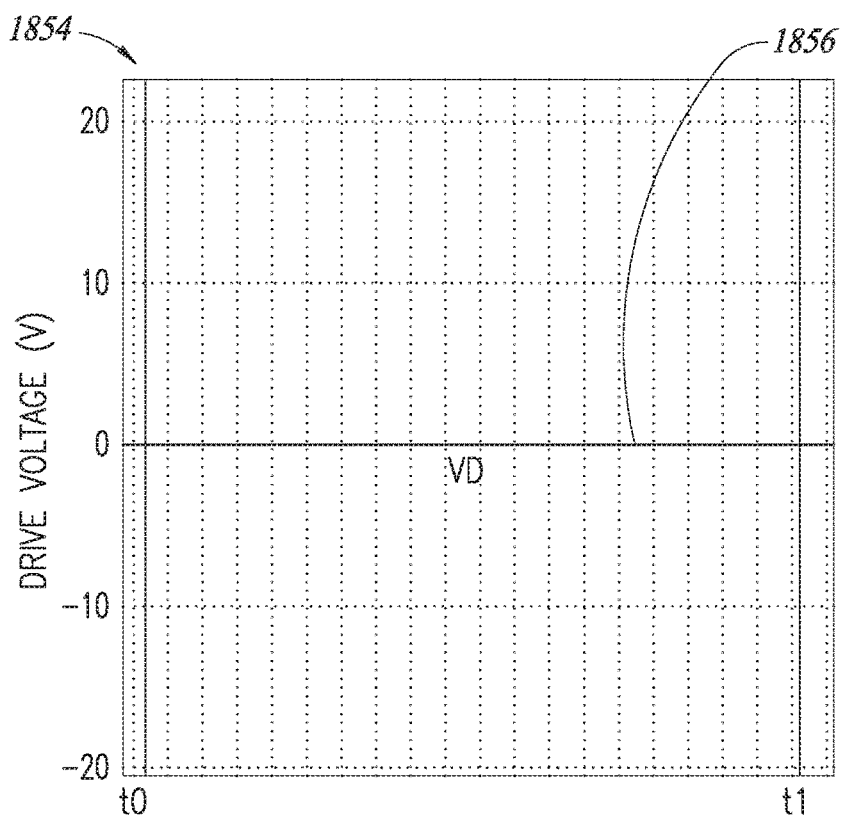
Figures 5, 18C:
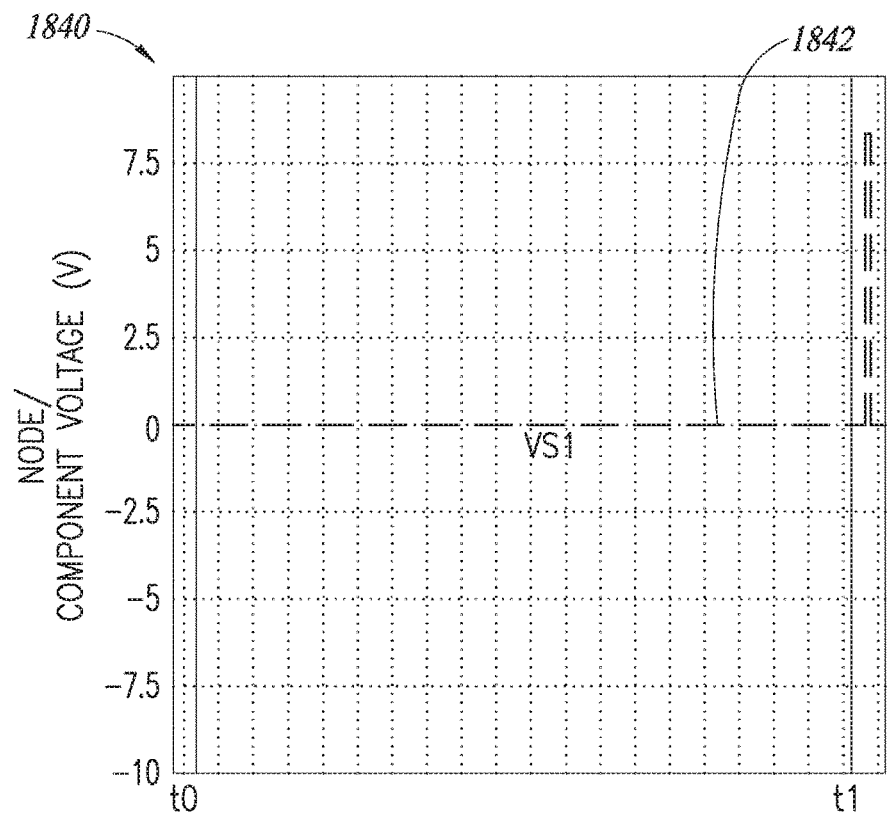
Figures 6, 18C:
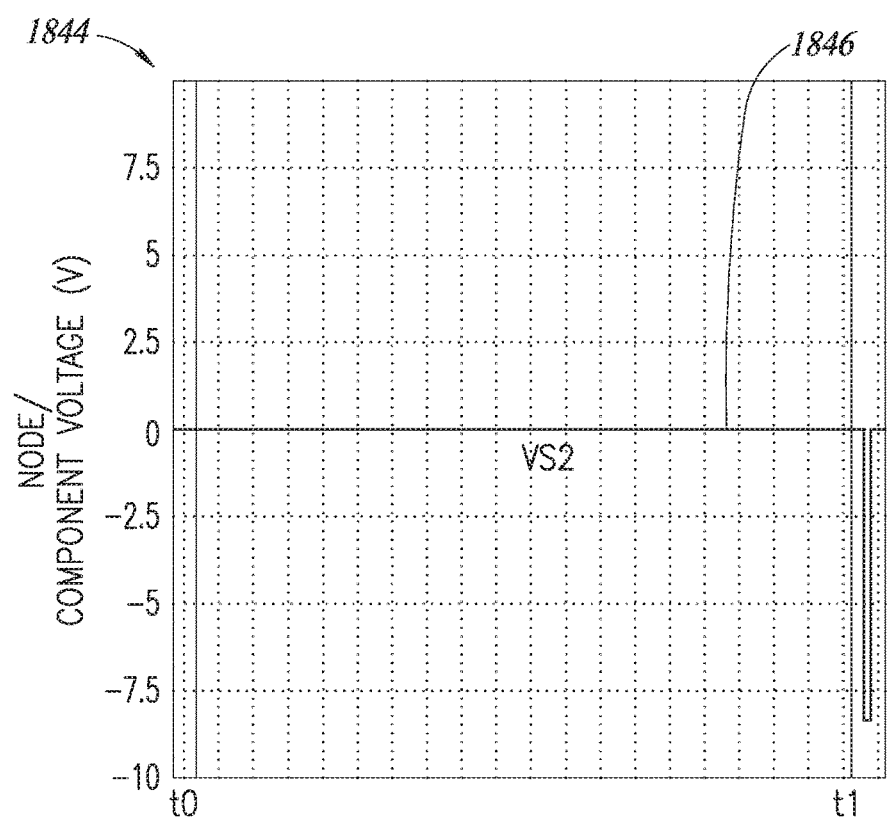
Figures 7, 18C:
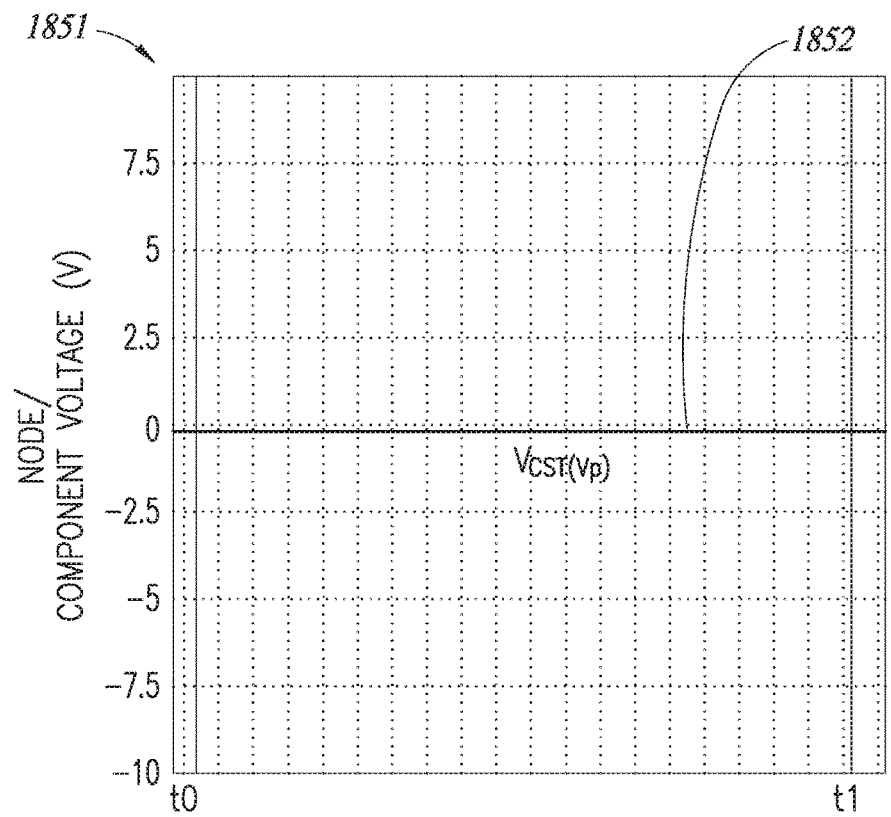
Figures 8, 18C:
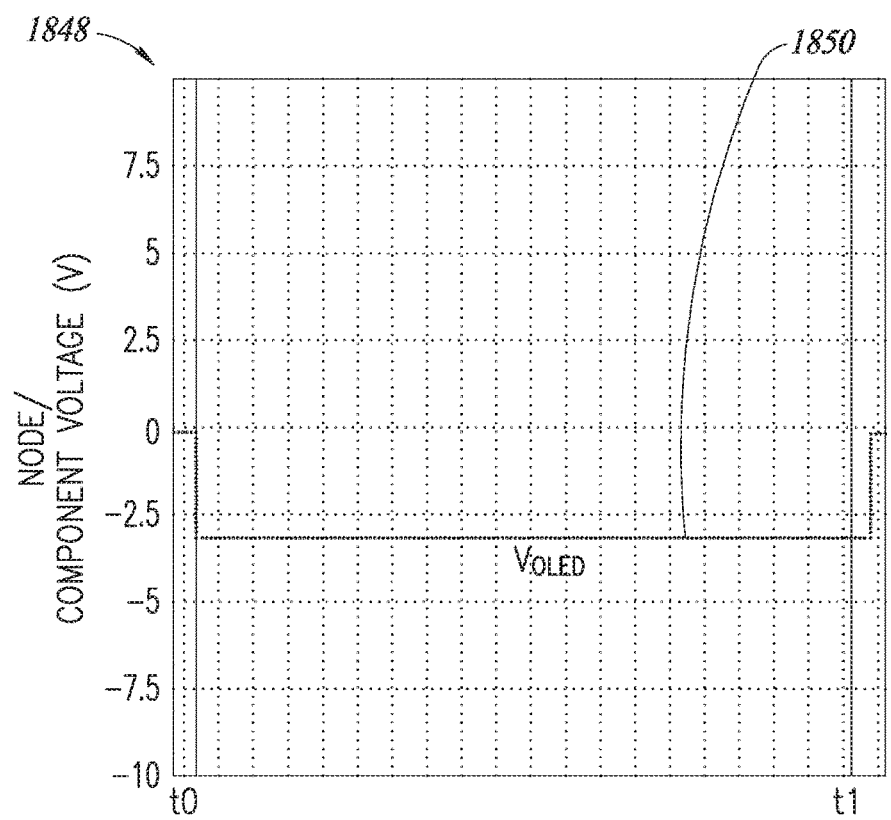

As described with respect to FIG. 17C and elsewhere herein, a plurality of pixel elements each configured as shown in the circuit 1800 may be arranged as a grid or array and provided as part of a display device. A controller may control application of signals to a selected subset of pixel elements of the plurality of pixel elements as described with respect to FIG. 18B to emit light. The controller may also control application of signals to remaining pixel elements of the plurality of pixel elements to not emit light. FIG. 18C shows graphical representations of signals and electrical characteristics at various nodes and applied to one or more pixel elements in the circuit 1800 during the time period of FIG. 18B, the one or more pixel elements being selected to not emit light during the time period.

A first representation 1838 of FIG. 18C shows the common signal 1820 applied to the remaining pixels that are inhibited or prevented from emitting light during the time period, the common signal 1820 also being applied to the selected subset of pixel elements described with respect to FIG. 18B. The common signal 1820 has a positive voltage level (e.g., +3 VDC) during the first time period. The data signal 1816 applied to the remaining pixels has a lower voltage level than the common signal 1820. For instance, the data signal 1816 applied may be −3 VDC, by way of non-limiting example. However, the data signal 1816 should be selected to prevent reverse breakdown of the microLED.

A second representation 1840 shows a select signal 1842 applied to the first select line S1 and a third representation 1844 shows a select signal 1846 applied to the second select line S2. As shown, the select signal 1842 and the select signal 1846 have a voltage level during the first time period at or near 0 VDC. A fourth representation 1841 shows a voltage 1843 across terminals of AMNR 1 and a fifth representation 1845 shows a voltage 1847 across terminals of AMNR 2. The voltages 1845 and 1847 are insufficient to cause the AMNR devices 1 and 2 to operate in a conduction mode during the first time period.

A sixth representation 1848 shows a voltage 1850 between the anode and the cathode of the microLED, and a seventh representation 1851 shows a voltage 1852 between a first terminal of the storage capacitor CST coupled to the data line D and a second terminal of the storage capacitor CST coupled to the node P. An eighth representation 1854 shows a data signal 1856 applied to the data line D, which has a voltage level of approximately 0 VDC. The voltage 1852 across the storage capacitor CST is similar to the voltage at the node P; however, this relationship may change if a different voltage level for the data signal 1856 is selected. The voltage 1852 during the first time period is at or close to 0 VDC at the time t0 and remains relatively constant over the first time period in comparison with operation of the OLED described with respect to FIG. 17C.

As a result of the positive voltage level of the common signal 1820 relative to the voltage 1852 at the node P, the microLED of the remaining pixels are reverse-biased during the first time period. During the first time period, the voltage 1852 is static, so the amount of current (leakage current) flowing through the microLED is very small—on the order of picoAmperes according to some implementations. During the second time period after the time t1, the energy stored in the storage capacitor CST is insufficient to cause the microLED to be forward-biased and emit light in the remaining pixels that were not selected to emit light. In comparison with operation of the circuit 1700 described with respect to FIGS. 17B and 17C, the amount of energy stored in the storage capacitor CST during the first time period is smaller and operation of the pixel array including the circuit 1800 may have improved efficiency characteristics.

Figure 19A:
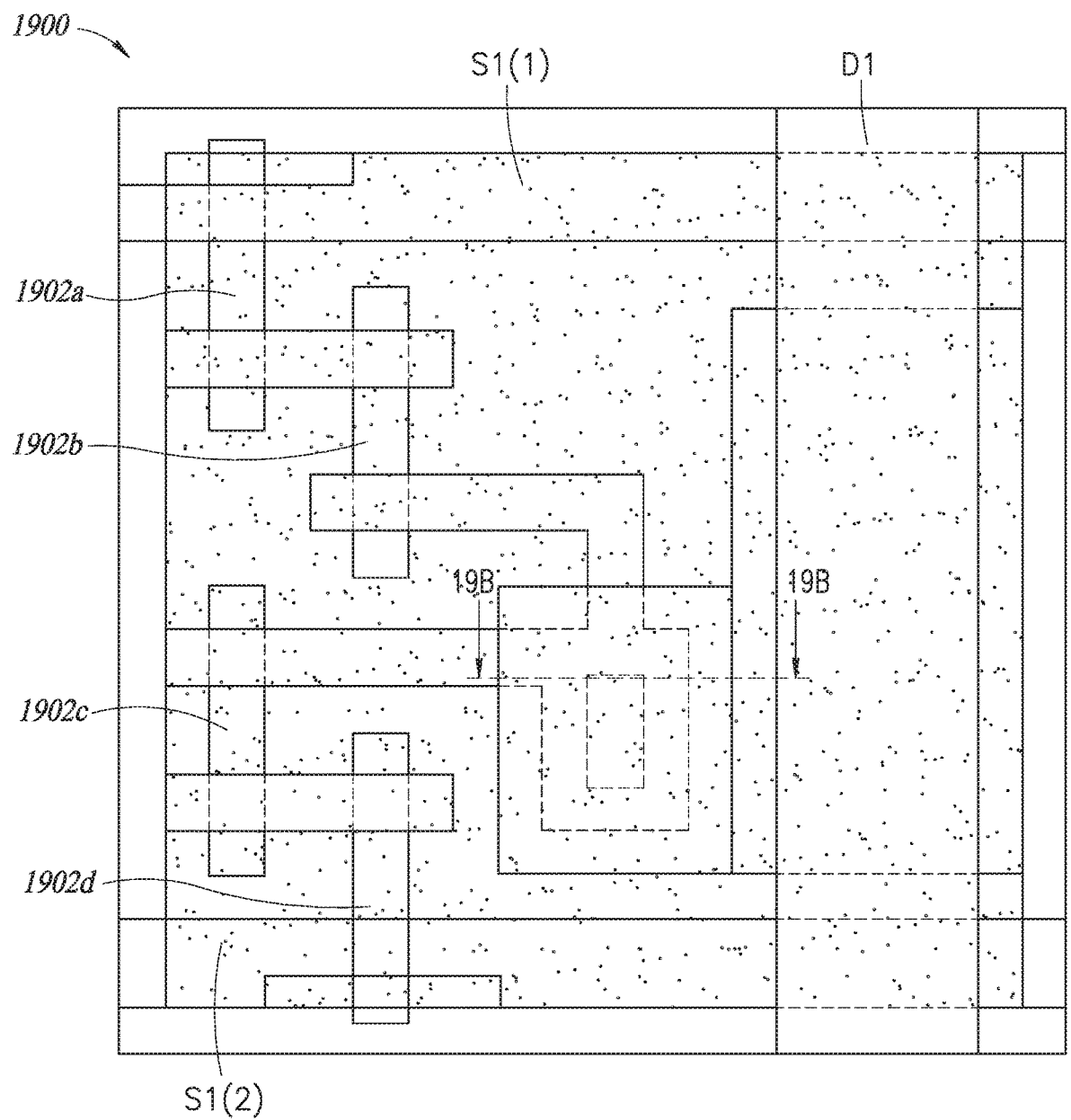
FIGS. 19A-19D are top and cross-sectional views of another pixel embodiment, and a flow chart of a method of forming the pixels, and a top view of layers of the method of forming the pixels.
Figure 19B:
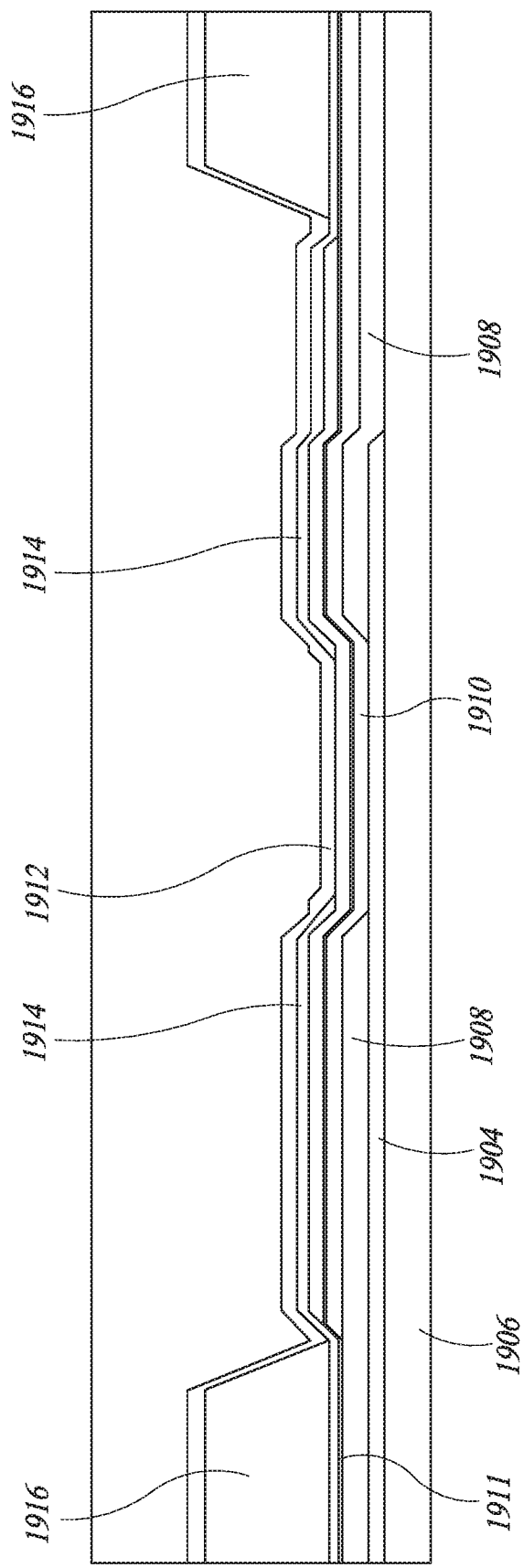

FIG. 19A is a top down view of an embodiment of a layout for an AMNR-electrophoretic display (EPD) pixel 1900. This pixel 1900 is 300 DPPI and is approximately 88 µm by 85 µm. The pixel 1900 includes four AMNR 1902a, 1902b, 1902c, 1902d, which each have four 5×5 µm tunneling junctions. There is a 5 µm minimum line to form junctions and an 8 µm minimum space within the layer. Five 10 µm via(s) are included, but not shown. One column data line D1 is shown, as well as one pair of row select lines S1(1), S1(2). In this embodiment, column data line D1 is 14 µm wide, and row select lines S1(1), S1(2) are each 8 µm wide. The layer to layer registration tolerance is 4 µm FIG. 19B is a cross-section of a portion of the pixel 1900 of FIG. 19A, as indicated by the dotted line. As shown, an AMNR upper electrode 1904 is arranged on the substrate 1906. Portions of dielectric layer 1908 overlap portions of the AMNR upper electrode 1904. Overlapping the dielectric layer 1908 is the storage capacitor lower electrode 1910. Overlying portions of the storage capacitor lower electrode 1910 is the storage capacitor upper electrode 1912. Between the storage capacitor lower electrode 1910 and the storage capacitor upper electrode 1912 is a storage capacitor dielectric layer 1911. An inorganic barrier layer 1914 is then formed on portions of the storage capacitor upper electrode 1912. An organic planarization layer 1916 is arranged on the inorganic barrier layer 1914, and an indium tin oxide (ITO) electrode 1918 is formed on the surface of the organic planarization layer 1916, the inorganic barrier layer 1914, and the storage capacitor upper electrode 1912.

Figure 19C:
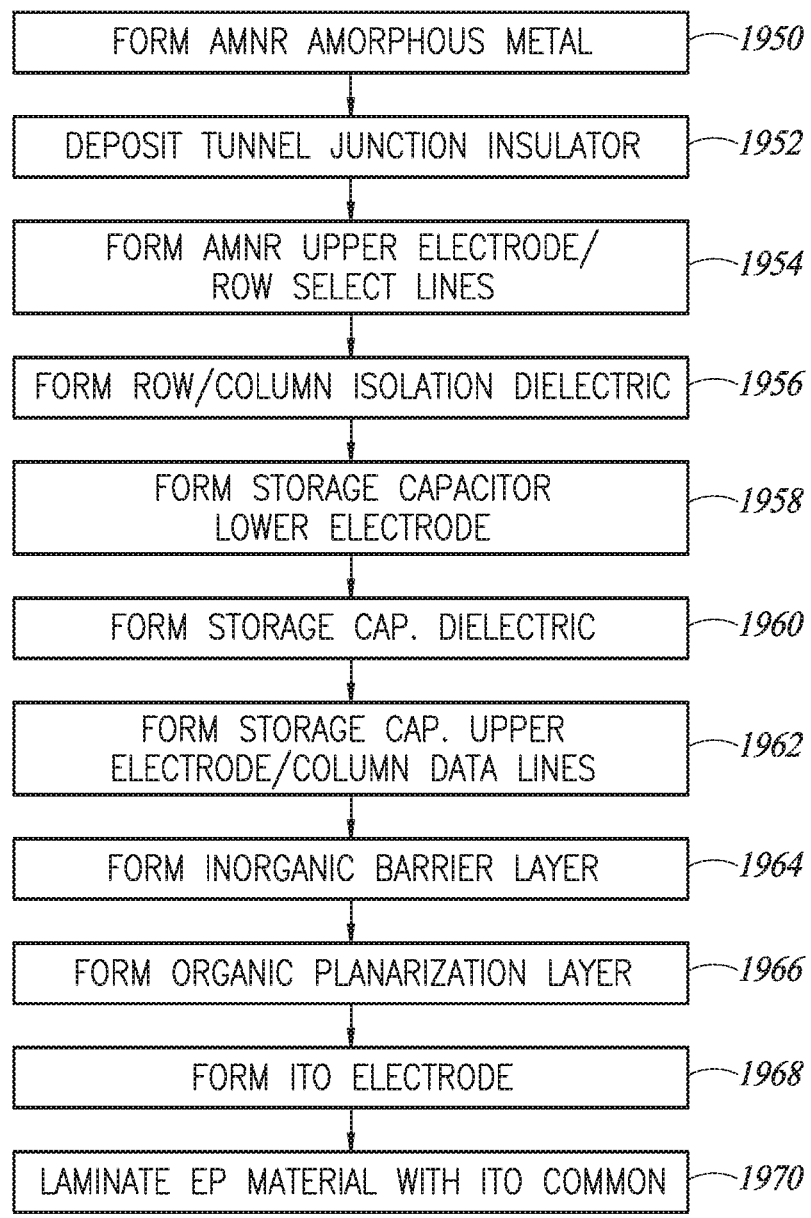
Figure 19D:
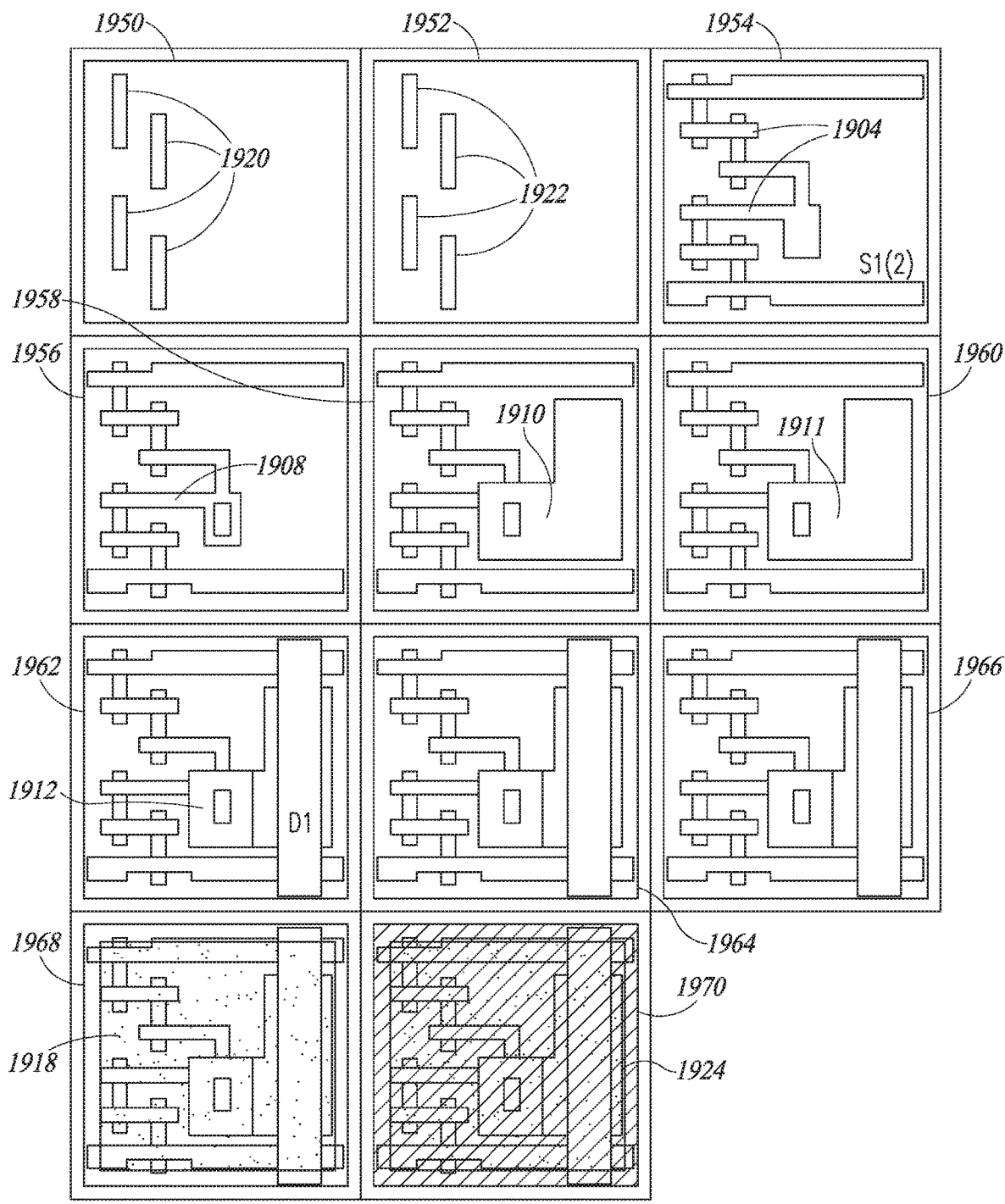

FIG. 19C is a flow chart of an embodiment of a method to form the pixel 1900 of FIG. 19A. FIG. 19D provides top down views of the steps of the flow chart of FIG. 19C. First, in step 1950, areas of amorphous metal 1920 for the AMNRs are deposited. Next, in step 1952, a tunnel junction insulator 1922 is deposited over the areas of amorphous metal. The AMNR upper electrode(s) 1904 and row select line(s) S1(1), S1(2) are then deposited in step 1954. A dielectric layer 1908, which isolates the column data line D1 and the row select line(s) S1(1), S1(2) is then deposited in step 1956. Then, in step 1958, the storage capacitor lower electrode 1910 is formed. The storage capacitor dielectric 1911 is formed over the storage capacitor lower electrode 1910 in step 1960. The storage capacitor upper electrode 1912 and the column data line(s) D1 are formed in step 1962. The inorganic barrier layer (not shown in FIG. 19D) is then deposited on the storage capacitor upper electrode 1912 in step 1964, and the organic planarization layer (not shown in FIG. 19D) is formed on the inorganic barrier layer in step 1966. The ITO common electrode 1918 is then formed over the organic planarization layer 1916, the inorganic barrier layer 1914, and the storage capacitor upper electrode 1912, in step 1968. Finally, in step 1970, the electrophoretic material 1924 is laminated onto the ITO common electrode layer 1918.

Figure 20A:
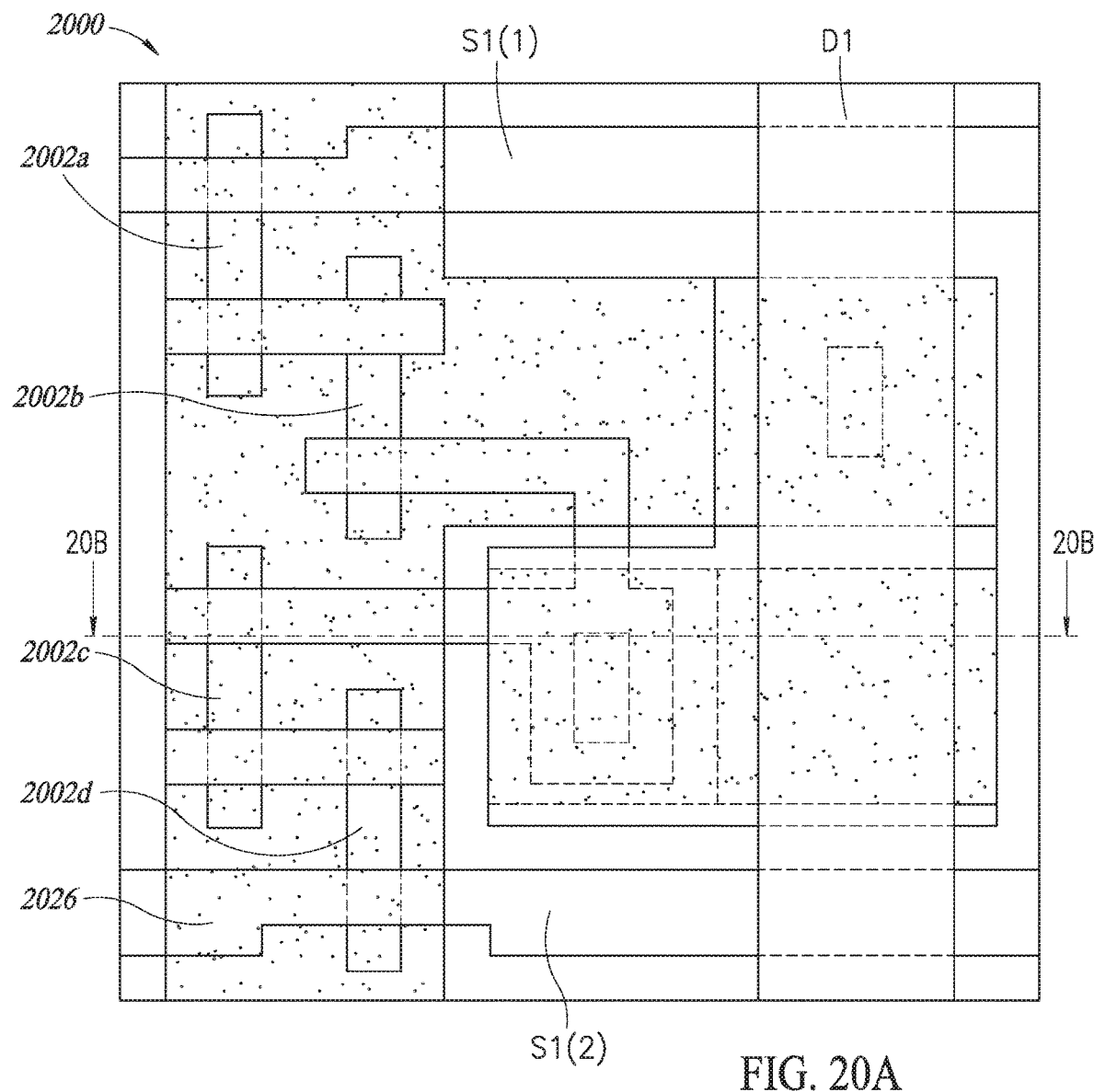
FIGS. 20A-20C are top and cross-sectional views and a method of forming an alternative embodiment of the present disclosure.
Figure 20B:

FIG. 20A is a top down view of an embodiment of a layout for an AMNR-microLED pixel 2000. This pixel 2000 is 300 DPPI and is approximately 88 µm by 85 µm. The pixel 2000 includes four AMNR 2002a, 2002b, 2002c, 2002d, which each have four 5×5 µm tunneling junctions. There is a 5 µm minimum line to form junctions and an 8 µm minimum space within the layer. Five 10 µm via(s) are included, but not shown. One column data line D1 is shown, as well as one pair of row select lines S1(1), S1(2). In this embodiment, column data line D1 is 14 µm wide, and row select lines S1(1), S1(2) are each 8 µm wide. The layer to layer registration tolerance is 4 µm FIG. 20B is a cross-section of a portion of the pixel 2000 of FIG. 20A, as indicated by the dotted line.

Figure 20C:
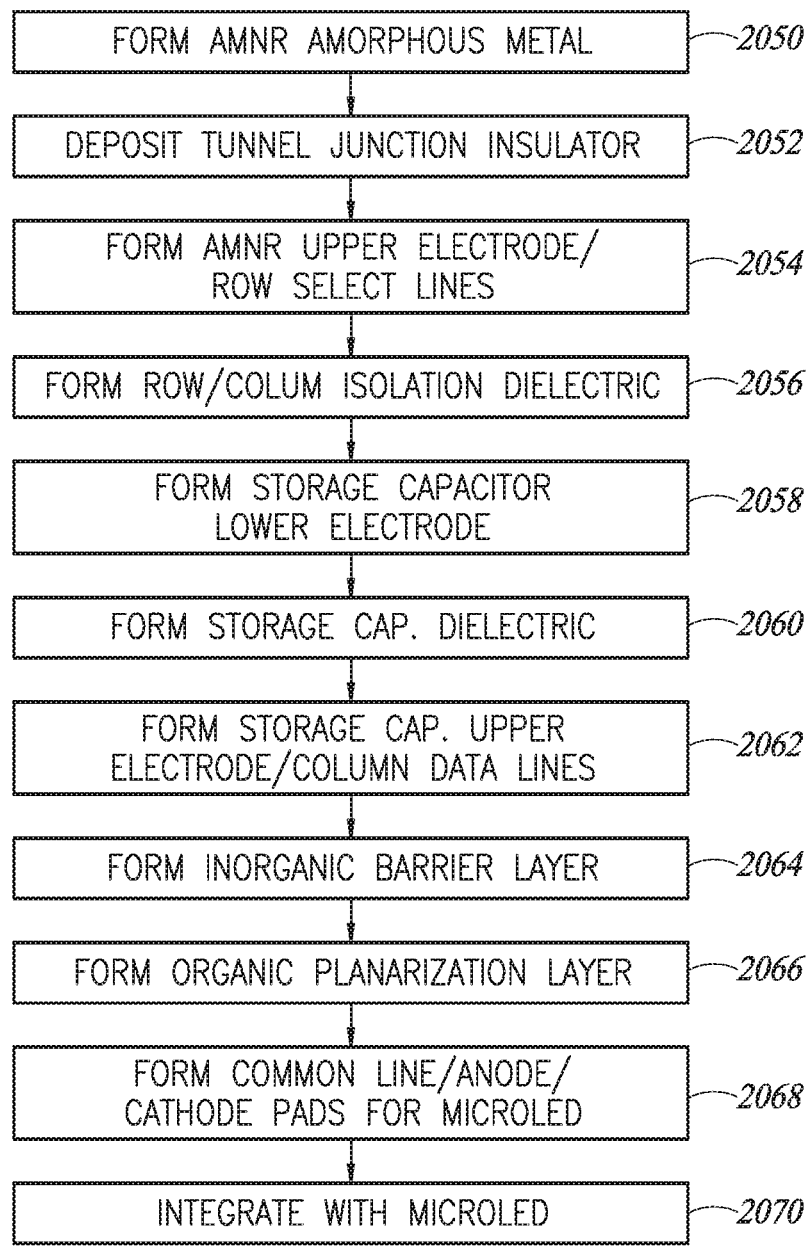

FIG. 20C is a flow chart of an embodiment of a method to form the pixel 2000 of FIG. 20A. First, in step 2050, areas of amorphous metal for the AMNRs 2002a, 2002b, 2002c, 2002d are deposited. Next, in step 2052, a tunnel junction insulator is deposited over the areas of amorphous metal. The AMNR upper electrode(s) and row select line(s) S1(1), S1(2) are then deposited in step 2054. A dielectric layer, which isolates the column data line D1 and the row select line(s) S1(1), S1(2) is then deposited in step 2056. Then, in step 2058, the storage capacitor lower electrode is formed. The storage capacitor dielectric is formed over the storage capacitor lower electrode in step 2060. The storage capacitor upper electrode and the column data line(s) D1 are formed in step 2062. The inorganic barrier layer (not shown in FIG. 20A) is then deposited on the storage capacitor upper electrode in step 2064, and the organic planarization layer (not shown in FIG. 20A) is formed on the inorganic barrier layer in step 2066. The common lines, anode, and cathode pads 2026 for a microLED are then formed over the organic planarization layer, the inorganic barrier layer, and the storage capacitor upper electrode, in step 2068. Finally, in step 2070, the structure is integrated with the microLED.

In other embodiments, the pixels 100A-100C are for several different types of electronic displays that do not require interconnection of the control circuitry and active pixel element portions of the pixel at a common node according to embodiments of the present disclosure. Each of the pixels 100A-100C represents a pixel for a different type of electronic display. Each pixel 100A-100C includes control circuitry 102 including dual diode-like elements D1, D2 (TDF1 and TDF2) coupled to a storage capacitor CST as illustrated. The diode-like elements D1, D2 receive the selection signals V(S1), V(S2) and the storage capacitor CST is coupled between a charging node P and the data line receiving data signal V(DATA). This control circuitry 102 is part of the backplane of each of these displays and is coupled to a corresponding active pixel element 155, with the structure of the active pixel element depending upon the type of display being formed. The active pixel element 155 which is represented as a capacitive element where the display being formed is an LCD display in FIG. 1A. An active pixel element 155 is shown as an LED in FIG. 1B where an LED display is being formed and is shown as a resistive element in FIG. 1C where a different type of display is being formed, such as a display utilizing phase change material for the active pixel elements.

FIG. 2 illustrates an electronic display 200 including an array of pixels 202 arranged in rows and columns and illustrates for one of these pixels a control circuit area 204 and an active pixel element area 206 of the pixel. The control circuit area 204 includes the control circuitry 102 while the active pixel element area 206 includes the corresponding components of the active pixel element 155 for the particular type of electronic display being formed. FIGS. 3 and 4 illustrates in more detail the electronic display 300 of and shows in more detail the select lines S1, S2 and data lines DATA coupled to each of the pixels of the display. More specifically, the display includes a plurality of pairs of select lines S1, S2 extending in rows across the display and a plurality of data lines DATA extending in columns orthogonal to the select lines across the display. A common electrode overlies the entire display and is formed from a suitable transparent conductive material, as will be discussed in more detail below.

The pixel includes an amorphous metal interconnect for forming the diode-like elements D1, D2, which are AMNRs in the examples illustrated and being described, and selection lines. A data line is shown formed orthogonal to the selection lines, each data line overlapping the selection lines S1, S2 and being isolated therefrom by a suitable dielectric layer (not shown), as will be described in more detail below. Similarly, a tunneling insulator layer (not shown) is also formed between the amorphous metal interconnects and a lower electrode of the storage capacitor CST. In this embodiment, the dielectric layer separating the overlapping data line and selection lines S1, S2 also forms the dielectric of the storage capacitor. An upper electrode of the storage capacitor CST is formed by the same conductive layer as the date line.

FIGS. 4-6 illustrate in more detail the pixels of FIG. 4 including cross-sectional views in FIGS. 5 and 6 showing the pixel where the active pixel element includes electrophoretic circuitry and LED circuitry, respectively. The pixels are formed on a substrate 310. These cross-sectional views show the tunneling insulator layer 312 and the dielectric layer 314 separating the overlapping data line 308 and selection lines S1, S2 and also forming the dielectric of the storage capacitor CST. The electrophoretic pixel and includes an electrophoretic layer EP with the common electrode COM formed on the electrophoretic layer. The common electrode and electrophoretic layer are typically formed together and then integrate with backplane including the remaining components of the pixel.

In one embodiment, a process of forming the pixel includes forming the amorphous metal interconnect layer, depositing the tunneling insulator, forming the AMNR upper electrodes and select lines and storage capacitor lower electrode, forming the storage capacitor dielectric and forming the storage capacitor upper electrode and data line. The common electrode is shared globally by all pixels of the display and is formed above the electrophoretic layer or an organic light emitting diode (OLED) material that is formed on top of the upper electrode of the storage capacitor and data line. In this process, "forming" typically includes material deposition followed by photolithographic patterning of the material, but could also be accomplished by shadow masking during deposition, using a damascene process, inkjet printing materials directly, and other suitable techniques as will be appreciated by those skilled in the art.

FIGS. 7 and 8 illustrate in more detail a portion of an electronic display where the common electrode layer overlying the display has been patterned to form a plurality of common electrode elements according to another embodiment of the present disclosure. Dividing the common electrode into a plurality of common electrode elements provides design flexibility and may improve electrical characteristics and performance of the display.

FIG. 9 illustrates in more detail one of the pixels of the electronic display where the pixel includes an intermetal dielectric layer according to a further embodiment of the present disclosure. This embodiment includes an additional intermetal dielectric layer that enables this intermetal dielectric layer to provide isolation between the select lines S1, S2 and the data line DATA, which enables a separate dielectric layer to be utilized for the storage capacitor. This provides design flexibility and may improve electrical characteristics of the display.

FIG. 10 illustrates in more detail one of the pixels of the electronic display where the pixel includes the common electrode layer formed on top of an intermetal dielectric layer according to a still further embodiment of the present disclosure. This embodiment is particularly advantageous for LED display utilizing micro-LEDs, which would be soldered or otherwise attached to connection pads as illustrated in the figure.

Embodiments of the various steps of the processes discussed above in relation to Figures will now be described in more detail. Forming the amorphous metal interconnects would typically be done through plasma vapor deposition utilizing materials such as TiAl, CuZr, ZrCuAlNi alloys, and stack structures including these materials. Depositing the tunneling insulator layer would typically be done through atomic layer deposition, plasma vapor deposition, or plasma enhanced chemical vapor deposition utilizing materials such as $Al_2O_3$, $SiO_2$, $SiN_x$ and $HfO_2$, and multi-material stack structures including these materials. The AMNR upper electrodes and the select lines would typically be formed through plasma vapor deposition or thermal evaporation from an amorphous metal, or crystalline material such as Al, Mo, Cu and their alloys and stacks containing such materials. The intermetal dielectric layer would typically be formed through atomic layer deposition, plasma vapor deposition, plasma enhanced chemical vapor deposition, or chemical vapor deposition from materials such as $Al_2O_3$, $SiO_2$, $SiN_x$ and $HfO_2$, and TEOS, and multi-material stack structures including these materials. The lower electrode of the storage capacitor would typically be formed through plasma vapor deposition or thermal evaporation from an amorphous metal, or crystalline materials such as Al, Mo, Cu and their alloys and stacks containing such materials. The capacitor dielectric layer of the storage capacitor would typically be formed through atomic layer deposition, plasma vapor deposition, or plasma enhanced chemical vapor deposition from materials such as $Al_2O_3$, $SiO_2$, $SiN_x$ and $HfO_2$ and multi-material stack structures including these materials.

The upper electrode of the storage capacitor and the data lines would typically be formed through plasma vapor deposition or thermal evaporation from an amorphous metal, or crystalline materials such as Al, Mo, Cu and their alloys and stack structures including such materials. The intermetal dielectric would typically be formed through atomic layer deposition, plasma vapor deposition, plasma enhanced chemical vapor deposition, or chemical vapor deposition from materials such as $Al_2O_3$, $SiO_2$, $SiN_x$ and $HfO_2$, and TEOS, and multi-material stack structures including these materials. Finally, in the embodiments where the common electrode layer is to be separately formed and patterned, this common electrode layer would typically be formed through plasma vapor deposition or thermal evaporation from a suitable amorphous metal material, or a crystalline material such as Al, Mo, or Cu and their alloys and stack structures including such materials.

Regardless of the particular type electronic display being formed the corresponding specific structure of the pixels 100, the control sequence of operation of the pixels is similar. In operation during an addressing period, the signal V(COMMON) on the common electrode is either biased or left floating relative to the signals V(DATA) and V(S1 and S2) on the date line DATA and select lines S1, S2 so that a charge leakage that could affect the signal V(COMMON) is minimized, and the active pixel elements of the pixel 100 are not affected. For each row of the display, the select signals V(S1), V(S2) are driven to levels greater than threshold voltages of the diode-like device D1, D2 to thereby form a voltage divider with the diode-like devices. The signal V(DATA) on the data line DATA is then driven to a level relative to a level on the charging node CN provided by the D1, D2 voltage divider for each pixel 100 in the row. A different level can be provided on the data line DATA in each column of the display along the row of pixels that is activated. This stores a desired charge across on the storage capacitor CST of each pixel and the select signals V(S1), V(S2) is then driven to a level below the threshold voltages of the diode-like devices to thereby isolate the storage capacitor CST with desired charge stored on the storage capacitor.

Once the addressing period has been completed for all pixels 100 in the display, the pixel lighting or active pixel element writing period is performed. Once all the storage capacitors CST for all pixels of the display have been addressed as described above, the select signals V(S1), V(S2) for all rows of the display are set below threshold voltages of the diode-like devices D1, D2 so that all voltage divider nodes (i.e., charging nodes CN) are left floating. The signals V(DATA) and V(COMMON) are then driven to a reference level such as ground, causing any charge stored in the storage capacitors CST to be discharged through their respective active pixel elements to thereby cause each active pixel element to illuminate the desired data for the pixel 100.

Figure 12:
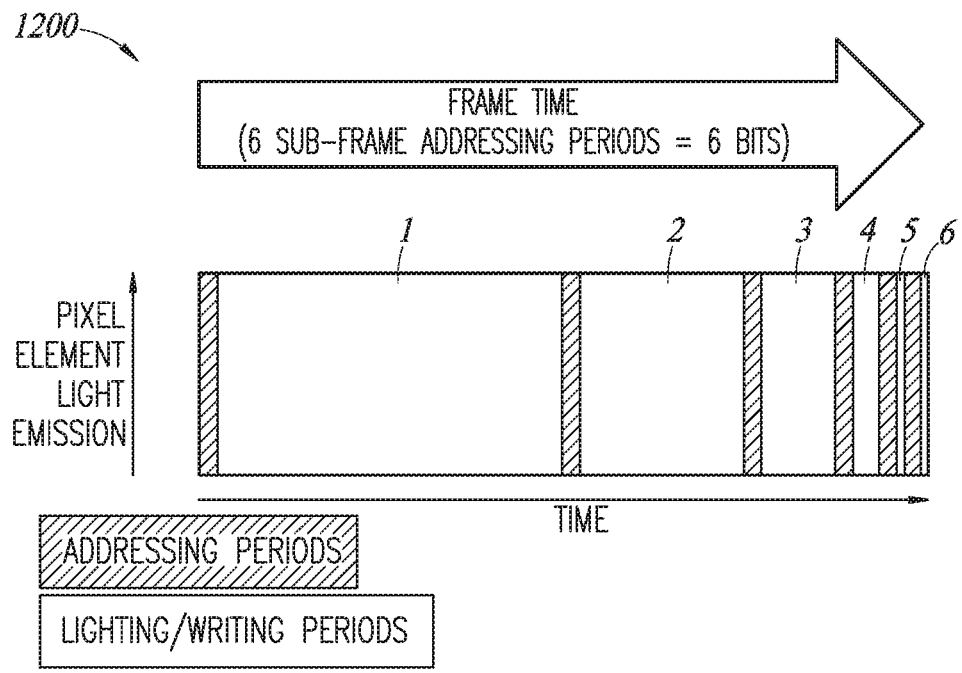
FIG. 12 is a representation of a time ratio method for displaying grayscale for the pixels of the various embodiments of the present disclosure.

In some of the embodiments of the electronic display, each of the active pixel elements of the pixels may be set to a different brightness level (e.g., for a gray-scale image). The electronic display may be controlled to provide such a great-scale image through a time ratio based gray scale control method as illustrated in FIG. 12. In this method, the effective brightness for each active pixel element is controlled by either charging or not charging the storage capacitor $C_{ST}$ each frame of the electronic display. One frame time including six sub-frame addressing periods (i.e., 6 bits) is illustrated in the example of FIG. 12. The active element is activated during the lighting periods as shown and the number of addressing periods and lighting periods per frame may be adjusted. The gray-scale of each pixel is adjusted by controlling the ratio of the ON time to the OFF time of the corresponding active pixel element during each frame, with this type of control being referred to as time-ratio gray-scale control. The utilization of diode-elements D1, D2 in each pixel allows for faster operation of the pixel and thereby allows for faster frame rates of the electronic display including such pixels.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including U.S. provisional patent application No. 62/776,931, filed Dec. 7, 2018, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A pixel device, comprising:
   a first non-linear element coupled between a first selection line and a charging node;
   a second non-linear element coupled between a second selection line and the charging node, the first and second non-linear elements include an amorphous metal non-linear resistor;
   a charging capacitive element coupled between a data line and the charging node; and
   a pixel element coupled between the charging node and a common electrode.

2. The device of claim 1, wherein the pixel element includes one of a liquid crystal display element, a light emitting diode element, a micro-light emitting diode element, an organic light emitting diode element, or an electrophoretic display element.

3. The device of claim 1, wherein the amorphous metal non-linear resistor includes a tunneling junction.

4. The device of claim 1, wherein the pixel element includes a charge producing sensor.

5. The device of claim 1, wherein the common electrode may be selectively coupled to a bias voltage.

6. The device of claim 1, wherein the common electrode may be selectively coupled to ground.

7. The pixel device of claim 1, further comprising:
   a first voltage across the storage capacitor;
   a second voltage across the first selection line different from the first voltage;
   a third voltage across the second selection line different from the first and second voltages;
   a first threshold voltage of the first non-linear element;
   a second threshold voltage of the second non-linear element; and
   a difference in voltage between the second voltage and the third voltage, the difference in voltage being greater than the first threshold value and being greater than the second threshold value.

8. A pixel device, comprising:
   a first amorphous metal non-linear resistor coupled between a first selection line and a charging node;
   a second amorphous metal non-linear resistor coupled between a second selection line and the charging node;
   a charging capacitive element coupled between a data line and the charging node; and
   a pixel element coupled between the charging node and a common electrode.

9. The device of claim 8, wherein the first amorphous metal non-linear resistor includes a tunneling junction.

10. The device of claim 9, wherein the second amorphous metal non-linear resistor includes a tunneling insulator.

11. The device of claim 10, wherein the pixel element includes a charge producing sensor.

12. The device of claim 8, wherein the common electrode may be selectively coupled to a bias voltage.

13. The device of claim 8, wherein the common electrode may be selectively coupled to ground.

14. A device, comprising,
   a first amorphous metal non-linear resistor, the first amorphous metal non-linear resistor coupled between a first selection line and a charging node including:
      a first amorphous metal layer extending in a first direction;
      a first insulating layer on the first amorphous metal layer;
      a first electrode extending in a second direction that is transverse to the first direction, the first electrode overlapping the first amorphous metal layer;
      a second electrode extending in the second direction, the second electrode overlapping the first amorphous metal layer;
   a second amorphous metal non-linear resistor coupled between a second selection line and the charging node;
   a storage capacitor adjacent to the first amorphous metal layer and coupled between a data line and the charging node; and
   a pixel element coupled between the charging node and a common electrode.

15. The device of claim 14 wherein the second amorphous metal non-linear resistor includes a second amorphous metal layer and a second insulating layer on the second amorphous metal layer.

16. The device of claim 15 wherein the second amorphous metal non-linear resistor includes a third electrode that overlaps the second amorphous metal layer.

17. The device of claim 16 wherein the second amorphous metal non-linear resistor includes a fourth electrode that overlaps the second amorphous metal layer.

\* \* \* \* \*